United States Patent
Lasser

(10) Patent No.: US 9,489,294 B2
(45) Date of Patent: Nov. 8, 2016

(54) DATA ENCODING FOR NON-VOLATILE MEMORY

(71) Applicant: SANDISK TECHNOLOGIES INC., Plano, TX (US)

(72) Inventor: Menahem Lasser, Kohav-Yair (IL)

(73) Assignee: SANDISK TECHNOLOGIES LLC, Plano, TX (US)

(*) Notice: Subject to any disclaimer, the term of this patent is extended or adjusted under 35 U.S.C. 154(b) by 0 days.

(21) Appl. No.: 14/100,498

(22) Filed: Dec. 9, 2013

(65) Prior Publication Data

US 2014/0380015 A1    Dec. 25, 2014

Related U.S. Application Data

(63) Continuation-in-part of application No. 13/921,566, filed on Jun. 19, 2013.

(51) Int. Cl.

| | |
|---|---|
| *G11C 7/00* | (2006.01) |
| *G11C 7/10* | (2006.01) |
| *G11C 7/22* | (2006.01) |
| *G06F 12/02* | (2006.01) |
| *G06F 12/00* | (2006.01) |
| *G06F 13/42* | (2006.01) |
| *G11C 13/00* | (2006.01) |
| *G06F 12/06* | (2006.01) |

(52) U.S. Cl.
CPC ......... *G06F 12/023* (2013.01); *G06F 13/4234* (2013.01); *G11C 7/1006* (2013.01); *G06F 12/00* (2013.01); *G06F 12/02* (2013.01); *G06F 12/063* (2013.01); *G06F 2212/206* (2013.01); *G11C 7/00* (2013.01); *G11C 7/1096* (2013.01); *G11C 13/0002* (2013.01); *G11C 13/0069* (2013.01)

(58) Field of Classification Search
CPC ... G11C 7/00; G11C 13/0069; G11C 7/1096; G11C 7/1006; G11C 13/0002; G06F 12/02; G06F 12/00; G06F 12/63; G06F 2212/206
USPC .............. 365/189.16, 148; 711/166, E12.082
See application file for complete search history.

(56) References Cited

U.S. PATENT DOCUMENTS

| | | | |
|---|---|---|---|
| 5,787,487 A | 7/1998 | Hashimoto et al. | |
| 5,893,097 A * | 4/1999 | Hayata | ................ G06F 17/3056 |
| 6,728,825 B1 | 4/2004 | Norman | |
| 6,862,235 B2 * | 3/2005 | Sakata et al. | ................. 365/202 |
| 6,957,307 B2 * | 10/2005 | Riesenman | ......... G06F 13/1668 |
| | | | 365/195 |

(Continued)

FOREIGN PATENT DOCUMENTS

| | | |
|---|---|---|
| KR | 20120074818 A | 6/2012 |
| WO | 2010092536 A1 | 8/2010 |

OTHER PUBLICATIONS

Lasser, Menahem. "Data Encoding for Non-Volatile Memory," U.S. Appl. No. 13/921,566, filed Jun. 19, 2013, 67 pages.

(Continued)

*Primary Examiner* — Ly D Pham
(74) *Attorney, Agent, or Firm* — Toler Law Group, PC

(57) ABSTRACT

A data storage device includes a memory and a controller. Mapping circuitry is configured to apply a mapping to received data to generate mapped data to be stored into the memory. The mapping is configured to reduce an average number of state changes of storage elements per write operation.

25 Claims, 24 Drawing Sheets

(56) References Cited

U.S. PATENT DOCUMENTS

| | | | |
|---|---|---|---|
| 7,477,072 B1 | 1/2009 | Kao et al. | |
| 8,422,668 B1 | 4/2013 | Thichina | |
| 8,571,790 B2 | 10/2013 | Tanabe et al. | |
| 8,780,620 B2* | 7/2014 | Jiang | G11C 11/5678 365/148 |
| 8,880,782 B2 | 11/2014 | Ordentlich et al. | |
| 8,966,205 B1* | 2/2015 | Lo | G06F 12/0246 711/165 |
| 9,015,405 B2* | 4/2015 | Ordentlich | G11C 7/1006 365/148 |
| 2002/0194438 A1* | 12/2002 | Lasser | G06F 12/0246 711/153 |
| 2003/0208505 A1* | 11/2003 | Mullins | G06F 17/30607 |
| 2004/0042292 A1 | 3/2004 | Sakata et al. | |
| 2004/0080979 A1 | 4/2004 | Park | |
| 2004/0205306 A1 | 10/2004 | Janas et al. | |
| 2005/0144368 A1* | 6/2005 | Chung | G06F 12/0246 711/103 |
| 2005/0213393 A1 | 9/2005 | Lasser | |
| 2007/0038971 A1 | 2/2007 | Hiramatsu et al. | |
| 2008/0140692 A1* | 6/2008 | Gehring | G06F 17/30563 |
| 2008/0158948 A1 | 7/2008 | Sharon et al. | |
| 2008/0189490 A1 | 8/2008 | Cheon et al. | |
| 2008/0228995 A1* | 9/2008 | Tan | G06F 12/0246 711/103 |
| 2009/0106282 A1 | 4/2009 | Silverman | |
| 2009/0109788 A1 | 4/2009 | Moon et al. | |
| 2009/0132758 A1 | 5/2009 | Jiang et al. | |
| 2009/0193184 A1* | 7/2009 | Yu | G06F 12/0246 711/103 |
| 2009/0213653 A1 | 8/2009 | Perlmutter et al. | |
| 2009/0268532 A1 | 10/2009 | De Ambroggi et al. | |
| 2010/0082885 A1 | 4/2010 | Litsyn et al. | |
| 2010/0125701 A1 | 5/2010 | Park | |
| 2011/0051492 A1 | 3/2011 | Toda | |
| 2011/0058431 A1 | 3/2011 | Gunwani et al. | |
| 2011/0082967 A1 | 4/2011 | Deshkar et al. | |
| 2011/0093652 A1* | 4/2011 | Sharon | G06F 11/1072 711/103 |
| 2011/0125975 A1 | 5/2011 | Kim et al. | |
| 2011/0167192 A1 | 7/2011 | Iyer et al. | |
| 2011/0170346 A1 | 7/2011 | Nagai et al. | |
| 2011/0258370 A1 | 10/2011 | Sharon et al. | |
| 2012/0023282 A1 | 1/2012 | Rub | |
| 2012/0054146 A1* | 3/2012 | Gupta | G06F 17/30545 707/602 |
| 2012/0096234 A1* | 4/2012 | Jiang | G11C 11/5678 711/170 |
| 2012/0233396 A1 | 9/2012 | Flynn et al. | |
| 2012/0317459 A1 | 12/2012 | Yeo et al. | |
| 2013/0024605 A1 | 1/2013 | Sharon et al. | |
| 2013/0031313 A1 | 1/2013 | Ryan et al. | |
| 2013/0038960 A1* | 2/2013 | Song | G11B 20/10 360/49 |
| 2013/0054876 A1 | 2/2013 | Varanasi | |
| 2013/0073821 A1* | 3/2013 | Flynn | G06F 3/061 711/162 |
| 2013/0073822 A1* | 3/2013 | Sandel | G06F 11/3433 711/162 |
| 2013/0097403 A1 | 4/2013 | Zheng et al. | |
| 2013/0139023 A1 | 5/2013 | Han et al. | |
| 2013/0148400 A1 | 6/2013 | Murooka | |
| 2013/0262903 A1 | 10/2013 | Thevar | |
| 2013/0279249 A1 | 10/2013 | Yun et al. | |
| 2013/0297986 A1 | 11/2013 | Cohen | |
| 2013/0318420 A1 | 11/2013 | Seol et al. | |
| 2013/0346671 A1 | 12/2013 | Michael et al. | |
| 2014/0006898 A1 | 1/2014 | Sharon et al. | |
| 2014/0047222 A1* | 2/2014 | Wang | G06F 11/00 712/226 |
| 2014/0089560 A1 | 3/2014 | Sunkavalli et al. | |
| 2014/0189269 A1* | 7/2014 | Hughes | G06F 17/30194 711/162 |
| 2014/0351501 A1 | 11/2014 | Davis et al. | |
| 2014/0379961 A1* | 12/2014 | Lasser | 711/103 |
| 2014/0379962 A1* | 12/2014 | Lasser | 711/103 |

OTHER PUBLICATIONS

Lasser, Menahem. "Data Encoding for Non-Volatile Memory," U.S. Appl. No. 13/921,626, filed Jun. 19, 2013, 64 pages.

International Search Report and Written Opinion of the International Searching Authority (EPO) for International Application No. PCT/US2014/043112, mailed Dec. 16, 2014, 17 pages.

Non-Final Office Action mailed Jan. 5, 2015 in U.S. Appl. No. 13/921,566, 6 pages.

Non-Final Office Action mailed Jan. 5, 2015 in U.S. Appl. No. 13/921,626, 6 pages.

Invitation to Pay Additional Fees and, Where Applicable, Protest Fee and Partial International Search Report mailed Oct. 9, 2014 in International Application No. PCT/US2014/043112, 6 pages.

Notice of Allowance and Fee(s) Due mailed Aug. 20, 2014 in U.S. Appl. No. 13/921,566, 8 pages.

Notice of Allowance and Fee(s) Due mailed Aug. 22, 2014 in U.S. Appl. No. 13/921,626, 8 pages.

Lasser, "Data Encoding for Non-Volatile Memory", U.S. Appl. No. 14/100,546, filed Dec. 9, 2013, 100 pages.

Lasser, "Data Encoding for Non-Volatile Memory," U.S. Appl. No. 14/103,656, filed Dec. 11, 2013, 42 pages.

Lasser, "Data Encoding for Non-Volatile Memory," U.S. Appl. No. 14/103,565, filed Dec. 11, 2013, 52 pages.

Notice of Allowance and Fee(s) Due mailed May 5, 2015 in U.S. Appl. No. 13/921,566, 14 pages.

Notice of Allowance and Fee(s) Due mailed May 5, 2015 in U.S. Appl. No. 13/921,626, 15 pages.

Notice of Allowance and Fee(s) Due mailed Oct. 21, 2014 in U.S. Appl. No. 13/921,626, 2 pages.

Non-Final Office Action mailed Sep. 14, 2015 in U.S. Appl. No. 14/103,656, 31 pages.

Non-Final Office Action mailed Sep. 22, 2015 in U.S. Appl. No. 14/103,565, 31 pages.

Non-Final Office Action mailed Jan. 7, 2016 in U.S. Appl. No. 14/100,546, 11 pages.

International Preliminary Report on Patentability for the International Application No. PCT/US2014/043112, mailed Dec. 30, 2015, 12 pages.

Notice of Allowance and Fee(s) Due mailed Oct. 8, 2015 in U.S. Appl. No. 14/100,546, 15 pages.

Notice of Allowance and Fee(s) Due mailed Mar. 16, 2016 in U.S. Appl. No. 14/103,656, 23 pages.

Advisory Action mailed May 6, 2016 in U.S. Appl. No. 14/103,565, 3 pages.

Final Office Action mailed Feb. 12, 2016 in U.S. Appl. No. 14/103,565, 34 pages.

Non-Final Office Action mailed Jun. 8, 2016 in U.S. Appl. No. 14/103,565, 42 pages.

Notice of Allowance and Fee(s) Due mailed May 6, 2015 in U.S. Appl. No. 14/100,546, 5 pages.

Notice of Allowance and Fee(s) Due mailed Jul. 29, 2016 in U.S. Appl. No. 14/103,565, 25 pages.

* cited by examiner

| previous state | previous data | new data- stage 0 | | new data- stage 1 | | new data- stage 2 | | new data- stage 3 | |
|---|---|---|---|---|---|---|---|---|---|
| | | 0 | 1 | 0 | 1 | 0 | 1 | 0 | 1 |
| | | | | | | | | | |
| 1111 | 0 | | | 1100 | 1110 | | | | |
| 1110 | 1 | | | 1100 | 1110 | 1100 | 1000 | | |
| 1101 | | | | | | | | | |
| 1100 | 0 | | | | | 1100 | 1000 | 0000 | 1000 |
| 1011 | | | | | | | | | |
| 1010 | | | | | | | | | |
| 1001 | | | | | | | | | |
| 1000 | 1 | 1111 | 1110 | | | | | 0000 | 1000 |
| 0111 | | | | | | | | | |
| 0110 | | | | | | | | | |
| 0101 | | | | | | | | | |
| 0100 | | | | | | | | | |
| 0011 | | | | | | | | | |
| 0010 | | | | | | | | | |
| 0001 | | | | | | | | | |
| 0000 | 0 | 1111 | 1110 | | | | | | |

| Previous State | Previous Data | New Data Stage 0 | | New Data Stage 1 | | New Data Stage 2 | | New Data Stage 3 | | New Data Stage 4 | | New Data Stage 5 | | New Data Stage 6 | | New Data Stage 7 | |
|---|---|---|---|---|---|---|---|---|---|---|---|---|---|---|---|---|---|
| | | 0 | 1 | 0 | 1 | 0 | 1 | 0 | 1 | 0 | 1 | 0 | 1 | 0 | 1 | 0 | 1 |
| 1111 | | | | | | | | | | | | | | | | | |
| 1110 | | | | | | | | | | | | | | | | | |
| 1101 | | | | | | | | | | | | | | | | | |
| 1100 | | | | | | | | | | | | | | | | | |
| 1011 | | | | | | | | | | | | | | | | | |
| 1010 | | | | | | | | | | | | | | | | | |
| 1001 | | | | | | | | | | | | | | | | | |
| 1000 | 1 | 0000 | 0001 | | | | | | | | | | | 0000 | 1000 | | |
| 0111 | | | | | | | | | | | | | | | | | |
| 0110 | | | | | | | | | | | | | | | | | |
| 0101 | | | | | | | | | | | | | | 0000 | 1000 | | |
| 0100 | 1 | | | | | | | | | | 0100 | 0000 | 0100 | | | | |
| 0011 | | | | | | | | | | | | | | | | | |
| 0010 | 1 | | | | | 0000 | 0010 | 0000 | 0010 | 0000 | 0100 | 0000 | 0100 | 0000 | 1000 | 0000 | 1000 |
| 0001 | 1 | | | 0000 | 0001 | 0000 | 0001 | 0000 | 0010 | 0000 | 0100 | 0000 | 0100 | 0000 | 1000 | 0000 | 1000 |
| 0000 | 0 | 0000 | 0001 | 0000 | 0001 | 0000 | 0010 | 0000 | 0010 | 0000 | 0100 | 0000 | 0000 | 0000 | 1000 | 0000 | 1000 |

DATA ENCODING FOR NON-VOLATILE MEMORY

CROSS-REFERENCE TO RELATED APPLICATIONS

This patent application is a continuation-in-part of and claims priority from U.S. patent application Ser. No. 13/921,566 filed Jun. 19, 2013, the contents of which is incorporated by reference herein in its entirety.

FIELD OF THE DISCLOSURE

The present disclosure is generally related to encoding data to be stored in non-volatile memory.

BACKGROUND

A popular non-volatile solid state memory in use today is flash memory (both NAND and NOR types). Flash memory is characterized by not being "write-symmetric" when writing data. To illustrate, each cell of a flash memory can be written from a value of "1" to a value of "0" independently of other cells. However, to change a cell back to a value of "1" a relatively large group of cells (called an "erase block") are set to a "1" value as a group. An erase group might contain hundreds of kilobytes or even several megabytes, and flash management systems that manage frequent updates of small chunks of data may implement relatively complex logic to preserve valid data that may be stored at other locations in the erase block.

In recent years several new "write-symmetric" non-volatile memory technologies have been introduced that do not have the non-symmetry as described for flash memory, such as Resistive RAM (also known as RRAM or ReRAM), and Magnetic RAM (also known as MRAM), as illustrative examples. In these technologies, a cell may be written in both directions—from "1" to "0" and from "0" to "1" without imposing a similar operation on cells that neighbor the cell being written.

Memory write latency may affect overall performance of computing systems, such as servers, computers, and mobile electronic devices, as illustrative examples. Improving write latency for non-volatile memory devices may result in improved system performance and an enhanced user experience.

Because errors may occur in data stored into non-volatile memory devices, such as an error due to a cell failing to change state during a write operation, error correction coding (ECC) may be used to correct errors in data read from a non-volatile memory, up to a correction capability of an ECC scheme. In some non-volatile memories, cells may become more prone to errors based on the number of times the state of the cell has been changed. Reducing a number of errors in data read from the non-volatile memory may improve read latency due to reduced ECC processing of the data, enable reduced complexity, power consumption, and cost associated with ECC processing circuitry, enable a longer useful life of the non-volatile memory device, or a combination thereof.

SUMMARY

Mapping of data to be stored in a non-volatile memory enables average reliability of the non-volatile memory to be increased. The mapping reduces an average number of state changes, such as from "1" to "0" or from "0" to "1", of storage elements of the non-volatile memory. The mapping may also cause the state changes to be spread substantially evenly throughout the storage elements to result in a more uniform average number of state changes among the storage elements.

BRIEF DESCRIPTION OF THE DRAWINGS

FIG. 26 is a table illustrating another particular embodiment of a mapping that may be applied by the data storage device of FIG. 23;

FIG. 27 is a table illustrating another particular embodiment of a mapping that may be applied by the data storage device of FIG. 23;

DETAILED DESCRIPTION

Figure 1:
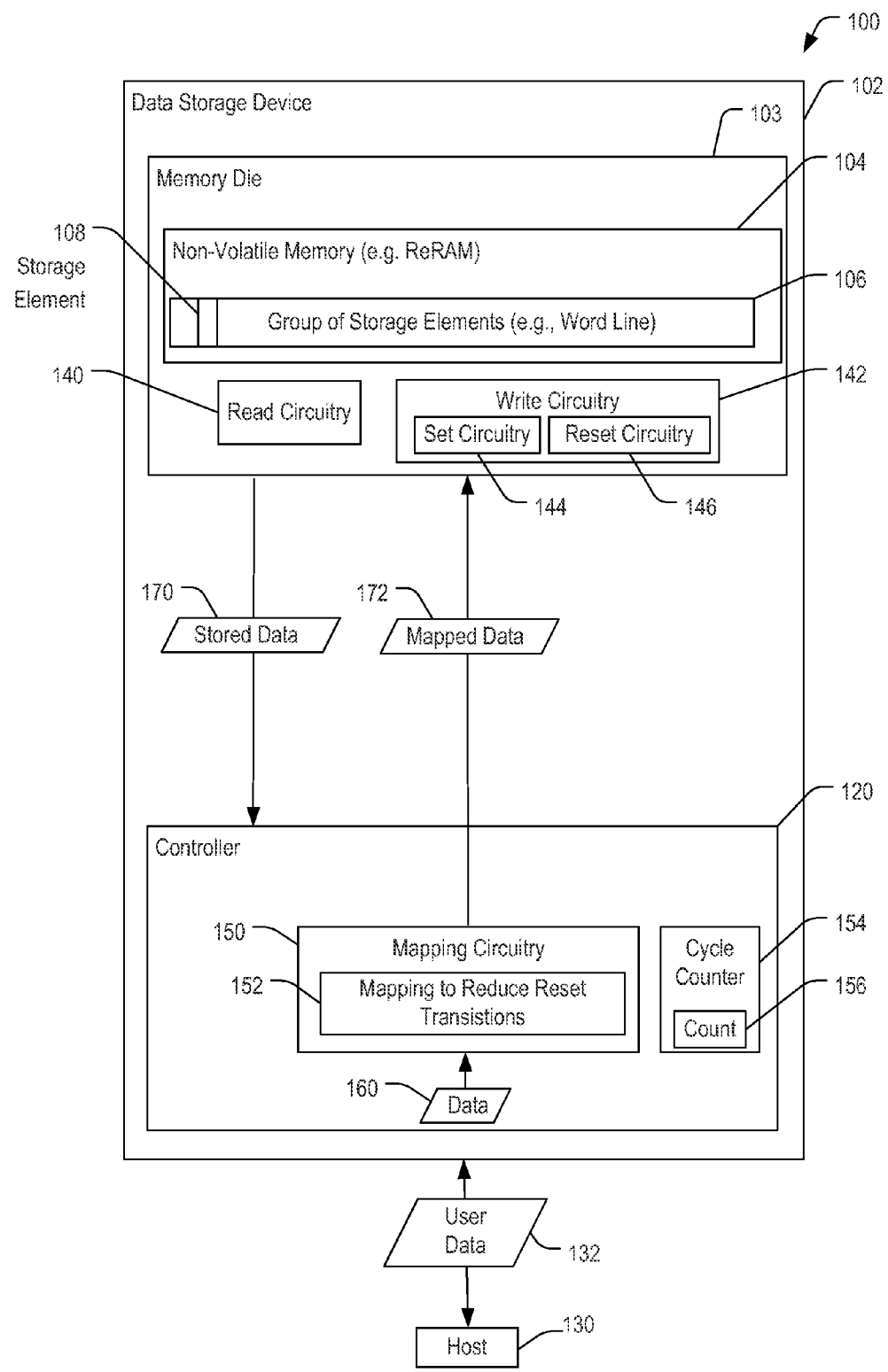
FIG. 1 is a block diagram of a particular illustrative embodiment of a system including a data storage device configured to apply a mapping to reduce average write time to a non-volatile memory.

Referring to FIG. 1, a particular embodiment of a system 100 includes a data storage device 102 coupled to an accessing device such as a host device 130. The data storage device 102 is configured to apply a mapping 152 that is configured to reduce average write time when storing data to a non-volatile memory 104.

The host device 130 may be configured to provide data, such as the user data 132, to be stored at the non-volatile memory 104 or to request data to be read from the non-volatile memory 104. For example, the host device 130 may include a mobile telephone, a music player, a video player, a gaming console, an electronic book reader, a personal digital assistant (PDA), a computer, such as a laptop computer, notebook computer, or tablet, any other electronic device, or any combination thereof. The host device 130 communicates via a memory interface that enables reading from the data storage device 102 and writing to the data storage device 102. For example, the host device 130 may operate in compliance with a Joint Electron Devices Engineering Council (JEDEC) industry specification, such as eMMC specification. As other examples, the host device 130 may operate in compliance with a USB or a UFS specification. The host device 130 may communicate with the data storage device 102 in accordance with any other suitable communication protocol.

The data storage device 102 includes the non-volatile memory 104 coupled to a controller 120. For example, the data storage device 102 may be a memory card. As another example, the data storage device 102 may be configured to be coupled to the host device 130 as embedded memory. The data storage device 102 may operate in compliance with a JEDEC industry specification. For example, the data storage device 102 may operate in compliance with a JEDEC specification, one or more other specifications, or a combination thereof.

The non-volatile memory 104 may be on a memory die 103 that is separate from the controller 120 and coupled to the controller 120 via a bus. However, in other implementations, the non-volatile memory 104 and the controller 120 may be on a common die. The non-volatile memory 104 includes a memory such as a resistive random access memory (ReRAM) that can write data to individual storage elements, such as a representative storage element 108, by changing a stored data value of "1" to "0" (e.g., a "set" operation that changes the storage element from a first state to a second state) or by changing a stored data value of "0" to "1" (e.g., a "reset" operation that changes the storage element from the second state to the first state). The non-volatile memory 104 includes a write-symmetric memory such as a write-symmetric ReRAM. The non-volatile memory 104 includes a representative group 106 of storage elements, such as a word line. The group 106 includes the representative storage element 108, such as a ReRAM cell.

Read circuitry 140 and write circuitry 142 are coupled to the non-volatile memory 104 and are configured to enable reading data from storage elements of the non-volatile memory 104 and writing data to storage elements of the non-volatile memory 104, respectively. The write circuitry 142 includes set circuitry 144 that is configured to cause a "set transition" that changes a stored value in one or more selected storage elements from a "1" value to a "0" value by causing a transition of the one or more selected storage elements from the first state to the second state. The write circuitry 142 also includes reset circuitry 146 that is configured to cause a "reset transition" that changes a stored value in one or more selected storage elements from a "0" value to a "1" value by causing a transition of the one or more selected storage elements from the second state to the first state.

The controller 120 is configured to receive data and instructions from and to send data to the host device 130. The controller 120 is further configured to send data and commands to the non-volatile memory 104 and to receive data from the non-volatile memory 104. For example, the controller 120 is configured to send data and a write command to instruct the non-volatile memory 104 to store the data to a specified address. As another example, the controller 120 is configured to send a read command to read data from a specified address of the non-volatile memory 104.

The controller 120 includes mapping circuitry 150 that is configured to apply the mapping 152 to received data 160 (e.g., user data 132 received from the host device 130) to generate mapped data 172. The mapping 152 is configured to reduce average write time of writing data to storage elements of the non-volatile memory 104, such as to the group 106, by mapping at least one incoming data value to a mapped value such that no reset transitions are required for storing the mapped value into the storage elements. Examples of application of the mapping 152 are described in further detail with respect to FIGS. 2-23.

The controller 120 also includes a cycle counter 154 configured to update a count 156 of write operations. For example, the controller 120 may be configured to send a page of data to be stored at the group 106 (e.g., where the group 106 is sized to store the page of data), and the cycle counter 154 may be configured to track a number of write operations that have been performed at the group 106. The mapping circuitry 150 may access the cycle counter 154 and apply the mapping 152 in accordance with a value of the count 156, such as described in further detail with respect to FIGS. 13-16. However, in other implementations, the controller 120 may not include the cycle counter 154 and may instead apply the mapping 152 independent of the count of write operations, such as described in further detail with respect to FIGS. 2-12.

During operation, the user data 132 may be received from the host device 130 by the controller 120. For example, the user data 132 may include data to be stored at the non-volatile memory 104 and may be accompanied by a logical or physical address indicating a destination address for storage of the user data 132. The user data 132 may be addressed to be stored at the group 106 of storage elements (e.g., as a page of data that fills the group 106, or as a smaller unit of data to be stored in a portion of the group 106).

The controller 120 may provide the user data 132 to the mapping circuitry 150 as the data 160. The controller 120 may process the user data 132 to generate the data 160, such as by applying an error correction coding (ECC) operation. For example, the ECC operation may generate parity bits that may be combined with the user data 132 to form an ECC codeword. The ECC codeword may be provided to the mapping circuitry 150 as the data 160.

In some implementations, such as described with respect to FIGS. 2-12, the mapping circuitry 150 may select the mapping 152 at least partially based on data that is already stored in the group 106 of storage elements. For example, the controller 120 may send a read command to the non-volatile memory 104 to read data stored in the group 106. In response, the non-volatile memory 104 may return stored data 170 to the controller 120. In other implementations, the mapping circuitry 150 may access the cycle counter 154 and may select the mapping 152 at least partially based on the count 156 (e.g., without reading the stored data 170).

By applying the mapping 152 to the data 160, the mapped data may be more likely to be stored in the non-volatile memory 104 without using the reset circuitry 146 as compared to storing the data 160 without mapping. As a result, a write time for the mapped data 172 may be reduced as compared to storing the data 160 without mapping.

In some implementations, the non-volatile memory 104 may be configured to write data to relatively small chunks of storage elements (such as a byte or a word) in a single write operation, while in other implementations the non-volatile memory 104 may be configured to write data to relatively large chunks of storage elements (such as pages of 2 kilobytes or 4 kilobytes). Regardless of the size of the chunk being written, a sequence of events when executing a write command may include:

a. The data storage device 102 receives a write command that specifies the address to be written and the new data chunk (e.g., the user data 132) to be stored at that address. The specified address may be a logical address or a physical address.

b. If the specified address is a logical address the data storage device 102 translates it to a physical address. The data storage device 102 internally reads from the physical address in the memory 103 the currently existing data at the targeted storage elements (e.g., the stored data 170).

c. Logic in the data storage device 102 classifies the targeted storage elements into (1) storage elements that already store their target value, (2) storage elements that store a "1" and have a target value of "0", and (3) storage elements that store a "0" and have a target value of "1".

d. The data storage device 102 writes all the storage elements that store a "1" and have a target value of "0" to have the value "0" using the set circuitry 144.

e. The data storage device 102 writes all the storage elements that store a "0" and have a target value of "1" to have the value "1" using the reset circuitry 146.

Thus, a write operation may be internally translated into three memory array operations: reading before writing ("RBW"), writing the cells that need to be set to "0" (the "set pass"), and writing the cells that need to be reset to "1" (the "reset pass"). Using the mapping 152 to decrease the number of reset passes results in a reduced average time to write data to the non-volatile memory 104.

As described above and used throughout the present disclosure, a convention is adopted where a "set" operation switches a storage element from storing a "1" value to storing a "0" value, and a "reset" operation switches a storage element from storing a "0" value to storing a "1" value. However, it should be understood that the systems and methods described in the present disclosure are equally applicable to an opposite definition where the "set" operation switches a storage element from storing a "0" value to storing a "1" value and a "reset" operation switches a storage element from storing a "1" value to storing a "0" value.

In addition, the systems and methods described herein do not depend on the physical implementation of how the "set" and "reset" operations are applied to a storage element. For example, in a ReRAM memory that switches between a low-resistance state and a high-resistance state, it may be the case that "set" switches a ReRAM cell from low resistance to high resistance and "reset" switches the ReRAM cell from high resistance to low resistance. Alternatively, it may be the case that "set" switches a ReRAM cell from high resistance to low resistance and "reset" switches the ReRAM cell from low resistance to high resistance. Both alternatives are equally valid for the purposes of the present disclosure. Likewise, the systems and methods described in the present disclosure are not dependent on any particular association between a storage element's physical state (e.g., low resistance vs. high resistance) and the logical value ("0" vs. "1") stored in the storage element.

An illustrative example of the mapping 152 maps a data value having K data bits into a mapped value having N mapped bits. In the present example, N and K are positive integers and N>K. The K bits may form the entire data item to be written into the non-volatile memory 104. For example, the non-volatile memory 104 may accept write commands for individual bits (e.g., K bits), bytes (e.g., K=8×(number of bytes)), or words (e.g., K=16×(number of words)). As another example, the K bits may be a portion of a larger data chunk in which case the procedures outlined below can be applied to multiple groups of K bits that together constitute the data chunk to be written. For example, the non-volatile memory 104 may accept write commands for pages having sizes of one or more kilobytes.

N storage elements of the non-volatile memory 104 may be allocated for storing the K data bits. K data bits implies $2^K$ different data values may be stored, while N storage elements implies $2^N$ different storage states are available, where $2^N > 2^K$. Having more storage states than values enables the mapping 152 to assign multiple states to represent one or more of the data values.

For a write command, the following procedure may be performed:

1. The data storage device 102 receives a write command from the external world (e.g., from the host device 130), with the command specifying the address to be written and the K data bits to be stored at that address (possibly as part of a larger data chunk). If the specified address is a logical address the data storage device 102 translates it to a physical address.

2. The data storage device 102 reads the current contents of the N storage elements that correspond to the address specified for the K data bits.

3. According to the values of the K data bits and the current contents of the N storage elements (a "state" of the N storage elements), a next state of the N storage elements is determined and the N storage elements are written to represent the determined next state. This next state is selected from the multiple states assigned to represent the next value of the K data bits, such as described in further detail with respect to FIGS. 2-10.

For a read command, the following procedure may be performed:

1. The data storage device 102 receives a read command from the external world (e.g., from the host device 130), with the command specifying an address from which K data bits are to be read. If the specified address is a logical address the data storage device 102 translates it to a physical address.

2. The data storage device 102 reads the contents of the N storage elements that correspond to the address specified for the K data bits.

3. The state of the N storage elements is translated to a value of the K data bits, which is then output to the external world (e.g., sent to the host device 102).

In response to the write command, the mapping circuitry 150 may apply a first criterion to select the next state of the N storage elements from the multiple states that are mapped to the particular value of the K data bits. To illustrate, the mapping circuitry 150 may receive an indication of the current contents of the N storage elements (e.g., the stored data 170) and may select a next state that does not require applying any "reset" operation to the storage element. Writing the next state to the N storage elements may involve applying the "set" operation to one or more of the N storage elements without applying the "reset" operation to any of the N storage elements, or may not involve a "reset" or "set" operations (in case the next state is the same as the current state).

As a secondary criterion, if there are multiple states that satisfy the above criterion, a next state may be selected that corresponds to a lower number of storage elements that are to be set as compared to another state that corresponds to a higher number of storage elements that are to be set. In some implementations, applying secondary criterion may further improve write time as compared to applying the first criterion without applying the secondary criterion. Although some embodiments of the present disclosure apply the secondary criterion, it should be understood that other embodiments of the present disclosure do not apply the secondary criterion.

If a next state that satisfies the first criterion of avoiding the use of "reset" operations is not available, a next state may be selected that does not satisfy the first criterion. For each possible data value of the K data bits, one pre-defined state of the N storage elements may be designated as the "initial state" for the data value. For example, the initial state may correspond to a state with a largest number of bits that are in a reset ("1") state. When the first criterion cannot be satisfied when selecting a next state corresponding to a particular data value, the corresponding initial state for the data value may be selected as the next state.

Figure 2:
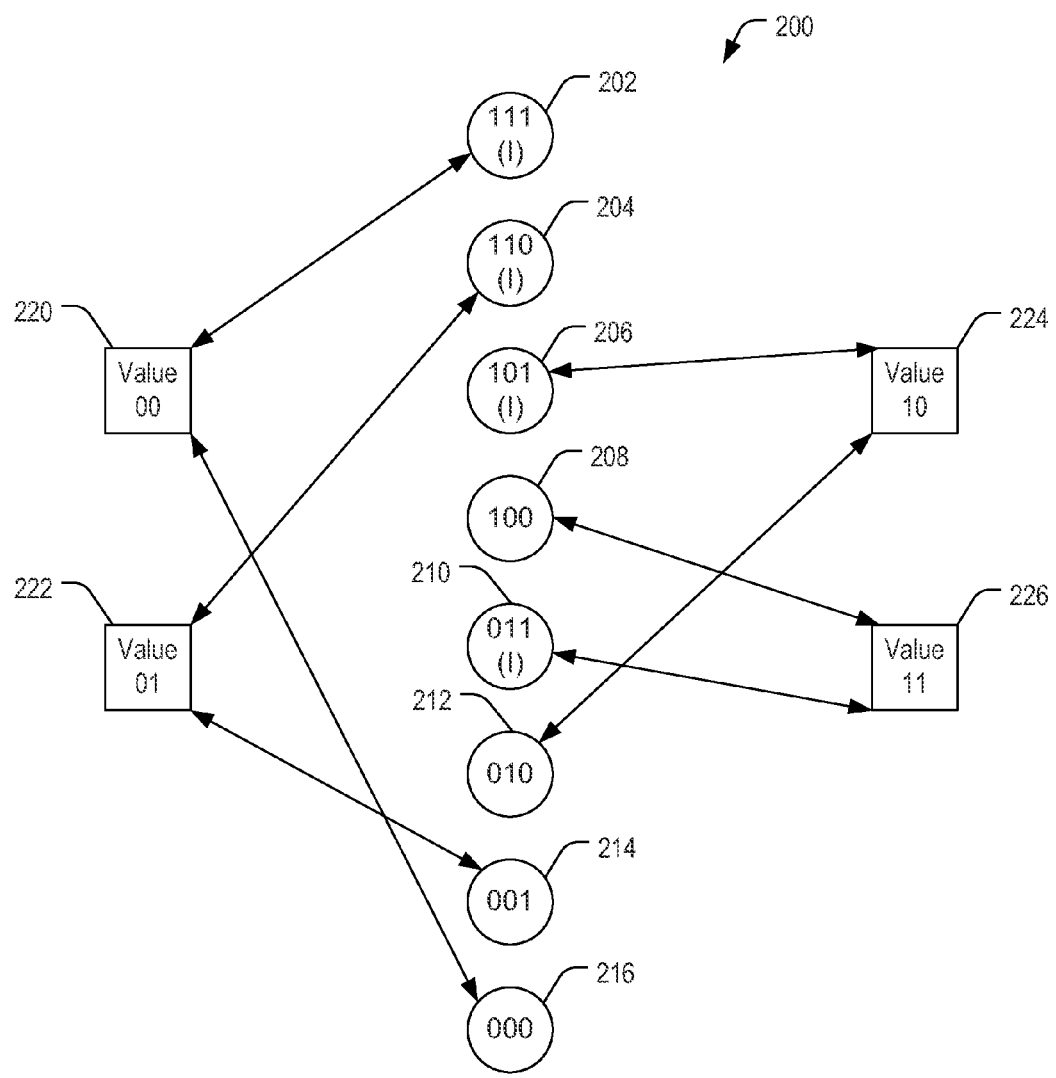
FIGS. 2-10 are diagrams of a particular illustrative embodiment of states and transitions between the states that may be implemented in a mapping applied by the data storage device of FIG. 1.

FIG. 2 depicts an example of a one-to-many mapping where K=2 and N=3. The four data values of the K data bits are {00,01,10,11} and the eight states (mapped values) of the N storage elements are {111,110,101,100,011,010,001, 000}. The eight states are illustrated as a 111 state 202, a 110 state 204, a 101 state 206, a 100 state 208, a 011 state 210, a 010 state 212, a 001 state 214, and a 000 state 216. The four data values are illustrated as a 00 data value 220, a 01 data value 222, a 10 data value 224, and a 11 data value 226. The 00 data value 220 maps to the 111 state 202 and to the 000 state 216. The 01 data value 222 maps to the 110 state 204 and to the 001 state 214. The 10 data value 224 maps to the 101 state 206 and to the 010 state 212. The 11 data value 226 maps to the 100 state 208 and to the 011 state 210. Each data value therefore is matched to multiple multi-bit values.

The initial state (e.g., the state having the greatest number of "1" values) for each data value 220-226 is indicated with an "I". The initial state for the 00 data value 220 is the 111 state. The initial state for the 01 data value 222 is the 110 state 204. The initial state for the 10 data value 224 is the 101 state 206. The initial state for the 11 value 226 is the 011 state 210.

As an example of events that take place when writing the data bits multiple times, the initial state of the storage elements may be "111" (which corresponds to the 00 data value 220) and a first write command may be received with new data bits. According to the first selection criterion, if the new data value is "00", the next state is "111". If the new data value is "01", the next state is "110". If the new data value is "10", the next state is "101". If the new value is "11", the next state is "011". For the "00" case, no storage element is changed from its initial value. For each of the "01", "10", and "11" cases, a single storage element is "set" from "1" to "0".

Continuing the example, if the first data value received in the first write command is "10", after completing the first write command the storage elements are in state "101". When a second write command is received with a second data value, a next state is selected according to the first selection criteria. For example, if the second data value is "00", the next state is "000". If the second data value is "01", the next state is "001". If the next data value is "10", the next state is "101". If the next data value is "11", the next state is "100". For all possible values of the second data value, no "reset" is required. The number of storage elements that are to be "set" in response to the second write command may be zero (when the second data value is "10"), one (when the second data value is "01" or "11"), or two (when the second data value is "00").

If the second data value is "11", in response to the second write command, the storage elements are written to the state "100". When a third write command is received with a third data value, a next state may be selected according to the first selection criteria. For example, if the third data value is "00", the next state is "000". If the third data value is "11", the next state is "100". However, if the third data value is "01" or "10", the first selection criterion cannot be satisfied because every state that represents the third data value would require a "reset" transition of a mapped bit from a "0" value to a "1" value, corresponding to a reset operation of the associated storage element.

In such a case where the first criterion cannot be satisfied, the initial state 202, 204, 206, or 210 that corresponds to the data value is selected as the next state, and writing the selected state to the storage elements includes using a "reset" operation. Continuing the example where the third write command is received, if the third data value is "00", the next state is "000". If the third data value is "01", the next state is "110". If the third data value is "10", the next state is "101". If the third data value is "11", the next state is "100".

The selected next state may be stored into a memory, such as the mapped data 172 that is sent to the non-volatile memory 104 of FIG. 1 to be stored in the group 106 of storage elements. For example, the mapped data 172 may represent N=3 bits to be stored into three storage elements of the non-volatile memory 104. As another example, the mapped data 172 may include a page of data formed of multiple groups of N=3 bits, where each group of 3 bits represents a mapped value for a corresponding group of K=2 bits of the data 160.

FIGS. 3-10 illustrate transitions between the states 202-216 that may be applied by the mapping circuitry 150 following the principles illustrated by the above example. In FIGS. 3-10, transitions illustrated as solid lines indicate transitions in which the first criterion is satisfied (i.e., no reset operation is required). Transitions illustrated as dashed lines indicate transitions in which the first criterion is not satisfied and one of the initial states 202, 204, 206, or 210 is selected.

Figure 3:
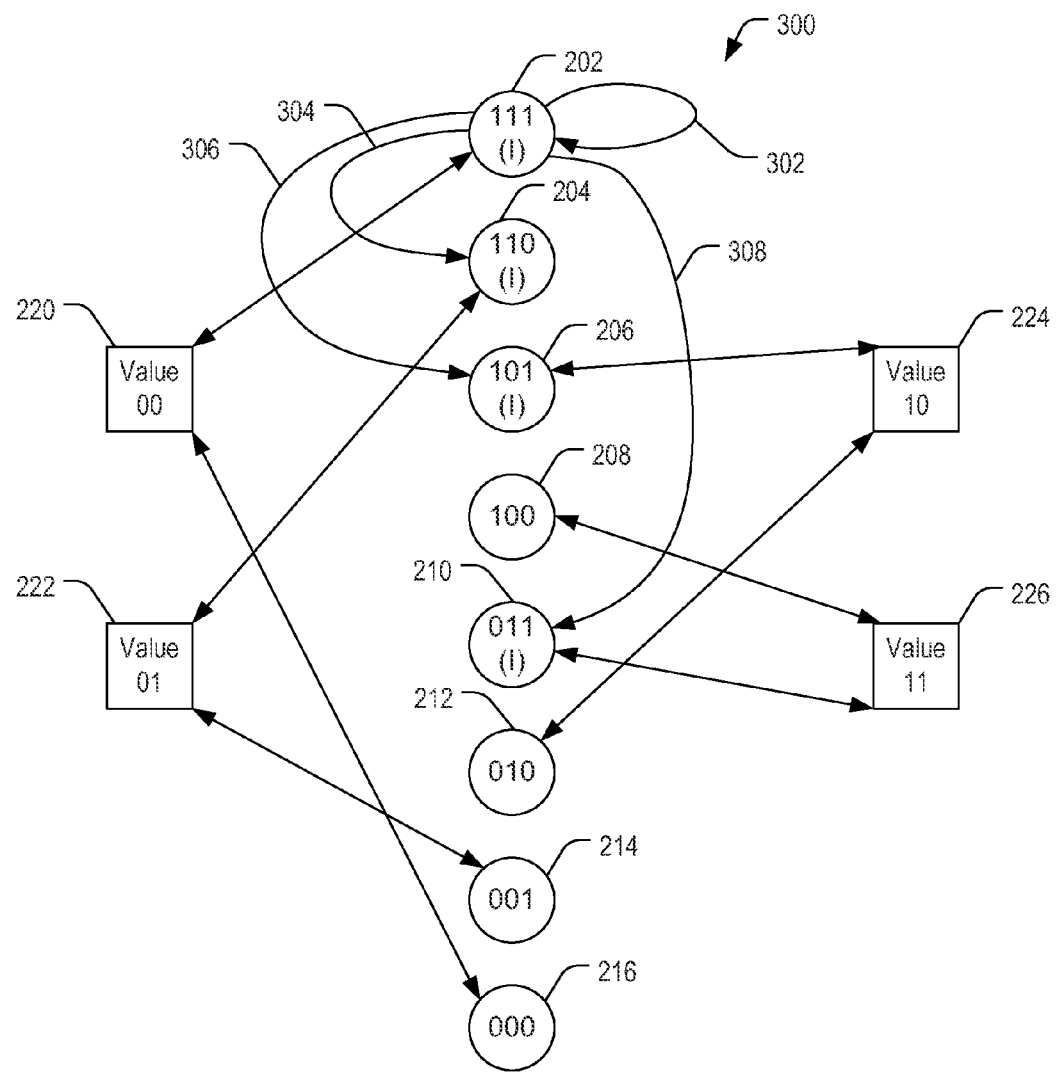

FIG. 3 illustrates transitions from the 111 state 202 based on a next data value that is received. A transition 302 corresponds to a mapping when the next data value is the 00 data value 220. A transition 304 corresponds to a mapping when the next data value is the 01 data value 222. A transition 306 corresponds to a mapping when the next data value is the 10 data value 224. A transition 308 corresponds to a mapping when the next data value is the 11 data value 224.

Figure 4:
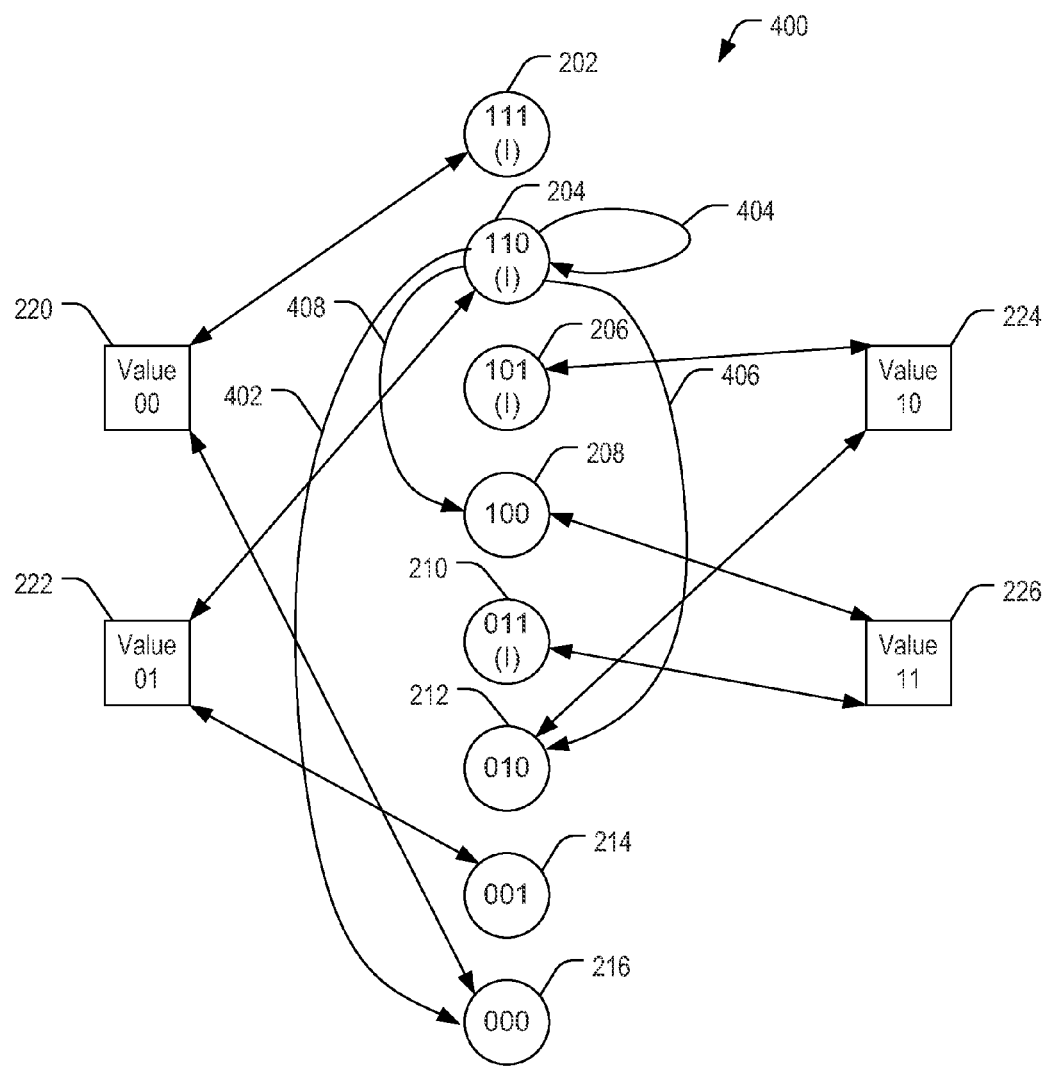

FIG. 4 illustrates transitions from the 110 state 204. A transition 402 corresponds to a mapping when the next data value is the 00 data value 220. A transition 404 corresponds to a mapping when the next data value is the 01 data value 222. A transition 406 corresponds to a mapping when the next data value is the 10 data value 224. A transition 408 corresponds to a mapping when the next data value is the 11 data value 224.

Figure 5:
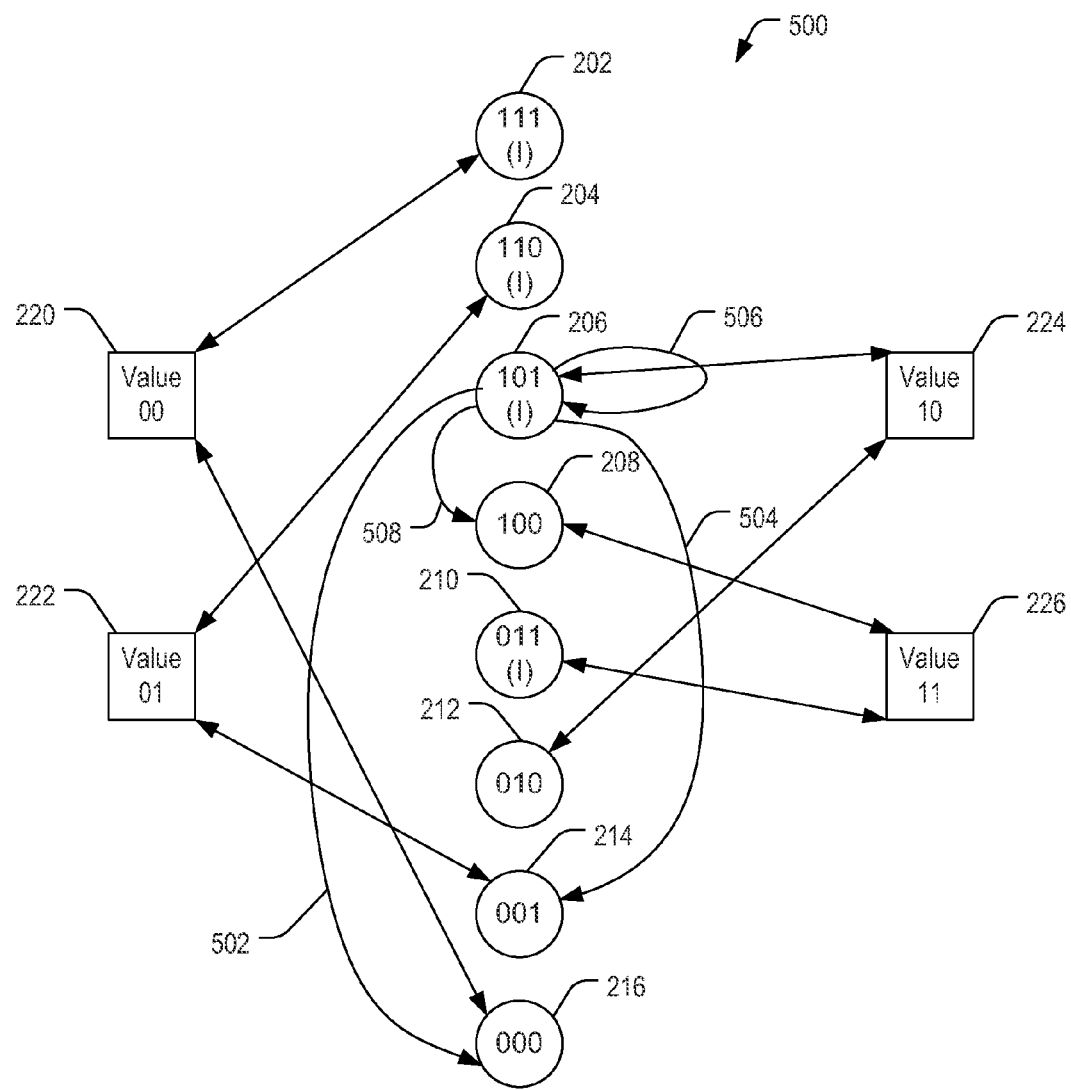

FIG. 5 illustrates transitions from the 101 state 206. A transition 502 corresponds to a mapping when the next data value is the 00 data value 220. A transition 504 corresponds to a mapping when the next data value is the 01 data value 222. A transition 506 corresponds to a mapping when the next data value is the 10 data value 224. A transition 508 corresponds to a mapping when the next data value is the 11 data value 224.

Figure 6:
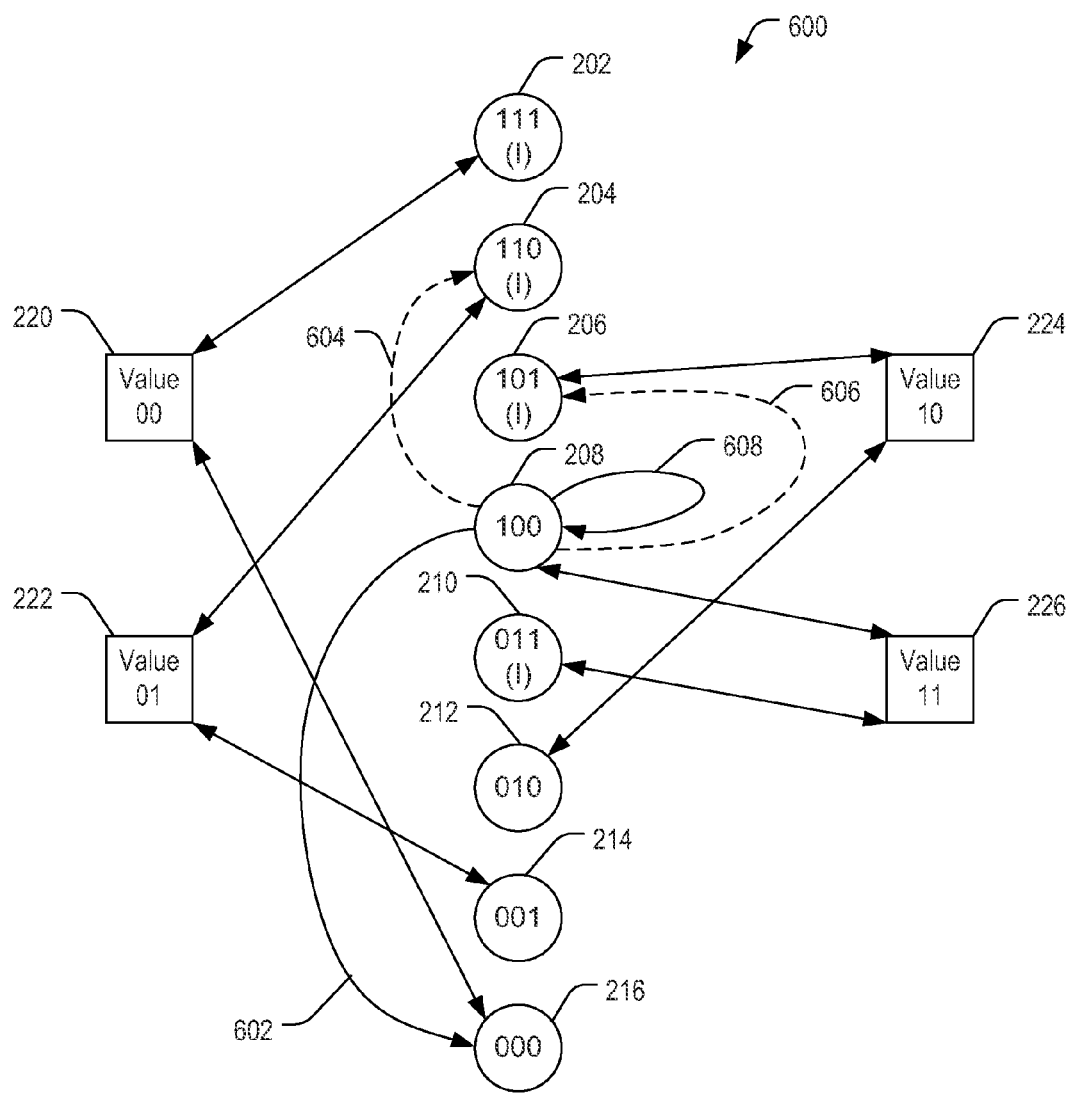

FIG. 6 illustrates transitions from the 100 state 208. A transition 602 corresponds to a mapping when the next data value is the 00 data value 220. A transition 604 corresponds to a mapping when the next data value is the 01 data value 222. A transition 606 corresponds to a mapping when the next data value is the 10 data value 224. A transition 608 corresponds to a mapping when the next data value is the 11 data value 224.

Figure 7:
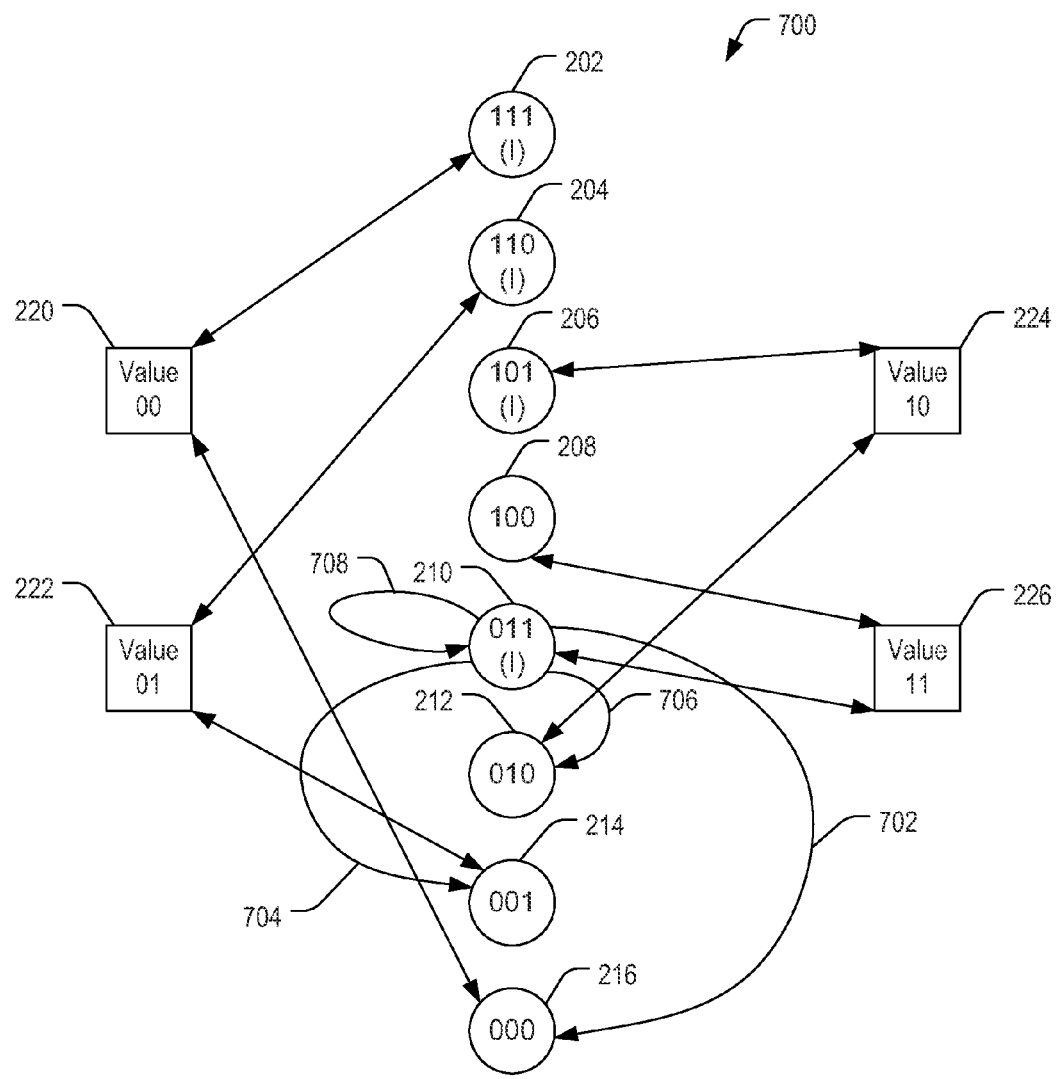

FIG. 7 illustrates transitions from the 011 state 210. A transition 702 corresponds to a mapping when the next data value is the 00 data value 220. A transition 704 corresponds to a mapping when the next data value is the 01 data value 222. A transition 706 corresponds to a mapping when the next data value is the 10 data value 224. A transition 708 corresponds to a mapping when the next data value is the 11 data value 224.

Figure 8:
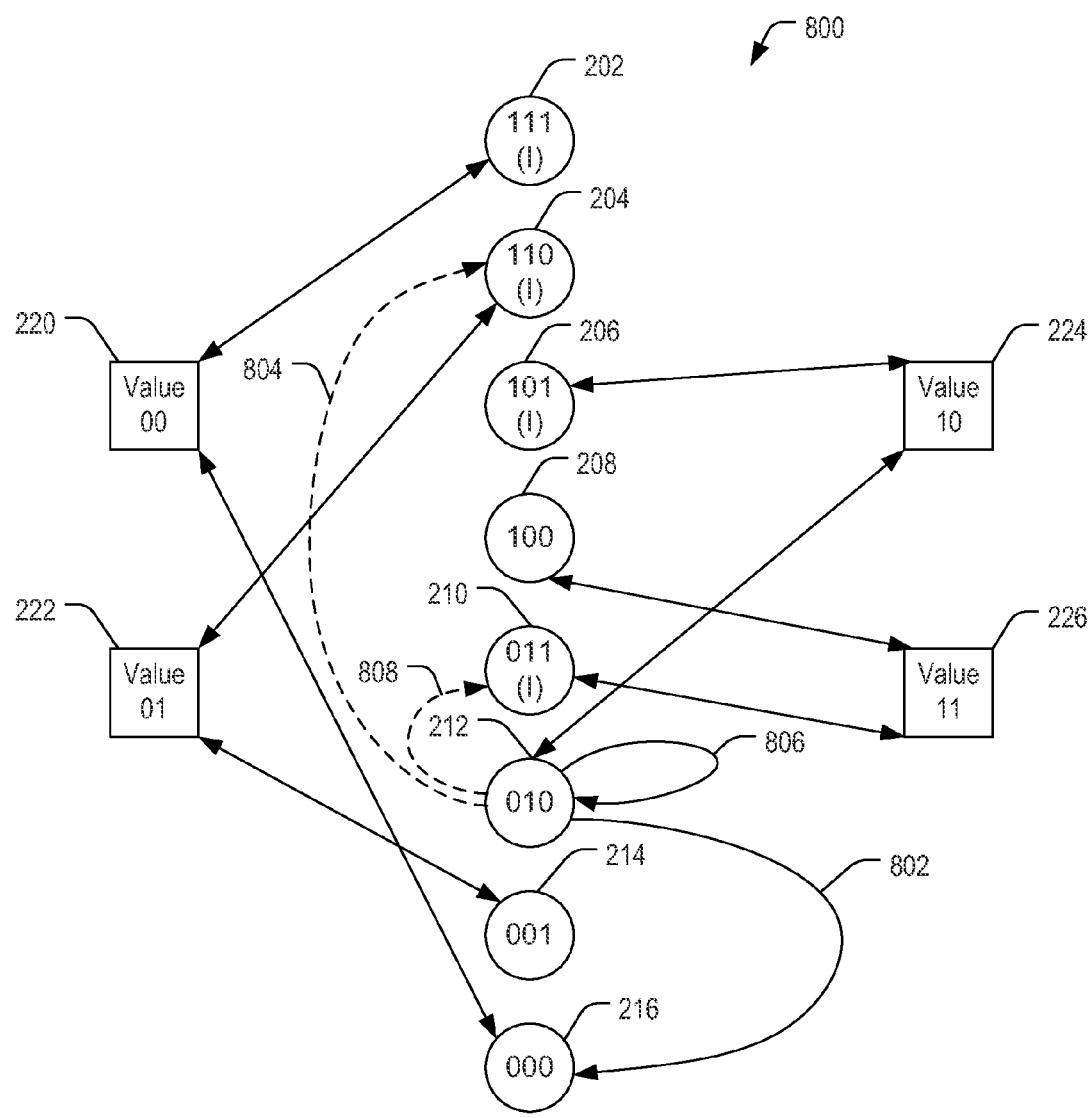

FIG. 8 illustrates transitions from the 010 state 212. A transition 802 corresponds to a mapping when the next data value is the 00 data value 220. A transition 804 corresponds to a mapping when the next data value is the 01 data value 222. A transition 806 corresponds to a mapping when the next data value is the 10 data value 224. A transition 808 corresponds to a mapping when the next data value is the 11 data value 224.

Figure 9:
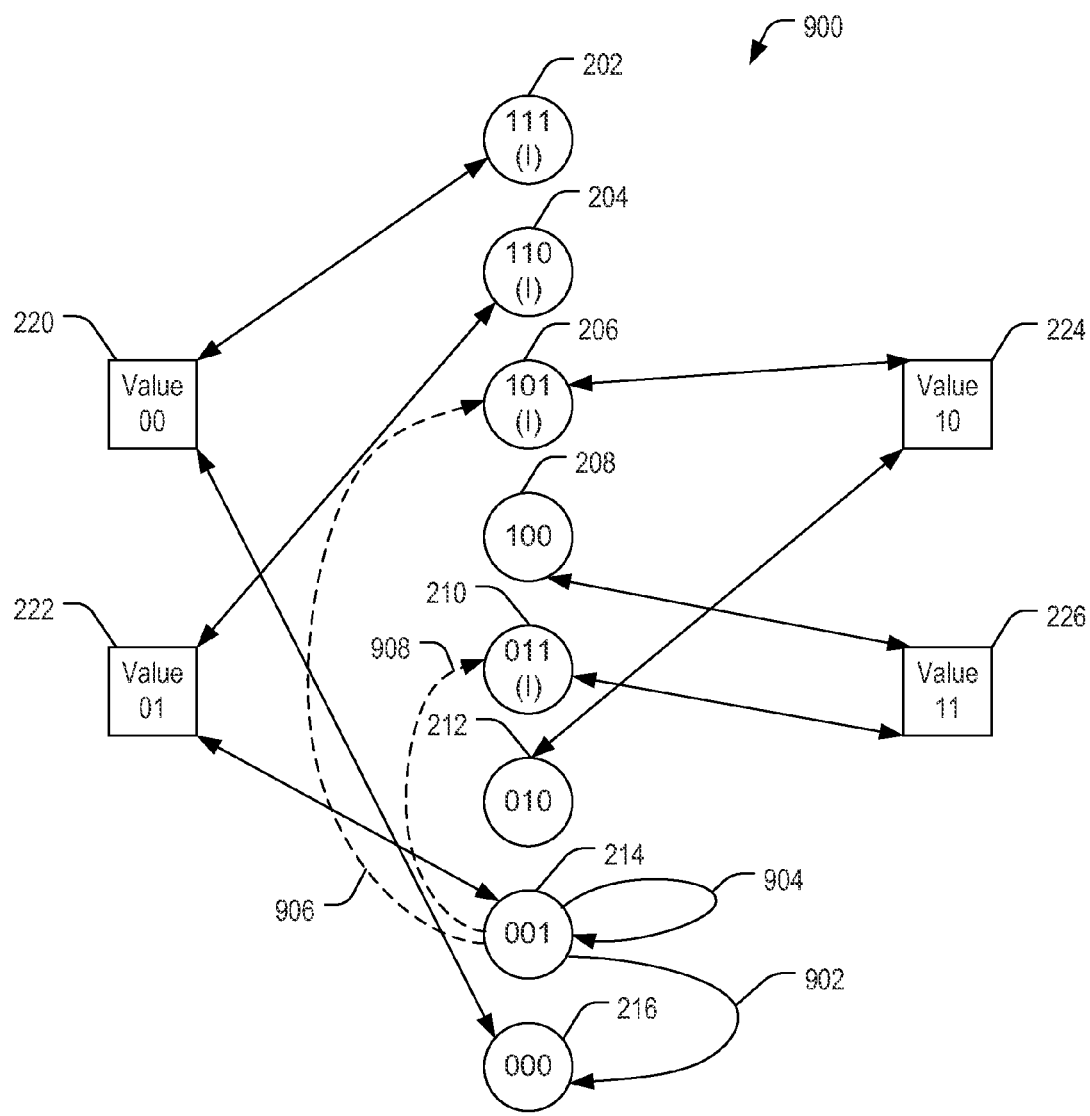

FIG. 9 illustrates transitions from the 001 state 214. A transition 902 corresponds to a mapping when the next data value is the 00 data value 220. A transition 904 corresponds to a mapping when the next data value is the 01 data value 222. A transition 906 corresponds to a mapping when the next data value is the 10 data value 224. A transition 908 corresponds to a mapping when the next data value is the 11 data value 224.

Figure 10:
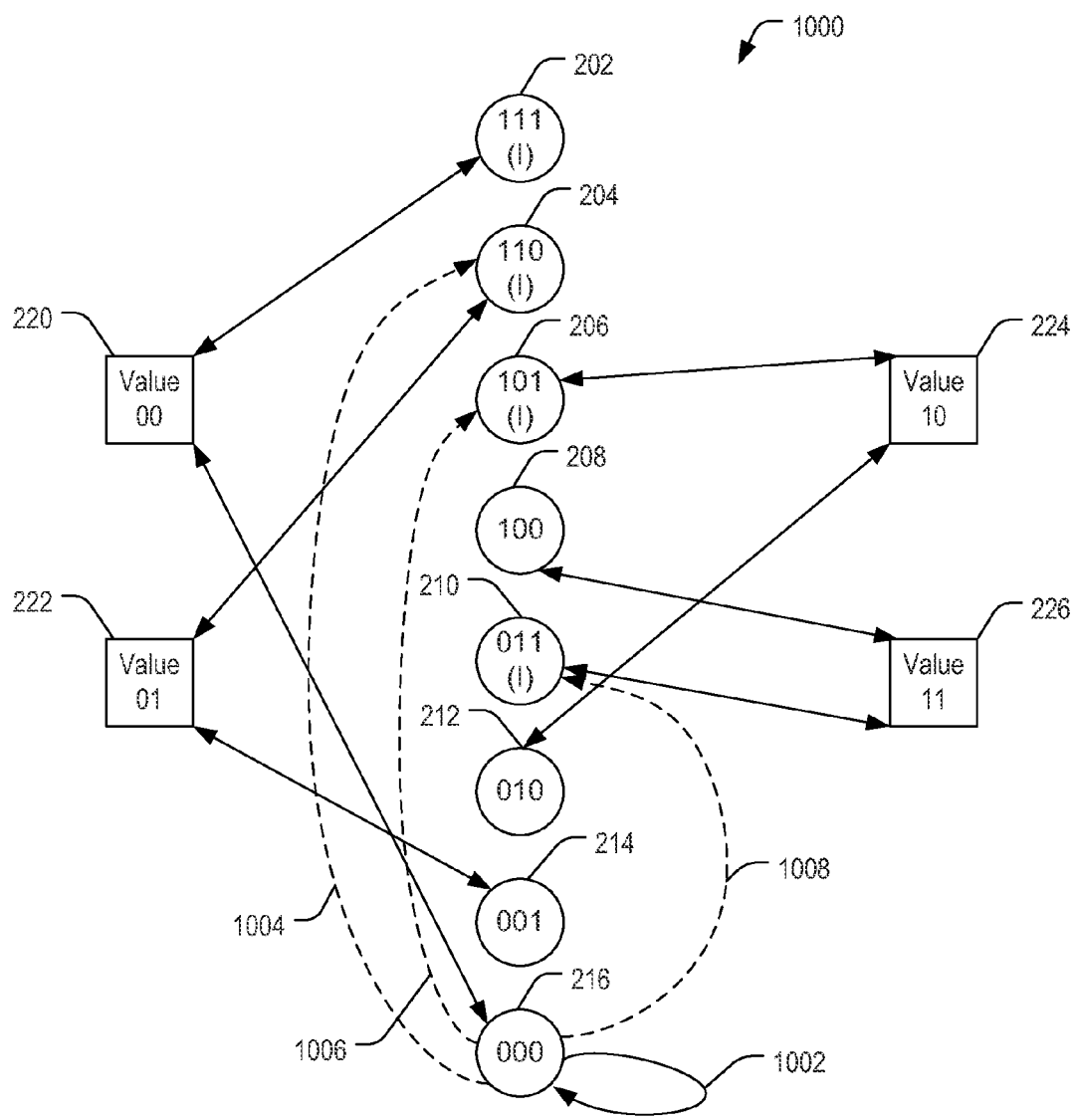

FIG. 10 illustrates transitions from the 000 state 216. A transition 1002 corresponds to a mapping when the next data value is the 00 data value 220. A transition 1004 corresponds to a mapping when the next data value is the 01 data value 222. A transition 1006 corresponds to a mapping when the next data value is the 10 data value 224. A transition 1008 corresponds to a mapping when the next data value is the 11 data value 224.

Applying the example mapping of FIGS. 2-10 to the data sequence {"00", "01", "10", "11"} illustrates how the mapping can reduce a number of write operations that involve a reset operation. For example, storing the data sequence into a memory without mapping (when the starting state is all ones) involves four write operations, a first write operation to store "00" that involves no reset operations, a second write operation to store "01" that involves a reset operation (to change the second bit from "0" to "1"), a third write operation to store "10" that involves a reset operation (to change the first bit from "0" to "1"), and a fourth write operation to store "11" that involves a reset operation (to change the second bit from "0" to "1"). However, storing the mapped sequence {"111", "110", "010", "011"} (when the starting state is all ones) involves four write operations, only the last of which involves reset operations to change a bit to a "1" value. Thus, using the mapping of FIGS. 2-10 increases a frequency of write operations that do not involve a reset operation. Because write operations that do not involve a reset operation may be performed faster than write operations that involve a reset operation, mapping data prior to storage can reduce an average write time.

Figure 11:
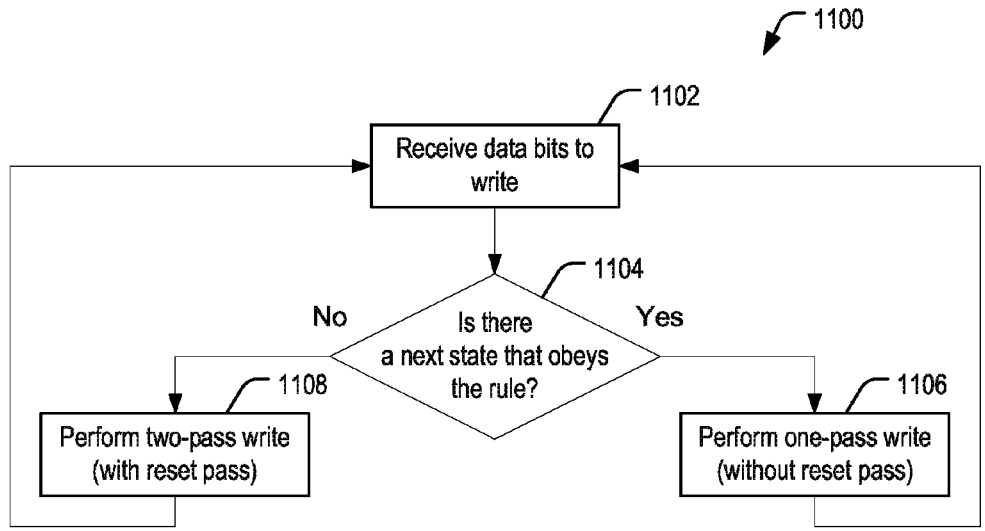
FIG. 11 is a flow chart of a particular embodiment of a method of writing data that may be performed by the data storage device of FIG. 1.
Figure 12:
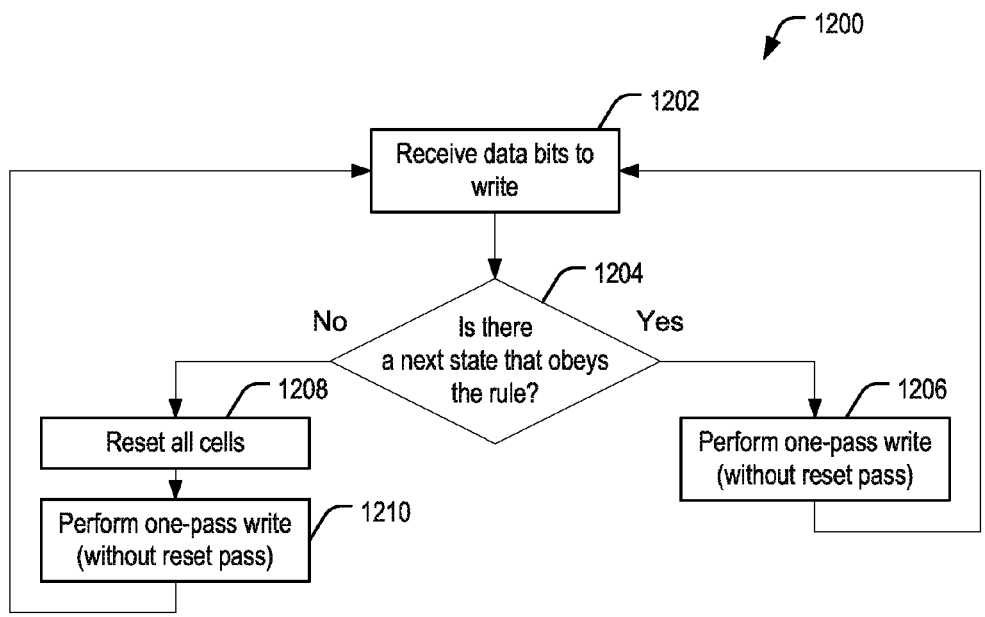
FIG. 12 is a flow chart of another particular embodiment of a method of writing data that may be performed by the data storage device of FIG. 1.
Figure 13:
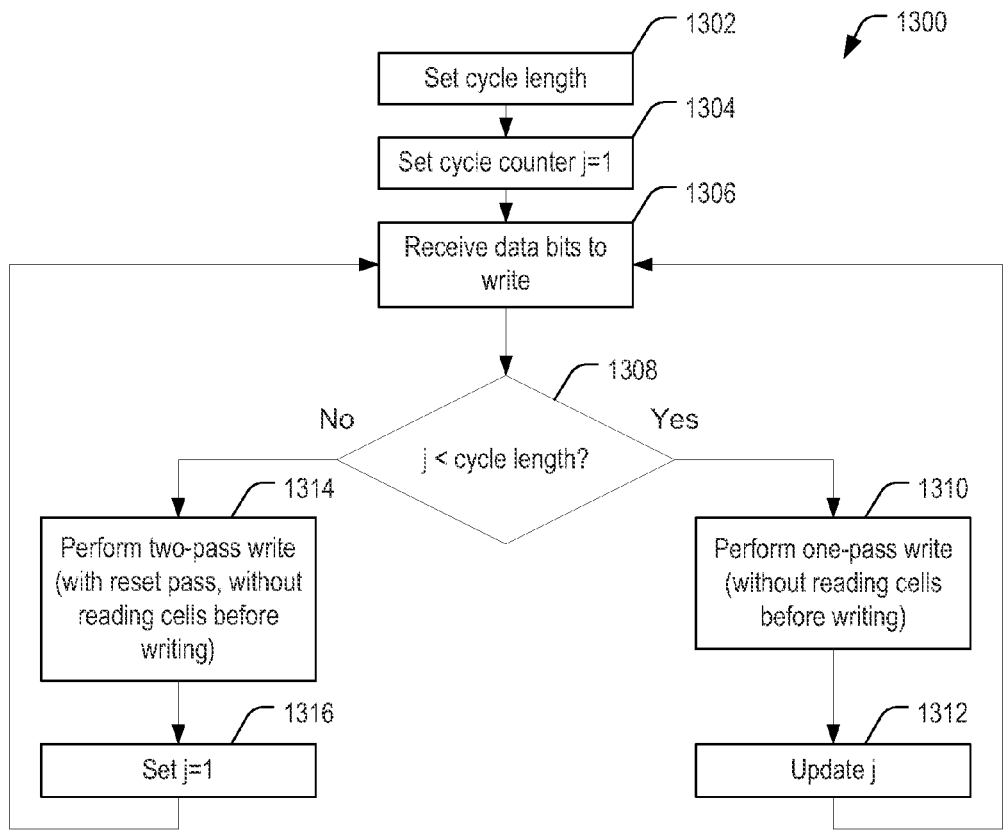
FIG. 13 is a flow chart of another particular embodiment of a method of writing data that may be performed by the data storage device of FIG. 1.

FIGS. 11-13 illustrate embodiments of procedures that may be applied to improve the average write time of a memory based on the principles outlined above. For example, the mapping engine 150 of FIG. 1 may be configured to apply one or more of the embodiments of FIGS. 11-13 to improve the average write time of the non-volatile memory 104. As explained above, a frequency of state transitions that do not require "reset" operations for any storage element may be increased by applying a mapping as compared to storing the received data value without applying the mapping. Because one of the functions that may be involved in writing data to the memory is the reset pass that updates values in storage elements that are to be reset, when a state transition does not require resetting any storage elements the reset pass may be skipped, reducing the write time as compared to performing the reset pass. An amount of reduction of the write time may depend on the time required by the memory for the set pass, the reset pass, the reading before writing (RBW) operation, and any command handling overhead of the memory. As an illustrative example, a reduction of 20% to 40% of the write time may be obtained when comparing a one-pass write operation (e.g., set operations and no reset operations) against two-pass write operation (e.g., set operations and reset operations). Note that performing an RBW stage is not considered a "pass" for determination of whether a write operation is a one-pass or two-pass write operation. Write time improvements may be further enhanced by avoiding the RBW stage, such as explained in further detail with respect to FIGS. 13-16.

In the examples that follow, estimates of write time improvements that may be obtained are provided. However, it should be noted that such examples ignore the extra time saving that may be attainable when the next selected state to be written to memory is the same as the current state that is in the memory such that the set pass and the reset pass may both be skipped. This extra time savings may provide further write time improvements over the estimates that are provided below.

FIG. 11 illustrates an embodiment of a process 1100 that may be applied to map incoming data values to mapped values to be stored in a memory. A data value including data bits to be stored in the memory is received, at 1102. For example, the data value may be the data 160 of FIG. 1. A determination is made whether a next state is available that satisfies the first criterion (e.g., a priority "rule" that the next state is selected so that no reset transitions are required to transition from the current state to the selected state), at 1104. In response to a next state being available that satisfies the first criterion, the available state is selected and a one-pass write operation is performed at the memory (i.e., a write operation that does not include performing a reset pass), at 1106. In response to no states being available that satisfy the first criterion, a two-pass write operation is performed at the memory (i.e., a write operation that includes performing a reset pass), at 1108.

Although a two-pass write operation is described at 1108, in some circumstances a reset pass may be performed without performing a set pass, such as illustrated in the dashed-line transitions illustrated in FIGS. 6, 8, 9, and 10. For example, updating storage elements according to the transition 604 in FIG. 6 from the 100 state 208 to the 110 state 204 may correspond to performing a reset operation to change the middle bit from "0" to "1" without performing a set operation. However, in other mappings for K=2, N=3 than those illustrated in FIGS. 2-10, and in mappings for other values of N and K, transitions that do not follow the first criterion may use set passes in addition to reset passes. For ease of explanation, all transitions that do not satisfy the first criterion are referred to as "two-pass" write operations, and estimates of write time improvements are based on the assumption that all such transitions include performing a set pass and a reset pass.

In the process 1100, a group of N storage elements may be written in variable-length cycles. After each two-pass write operation, one or more one-pass write operations may be performed. The number of one-pass write operations between two-pass write operations changes from cycle to cycle according to the specific sequence of data values that are written in each cycle.

For example, if the most recent two-pass write operation results in the storage elements at state "101" (representing a "10" data value) and a sequence of write commands is received for a sequence data values {"11", "11", "00", "00", "10"}, the storage elements will go through the sequence of states {"100", "100", "000", "000", "101"}. Only the last write operation of this sequence will be a two-pass write operation. As a result, a cycle is performed that includes one two-pass write operation (to write the initial state "101") followed by four one-pass write operations (to write the state "100", "100", "000", and "000") before a next two-pass write operation is required (to write the state "101", indicating a start of a next cycle).

As another example, if the most recent two-pass write operation results in the storage elements having state "110" (representing a "01" data value) and the sequence of next write operations is {"00", "11"} then the storage elements will go through the sequence of states {"000", "011"}. The last write operation of this sequence will be a two-pass write operation. As a result, a cycle is performed that includes a two-pass write operation followed by a single one-pass write operation.

The last example illustrates a worst-case scenario, as the one-to-many mapping from data bits to states used in this example guarantees there will always be at least one one-pass write operation between a pair of two-pass write operations. A best case scenario is a sequence of write operations that repeats the same data value again and again, resulting in the storage elements staying in the same state again and again. In such a case, all write operations can be one-pass (e.g., "one-pass" as defined as avoiding a reset pass, although in this case a set pass is also avoided), and the number of such "one-pass" operations that can occur between two two-pass operations is unbounded.

The average (statistical expectation) number of one-pass write operations that may be performed per a single two-pass write operation may be estimated for fully random data using the mapping of FIGS. 2-10. The randomness of the data implies that each of the four two-bit data values is equally likely and that there is no correlation between data values in successive write operations.

It can be shown that, for each starting state S, the expectations (Ef(S)) for the number of one-pass write operations that can be performed prior to a two-pass operation being required are:

Ef(000)=1/3
Ef(001)=7/9
Ef(010)=7/9
Ef(011)=53/27
Ef(100)=7/9
Ef(101)=53/27
Ef(110)=53/27
Ef(111)=89/27

Because the starting state for a sequence of fast operations is in the group {"111", "110", "101", "011"} (as these are the only initial states, and each sequence of one-pass write operations must start in an initial state), the overall average number of one-pass write operations per a single two-pass write operation is:

$$Ef=\tfrac{1}{4}(Ef(111)+Ef(110)+Ef(101)+Ef(011))=62/27=2.296$$

For comparison purposes, if the process 1100 is applied without using a one-to-many mapping of data values to states (and the number of states is equal to the number of data values (N=K)), the resulting expectations for the number of one-pass operations corresponding to a given starting state are:

Ef(00)=1/3
Ef(01)=7/9
Ef(10)=7/9
Ef(11)=53/27

The overall average number of one-pass write operations per a single two-pass write operation in this case is:

$$Ef=\tfrac{1}{4}(Ef(11)+Ef(10)+Ef(01)+Ef(00))=26/27=0.963$$

Average write time may be obtained by calculating the write time over a cycle that contains one two-pass write operation followed by average number of one-pass write operations, Ef. Designating the ratio between the time of a one-pass write operation and the time of a two-pass write operation as "A", then the ratio of a default write time (corresponding to a system that always performs two-pass write operations) and the improved write time is:

$$(1+Ef)/(1+Ef \times A).$$

Table 1 shows the average write time improvement factor for several values of A and for the three cases of: default write, improved write without the one-to-many mapping (i.e., the N=K case where the write operation is skipped when the data value does not change) and improved write with the one-to-many mapping of FIGS. 2-10 according to the process 1100. Note that because the time to perform the mapping is small compared to the time to perform a reset operation, the time to perform the mapping is not considered when computing the write time improvement factors.

TABLE 1

| Write time ratio "A" | Default (always two-pass) | Without one-to-many mapping | With one-to-many mapping |
|---|---|---|---|
| 0.6 | 1.000 | 1.244 | 1.386 |
| 0.65 | 1.000 | 1.207 | 1.322 |
| 0.7 | 1.000 | 1.173 | 1.264 |
| 0.75 | 1.000 | 1.140 | 1.211 |
| 0.8 | 1.000 | 1.109 | 1.162 |

The improvement factors provided in Table 1 correspond to the specific example of K=2 and N=3. As the ratio N/K increases (subject to storage capacity considerations described below) the write time improvement for the one-to-many mapping (right column) also increases, and the relative improvement compared to both the default (left column) and N=K cases (middle column) increases.

FIG. 12 illustrates an embodiment of a process 1200 that may be applied to map incoming data values to mapped values to be stored in a memory. A data value including data bits to be stored in the memory is received, at 1202. For example, the data value may be the data 160 of FIG. 1. A determination is made whether a next state is available that satisfies the first criterion (the priority "rule" that the next state is selected so that no reset transitions are required to transition from the current state to the selected state), at 1204. In response to a next state being available that satisfies the first criterion, the available state is selected and a one-pass write operation is performed at the memory (i.e., a write operation that does not include performing a reset pass), at 1206. In response to no states being available that satisfy the first criterion, all storage elements (e.g., memory cells) are reset, at 1208, and a one-pass write operation is performed, at 1210.

Under some circumstances the process 1200 may result in faster write times than the process 1100 of FIG. 11. For example, the non-volatile memory 104 of FIG. 1 may support a dedicated write command to skip both the read-before-write (RBW) stage and the reset pass when it is known that, prior to the write operation, all storage elements are in the reset state. A non-RBW, single-pass write operation may be shorter in time than a one-pass write that includes an RBW stage (e.g., in the process 1100 of FIG. 11). The combined time to reset all storage elements and perform a non-RBW single-pass write operation may be shorter than the time to perform a two-pass write that includes an RBW stage.

FIG. 13 illustrates an embodiment of a process 1300 that may be applied to map incoming data values to mapped values to be stored in a memory. The process 1300 limits mapping cycles to a predefined cycle length to enable synchronization of cycles of multiple mapped values, such as when multiple mapped values are written as a single page of data into a memory. The cycle length is set, at 1302. The cycle length corresponds to a number of one-pass write operations that are performed between two-pass write operations, plus one. A cycle counter "j" is set to an initial value (e.g., j=1), at 1304. For example, the cycle counter may correspond to the count 156 of FIG. 1.

A data value including data bits to be stored in the memory is received, at 1306. For example, the data value may be the data 160 of FIG. 1. A determination is made whether the cycle counter is less than the cycle length, at 1308. In response to the cycle counter being less than the cycle length, a next state is selected via a mapping, such as described in further detail with respect to FIGS. 14-15, and a one-pass write operation is performed at the memory (i.e., a write operation that does not include performing a reset pass), at 1310. The cycle counter is updated (e.g., incremented by one), at 1312, and processing returns to 1306 where a next data value may be received.

In response to the cycle count being greater than or equal to the cycle length, at 1308, a two-pass write operation is performed, at 1314. The cycle counter is set to the initial value (e.g., j=1), at 1316, and processing returns to 1306, where a next data value may be received.

An advantage of this embodiment is that all write operations (both one-pass and two-pass) may be performed without reading the storage elements before writing. For example, the write operations may be performed without the mapping circuitry 150 of FIG. 1 receiving the stored data 170.

In some circumstances the process 1300 may result in faster average write times than the process 1100 of FIG. 11 and the process 1200 of FIG. 12. For example, when the processes 1100 and 1200 are applied in a device where relatively large pages of data that contain multiple groups of N storage elements are to be written to the memory, the data written into one group of N storage elements for one page may not be the same as the data written into another group of N storage elements for the same page. Each group of N storage elements may follow a different sequence of states and as a result a cycle length for one group may differ from the cycle length of another group. As the number of groups in a single page increases, a likelihood that at least one of the groups in the page reaches an end of its cycle and requires a two-pass write also increases. Because a write time for the page may be limited by the write time of the slowest group, a single group that requires a two-pass write may at least partially offset write time improvements attained by the other groups that perform a one-pass write.

In contrast to the processes 1100 and 1200, the process 1300 synchronizes groups of storage elements that share a common page such that all groups start and end their cycles at the same time. This also implies that all groups have the same cycle length that is pre-determined and that is not affected by the data values being written. Note that in the context of the process 1300, the meaning of the term "cycle" is the number of iterations of the 1306-1308-1310-1312 sequence until the cycle count is reset to the initial value, plus one. A cycle is therefore equal to the number of one-pass write operations that are performed sequentially, plus one (for the two-pass write operation that precedes the resetting of the cycle count). In addition to potential write time improvement for large data pages due to synchronization of the groups, the process 1300 may also reduce write time by not performing an RBW stage before any write operation.

Figure 14:
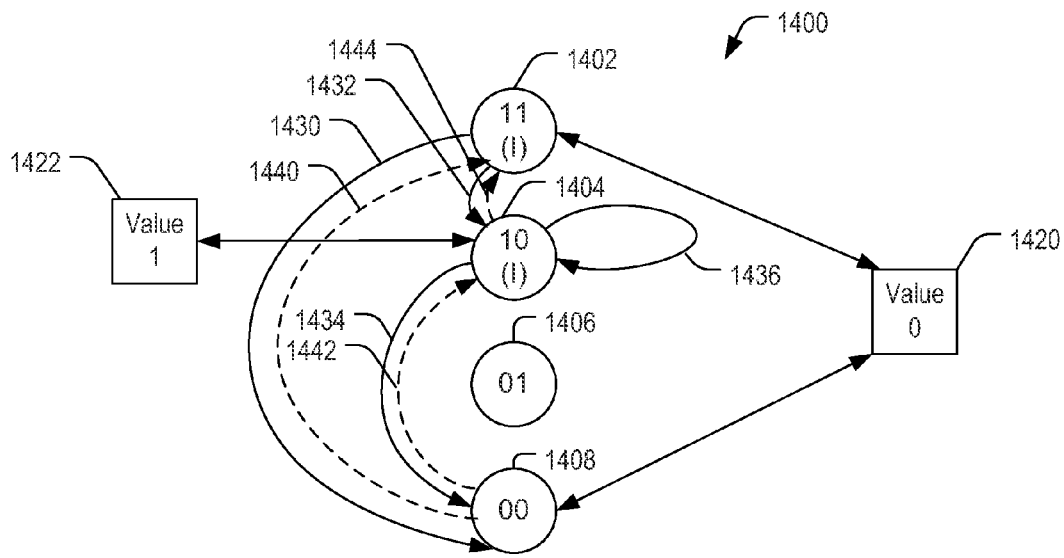
FIG. 14 is a diagram of another particular illustrative embodiment of states and transitions between the states that may be implemented in a mapping applied by the data storage device of FIG. 1.

FIG. 14 provides an example of a mapping 1400 that may be applied using the process 1300 of FIG. 13 where K=1 and N=2. The mapping includes a 11 state 1402, a 10 state 1404, a 01 state 1406, and a 00 state 1408. A "0" data value 1420 is mapped to the 11 state 1402 and to the 00 state 1408. A "1" data value 1422 is mapped to the 10 state 1404. The 11 state 1402 is the initial state for the "0" data value 1420 and the 10 state 1404 is the initial state for the "1" data value 1422.

The cycle length of the mapping 1400 is two. Selection of states is based on the data value and the stage number in the cycle and is independent of the current state of the storage elements. In the first stage of the cycle, the 11 state 1402 is selected for data "0" (via transition 1440 or transition 1444) and the 10 state is selected for data "1" (via transition 1442 or transition 1436). In the second stage of the cycle, the 00 state 1408 is selected for data "0" (via transition 1430 or transition 1434) and the 10 state 1404 is selected for data "1" (via transition 1432 or transition 1436). The mapping 1400 and stage-based selection criteria cause the first stage to correspond to a two-pass write operation and the second stage to correspond to a one-pass write operation.

The one-pass write operations corresponding to FIGS. 13-14 may skip an RBW stage and therefore may be faster than one-pass write operations that include an RBW stage. As an example, a reduction in write time with one-pass operations that do not require RBW may be 30% to 50% as compared to two-pass write operations that require RBW.

For the K=2 and N=3 example of FIGS. 2-10, a longest cycle length that can be guaranteed according to the process 1300 of FIG. 13 is two. However, achieving a cycle length of two requires performing RBW and selecting next states based on the current states.

It should be noted that some conventional ReRAM memories should not (or cannot) skip the RBW stage even though knowledge of the previous state is not required for determining the next state. In such memories attempting to set a storage element that is already set might damage the storage element and therefore should be avoided. In such memories, internal write circuitry may perform the RBW stage in order to determine which storage elements are already set and should be skipped to avoid damage. However, in some memories that are not allowed to set a storage element that is already set, it is nevertheless allowed to reset a storage element that is already reset. In such memories, the definitions of "set" and "reset" may be switched so that under the new definitions setting an already-set cell is permitted. In this case, the process 1300 of FIG. 13 may therefore be performed and the RBW step may be skipped.

An example of write time improvements in the two-stage cycle case of FIG. 14 is provided in Table 2. For cases with RBW (either memories that may not skip RBW or coding schemes that require RBW) the relevant rows are in the lower part of the table and for cases that can skip RBW the relevant rows are in the upper part of the table.

TABLE 2

| Write time ratio "A" | Default (always two-pass) | Two-stage cycle |
|---|---|---|
| 0.5 | 1.000 | 1.333 |
| 0.6 | 1.000 | 1.290 |
| 0.6 | 1.000 | 1.250 |

TABLE 2-continued

| Write time ratio "A" | Default (always two-pass) | Two-stage cycle |
|---|---|---|
| 0.65 | 1.000 | 1.212 |
| 0.7 | 1.000 | 1.176 |
| 0.75 | 1.000 | 1.143 |
| 0.8 | 1.000 | 1.111 |

Figure 15:
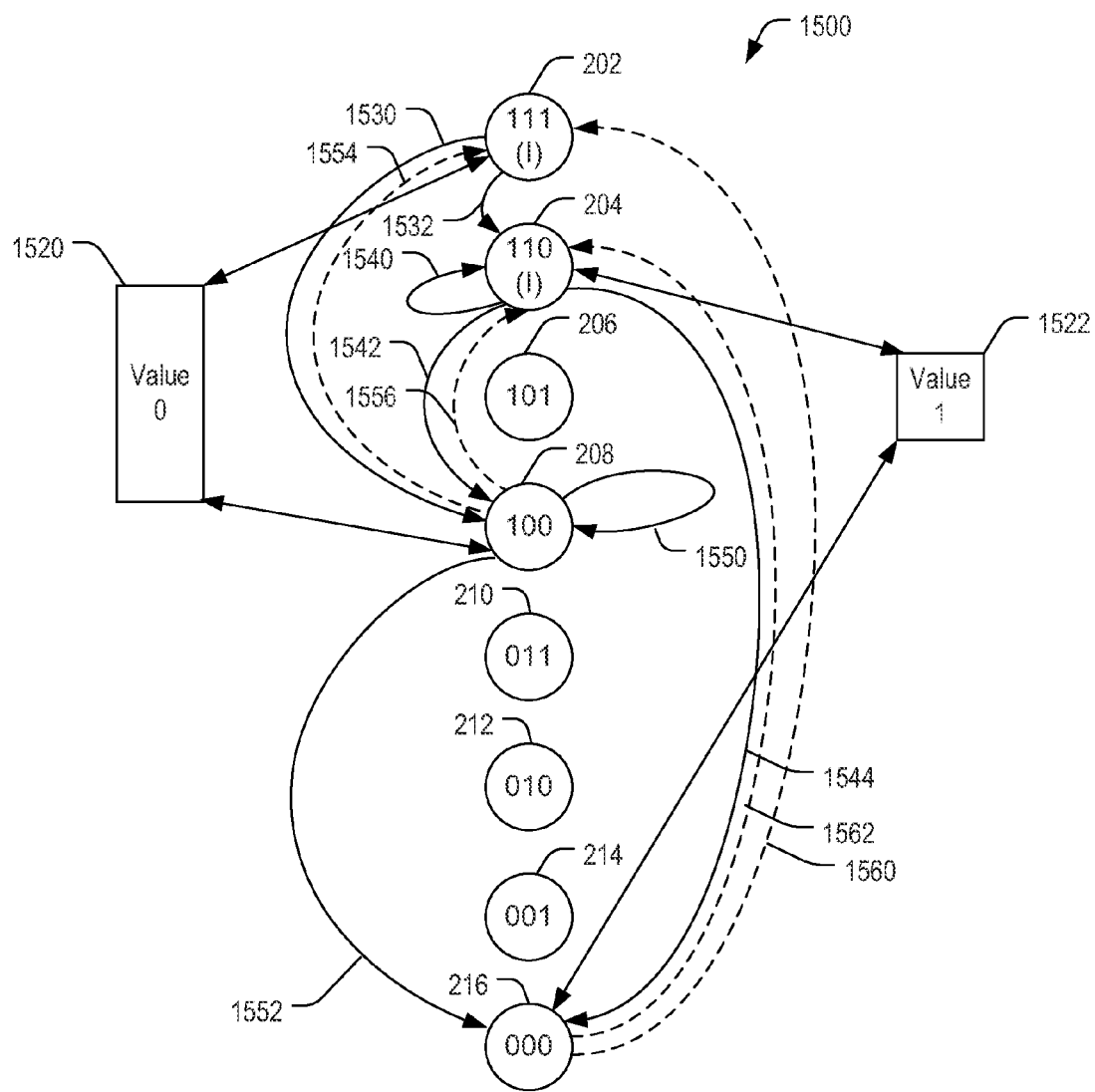
FIG. 15 is a diagram of another particular illustrative embodiment of states and transitions between the states that may be implemented in a mapping applied by the data storage device of FIG. 1.

Although the above examples show a fixed cycle of length two, other values of K and N may be selected to achieve longer cycles and hence reduced average write time. For example, FIG. 15 depicts an embodiment of a three-cycle mapping 1500 where K=1 and N=3. States 202-216 correspond to the states of FIGS. 2-10. A "0" data value 1520 is mapped to the 111 state 202 and the 100 state 208. A "1" data value 1522 is mapped to the 110 state 204 and to the 000 state 216. The 111 state 202 is the initial state for data value "0" and the 110 state 204 is the initial state for data value "1". Transitions 1530-1562 indicate transitions between states.

Data values are mapped to states based on the data value and the cycle stage. In the first cycle stage, state "111" is selected for data "0" and state "110" is selected for data "1". In the second cycle stage, state "100" is selected for data "0" and state "110" is selected for data "1". In the third cycle stage, state "100" is selected for data "0" and state "000" is selected for data "1".

As in the K=1, N=2 example of FIG. 14, selection of states can be performed without knowing the previous data and no RBW is required, implying enhanced write time improvement.

FIG. 15 illustrates that the cycle length is three. As a result, after each two-pass write operation there are two one-pass write operations. An example of write time improvement obtainable in this case is provided in Table 3.

TABLE 3

| Write time ratio "A" | Default (always two-pass) | Three-stage cycle |
|---|---|---|
| 0.5 | 1.000 | 1.500 |
| 0.55 | 1.000 | 1.429 |
| 0.6 | 1.000 | 1.364 |
| 0.65 | 1.000 | 1.304 |
| 0.7 | 1.000 | 1.250 |
| 0.75 | 1.000 | 1.200 |
| 0.8 | 1.000 | 1.154 |

Similarly, a mapping with K=1 and N=4 may achieve a cycle of length four. For example, in the first cycle stage, select state "1111" for data "0" and select state "1110" for data "1". In the second cycle stage, select state "1100" for data "0" and select state "1110" for data "1". In the third cycle stage, select state "1100" for data "0" and select state "1000" for data "1". In the fourth cycle stage, select state "0000" for data "0" and select state "1000" for data "1". States can be selected without knowing the previous data and no RBW is required, implying enhanced write time improvement. An example of write time improvement for this case is provided in Table 4.

TABLE 4

| Write time ratio "A" | Default (always two-pass) | Four-stage cycle |
|---|---|---|
| 0.5 | 1.000 | 1.600 |
| 0.6 | 1.000 | 1.509 |

TABLE 4-continued

| Write time ratio "A" | Default (always two-pass) | Four-stage cycle |
|---|---|---|
| 0.6 | 1.000 | 1.429 |
| 0.65 | 1.000 | 1.356 |
| 0.7 | 1.000 | 1.290 |
| 0.75 | 1.000 | 1.231 |
| 0.8 | 1.000 | 1.176 |

In general, a desired cycle length may be attained by selection of appropriate values of N and K. As a simple example, for K=1 and arbitrary N, a solution with cycle length N can be achieved. However, because the write time gain may be bounded by 1/A (where A is the ratio between the time of one-pass and two-pass write operations), increases in cycle length as the 1/A boundary is approached may result in negligible increases in write time improvement.

In the process 1300 of FIG. 13, it is not always the case that state transitions that minimize the number of storage elements to set are preferred over state transitions with increased numbers of storage elements to set. Because state transitions are not necessarily selected to provide a largest possible cycle length, state transitions that would result in reduced cycle length in the processes 1100 and 1200 of FIGS. 11 and 12 may be acceptable.

For example, in the K=2, N=3 case illustrated in FIGS. 2-10, if the current state is "111" and the new data value is "00", the transition 302 of FIG. 3 causes the next state to remain "111". However, using the process 1300 of FIG. 13, "000" may be selected as the next state without affecting the length of the cycle (i.e., two). As another example, if the current state is "111" and the new data value is "10", the transition 306 of FIG. 3 causes the next state to be "101". However, using the process 1300 of FIG. 13, "010" may be selected as the next state without affecting the length of the cycle (i.e., two).

As a result, implementation of the process 1300 of FIG. 13 may include selection of the next state from the group of states that correspond to the same data value at least partially based on ease of implementation considerations while ensuring the ability to reach a pre-determined cycle length. Such considerations may have enhanced impact when the pre-determined cycle length is more than two.

As mentioned previously, the process 1300 of FIG. 13 may be implemented in memories that write large pages at a time. For example, if a 1-kilobyte page is to be stored using a mapping where K=4 and N=8, then there are 1024 groups in a page. From the point of view of a host device, the number of data bits stored in a page may be 512 bytes because each of the 1024 groups contributes only 4 data bits. In this case there might be a difference between the logical address of bits within the page and the physical address of the bits. For example, if the memory supports reading of individual bytes from a memory buffer (e.g., as in a NAND flash memory) and if the host needs to read the last data byte in the page (logical byte 511 from the host point of view), the bytes to physically read are the last two bytes in the physical page (physical bytes 1022 and 1023). The reading circuitry may be responsible for performing accurate logical-to-physical conversions (according to the N and K values) to access the correct data. Alternatively, a memory may be designed so as to implement a policy of storage element allocation in which the first K storage elements of all groups are located sequentially starting from the beginning of the page, and then additional (N−K) cells are allocated for each group at the end of the page. With this policy, translation of logical bit addresses to physical bit addresses is straight-forward, but increased complexity may arise when matching the subgroups of (N−K) cells to their corresponding K-cell subgroups at both write and read time.

Figure 16:
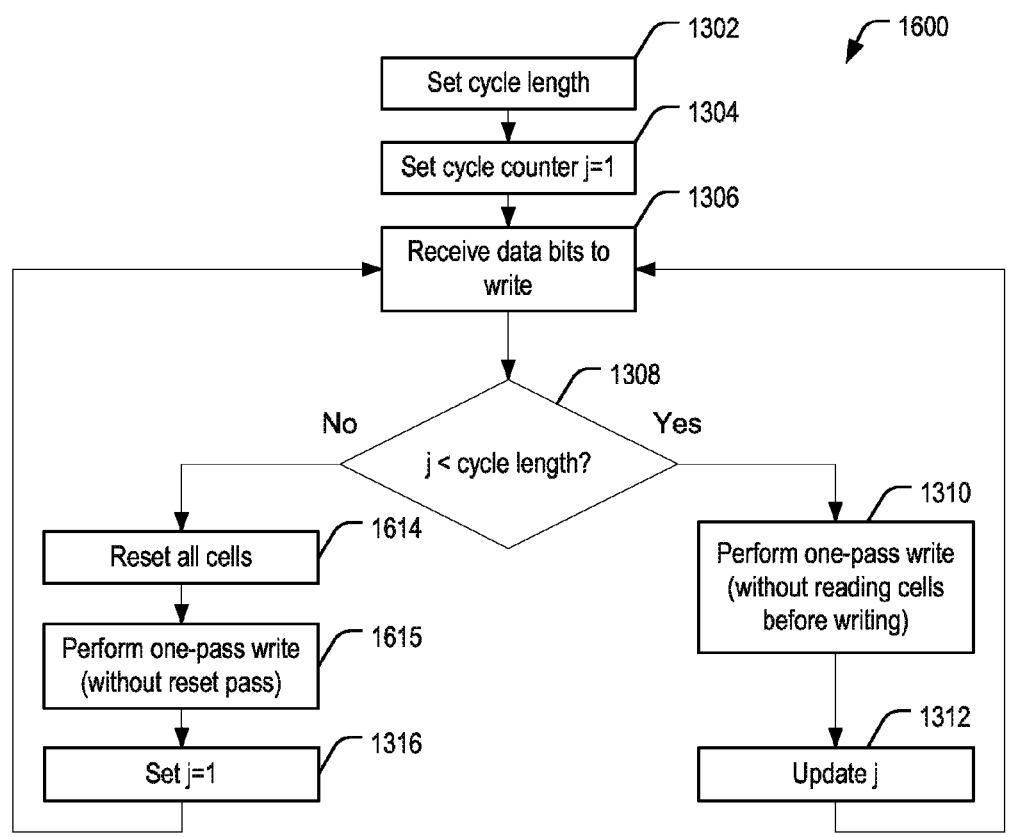
FIG. 16 is a flow chart of another particular embodiment of a method of writing data that may be performed by the data storage device of FIG. 1.

FIG. 16 illustrates another embodiment of a process 1600 that is similar to the process 1300 of FIG. 13. In the process 1600, an operation to reset all storage elements in the group to "1", at 1614, and a one-pass write operation, at 1615, replace the two-pass write at 1314 of FIG. 13. As described with respect to the process 1200 of FIG. 12, if the combined time of resetting all storage elements and performing a non-RBW single-pass write operation is shorter than the time for performing a two-pass write (that includes or that does not include RBW, depending on the memory and coding scheme), enhanced write time improvements may be attained by the process 1600 as compared to using the two-pass write operation of FIG. 13.

The preceding examples are described with respect to "time-symmetric" memories in which the duration of the set pass (the time taken to perform the set pass during a write operation) and the duration of the reset pass (the time taken to perform the reset pass during a write operation) are approximately equal. However, in other implementations, storing data into elements in one direction (e.g., via one of a set pass or a reset pass) is slower than in the opposite direction (e.g., via the other of the set pass or the reset pass). The systems and methods described with respect to FIGS. 1-16 further improve write time using such a "time-asymmetric" memory.

For clarity of explanation, implementations are described where a set operation (e.g., "1" to "0") is faster than a reset operation (e.g., "0" to "1"). However, in implementations where the reset operation is faster than the set operation, the definitions of the set and reset operations may be reversed so that the statement "a set operation is faster than a reset operation" is accurate.

Each of the embodiments described above may be applied to memories that are time-asymmetric with respect to set operation duration and reset operation duration. Because of the difference between the faster set operation and the slower reset operation, the ratio A between the time of fast (e.g., one-pass) and slow (e.g., two-pass) write operations is smaller than for time-symmetric memories. The A ratio depends on the ratio of the reset/set times and on the amount of fixed overhead for handling write commands by the memory device. For a reset/set time ratio of 3 and no RBW, an illustrative example of a value of the A ratio is in the range of 30% to 50%, and the resulting write time improvement exceeds the write time improvement that would result using a time-symmetric memory. For comparison purposes, an example is provided in Table 5 using the process 1300 of FIG. 3 with K=1 and N having values of 2, 3, and 4.

TABLE 5

| Write time ratio "A" | Default (always two-pass) | K = 1, N = 2 | K = 1, N = 3 | K = 1, N = 4 |
|---|---|---|---|---|
| 0.3 | 1.000 | 1.538 | 1.875 | 2.105 |
| 0.35 | 1.000 | 1.481 | 1.765 | 1.951 |
| 0.4 | 1.000 | 1.429 | 1.667 | 1.818 |
| 0.45 | 1.000 | 1.379 | 1.579 | 1.702 |
| 0.5 | 1.000 | 1.333 | 1.500 | 1.600 |

The systems and methods of the present disclosure have been described in the context of memory devices that store a single bit per storage element (e.g., one-bit-per-cell (SLC)

memories), but the systems and methods of the present disclosure are also applicable for memory devices that store multiple bits per storage element (e.g., multi-bit-per-cell (MLC) memories). For example, a group of N MLC storage elements each storing B bits per storage element can be considered as a group of N×B SLC storage elements, as both configurations store the same number of bits. The methods of the present disclosure as described for SLC storage elements, as applied to a group of N×B SLC storage elements, may be applied to group a of N MLC storage elements that each store B bits. Additional write time improvements may be attained using MLC memory devices as compared to using SLC memory device due to a potentially greater number of state transitions that satisfy one or more of the described selection criteria.

To illustrate, states of two SLC storage elements may be compared to states of a single 2 bit-per-cell MLC storage element. Both configurations (2 SLC vs. 1 MLC) store two bits and have four possible states. Using the convention that the four states of the MLC storage element represent the data bit values {11,10,01,00} ordered according to their distance from the "reset" state and listed from closest to furthest, and that the two states of the SLC storage elements represent the data bits value {1,0}, it is noted that although both configurations have the same available states, in the SLC configuration the transition from "10" to "01" does not obey the first selection criterion because it requires one of the cells to be set and the other to be reset. However, in the MLC configuration the transition from "10" to "01" does obey the first selection criterion because transitioning from "10" to "01" is done by altering the state of the storage element in the direction of the set operation.

As a result, the MLC configuration should enable write performance improvement that is at least the same as the SLC configuration and may enable further improved write performance in terms of the length of the cycles that may be attained (e.g., average cycle length for the processes 1100 or 1200 of FIGS. 11-12, or fixed cycle length for the processes 1300 or 1600 of FIGS. 13 and 16). To illustrate, a K=1, N=2 mapping can be implemented in a 2 bit-per-cell MLC memory with the following state selections: in the first cycle stage select state "11" for data "0" and select state "10" for data "1", in the second cycle stage select state "01" for data "0" and select state "10" for data "1", and in the third cycle stage select state "01" for data "0" and select state "00" for data "1". The K=1, N=2 state selections result in a cycle of length three, compared to a cycle length of two that is achievable in the implementation of a SLC K=1, N=2 mapping.

The MLC configuration may exhibit additional complexity as compared to a SLC configuration because, in contrast to the two types of operations (set and reset) of the SLC configuration, the MLC configuration may also include partial set operations and partial reset operations of various degrees. Each of these operations may have a different execution time and therefore a determination of a theoretically optimal encoding for minimizing write time for a MLC configuration may involve additional considerations as compared to a SLC configuration. However, as demonstrated above, additional write time improvement can be achieved in an MLC configuration using a one-to-many data value to states mapping and taking advantage of any time asymmetry that may be exhibited in the execution time of the various set and reset operations.

Although the system 100 of FIG. 1 illustrates the mapping circuitry 150 in the controller 120, in other embodiments the mapping of data values to mapped values corresponding to storage element states may instead be performed at the memory die 103. For example, one or more of the methods of the present disclosure may be implemented in a memory device (e.g., by circuitry in the memory die 103 of FIG. 1, in which case the controller 120 may operate as a conventional memory controller without regard for (or knowledge of) mapping of data prior to storage in the non-volatile memory 104).

Figure 17:
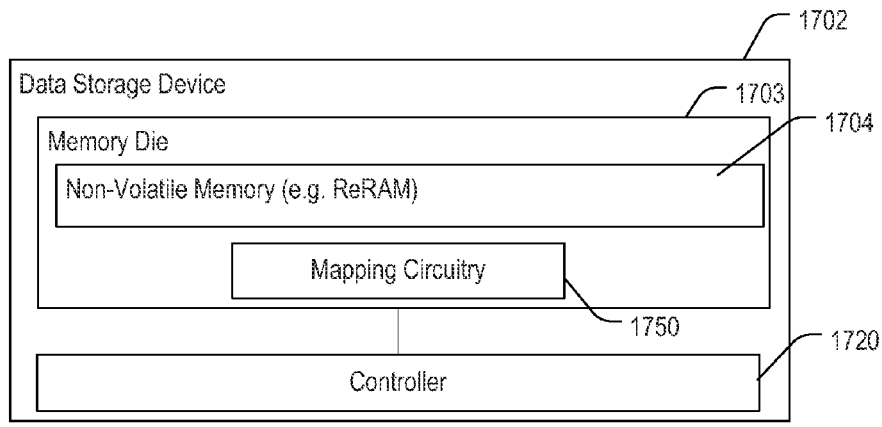
FIG. 17 is a block diagram of an embodiment of a data storage device configured to apply a mapping to reduce average write time to a non-volatile memory.

FIG. 17 illustrates an example of a data storage device 1702 that includes a controller 1720 coupled to a memory die 1703. The memory die 1703 includes a non-volatile memory 1704 (e.g., a ReRAM) and mapping circuitry 1750. The mapping circuitry 1750 may be configured to operate in accordance with one or more of the methods of the present disclosure to reduce write time by mapping data values received from the controller 1720 to mapped values, such as according to one or more of the process 1100 of FIG. 11, the process 1200 of FIG. 12, the process 1300 of FIG. 13, or the process 1600 of FIG. 16, as illustrative examples. Although the controller 1720 is illustrated as distinct from the memory die 1703, in other implementations the controller 1720 and the non-volatile memory 1704 may be on a common die. By including the mapping circuitry 1750 on the memory die 1703, additional time savings may be achieved in implementations that perform an RBW stage by avoiding transfer of stored data to the controller 1720 (e.g., the stored data 170 of FIG. 1).

Figure 18:
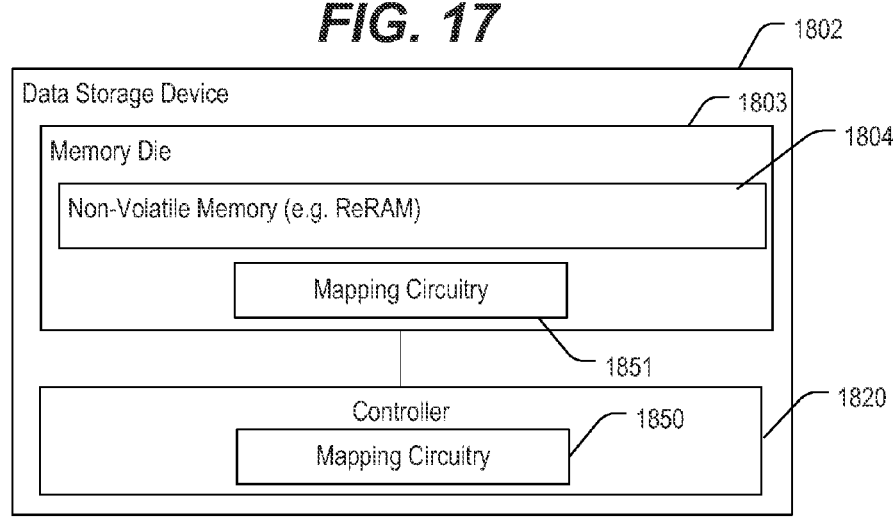
FIG. 18 is a block diagram of another embodiment of a data storage device configured to apply a mapping to reduce average write time to a non-volatile memory.

As another example, one or more of the methods of the present disclosure may be implemented in a controller of a memory device (e.g., by the mapping circuitry 150 of FIG. 1, in which case the non-volatile memory 104 may operate as a conventional non-volatile memory without regard for (or knowledge of) the mapping of data occurring at the controller 120). As another example, one or more of the methods of the present disclosure may be implemented by cooperation of a memory device and a memory controller. FIG. 18 illustrates an example of a data storage device 1802 that includes a controller 1820 coupled to a memory die 1803. The controller 1820 includes first mapping circuitry 1850. The memory die 1803 includes a non-volatile memory 1804 (e.g., a ReRAM) and second mapping circuitry 1851. The mapping circuitry 1850 and 1851 may be configured to cooperate to operate in accordance with one or more of the methods of the present disclosure to reduce average write time by mapping data values received at the controller 1820 to mapped values to be stored in the non-volatile memory 1804, such as according to one or more of the process 1100 of FIG. 11, the process 1200 of FIG. 12, the process 1300 of FIG. 13, or the process 1600 of FIG. 16, as illustrative examples. Although the controller 1820 is illustrated as distinct from the memory die 1803, in other implementations the controller 1820 and the non-volatile memory 1804 may be on a common die.

Figure 19:
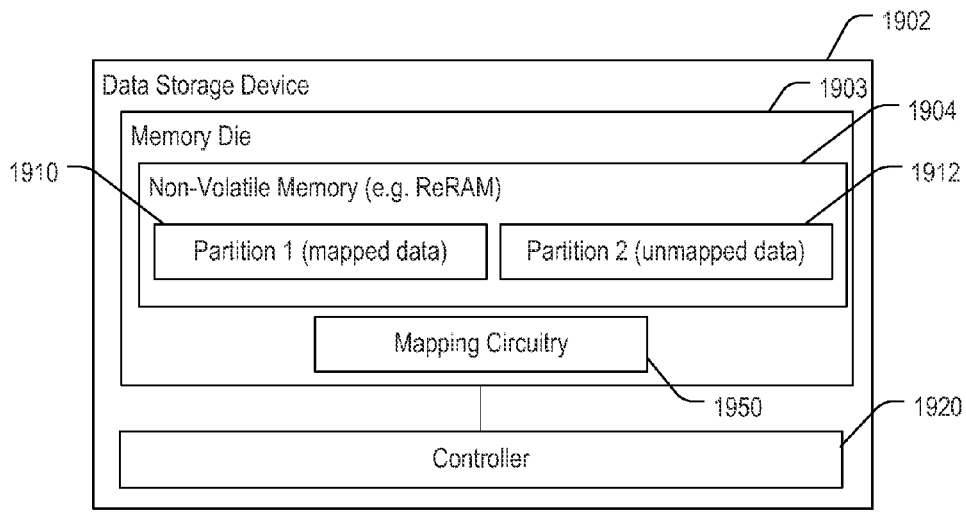
FIG. 19 is a block diagram of a particular embodiment of a data storage device configured to apply a mapping to reduce average write time to a first partition of a non-volatile memory.

FIG. 19 illustrates an example of a data storage device 1902 that includes a controller 1920 coupled to a memory die 1903. The memory die 1903 includes a non-volatile memory 1904 (e.g., a ReRAM) and mapping circuitry 1950. The non-volatile memory 1904 includes a first partition 1910 and a second partition 1912. The mapping circuitry 1950 is configured to map received data for storage into the first partition 1910 and to not map the received data for storage into the second partition 1912. The mapping circuitry 1950 may be configured to operate in accordance with one or more of the methods of the present disclosure to reduce average write time by mapping data values received from the controller 1920 to mapped values, such as according to one or more of the process 1100 of FIG. 11, the process 1200 of FIG. 12, the process 1300 of FIG. 13, or the process 1600 of FIG. 16, as illustrative examples.

Although the controller 1920 is illustrated as distinct from the memory die 1903, in other implementations the controller 1920 and the non-volatile memory 1904 may be on a common die. Although the mapping circuitry 1950 is on the memory die 1903, in other implementations the mapping circuitry 1950 may be implemented on the controller 1920, such as illustrated with respect to FIG. 1, or partly on the controller 1920 and partly on the memory die 1903, such as illustrated with respect to FIG. 18.

For the processes 1100 and 1200 of FIGS. 11 and 12, selection of the next state may be based on the current state and based on one or more state transition criteria (e.g., the first criterion) and may be independent of cycle stage. For the processes 1300 and 1600 of FIGS. 13 and 16, selection of the next state is at least partially based on the current stage in the cycle.

There are therefore several possibilities regarding the stage number in the cycle depending on the implementation and the type of memory, including:

A. The stage number in the cycle is not used for state selection, such as in the processes of FIGS. 11-12.

B. The stage number in the cycle is used for state selection and is retrievable from the memory together with the data bits without incurring a time penalty. For example, if the process of FIG. 13 or FIG. 16 is implemented with a type of memory that is constrained to perform RBW, the memory is read before performing a write operation. In such implementations, storage elements may be allocated in the same page of the memory as the data bits to store the current cycle stage number. The stage number may be read during the RBW operation without incurring additional latency as compared to performing a dedicated read operation to retrieve the stage number. The updated stage number may also be stored along with the data without incurring additional latency.

C. The stage number in the cycle is used for state selection and is not retrievable from the memory device together with the data bits without incurring a time penalty. For example, the process of FIG. 13 or FIG. 16 may be implemented with a type of memory that does not perform RBW in one-pass write operations. Several options may be available in such implementations:

1. The stage number is read from the memory for each write command, incurring additional latency to read the stage number. In this case, only a few bits containing the stage number may be read rather than reading an entire page of data. In some memory types, reading a small amount of data is performed faster than reading a full page so the additional latency may be comparatively small.

2. The stage number is maintained by the controller (e.g., using the cycle counter 154 of FIG. 1). The controller may maintain a table of current stage number for pages that are written using mapped data and may notify the memory device which stage number applies for each write command. As an example, the mapping circuitry 1850 of FIG. 18 may maintain stage numbers and may send the stage number and data to the mapping circuitry 1851 so that the mapping circuitry 1851 can select a next state based on the stage number. The stage number may be transferred to the memory as an additional parameter to a write command, as a prefix before a write command, the prefix identifying the stage number, or by using different operation codes (opcodes) for write commands at different stages of the cycle, as illustrative examples.

As an alternative implementation, the controller may perform the mapping of the data values to states (and from states to data values during read operations) and may send the mapped data, such as the mapped data 172 of FIG. 1, to the memory using standard write commands. In this case, the memory may not be "aware" of the use of mapped data and may perform standard read and write commands. Some implementations of the disclosed systems and methods may introduce reduced device capacity while providing improved write times when using a one-to-many mapping. A memory device manufacturer may offer for sale a device that is fully pre-configured to use one or more of the methods of the present disclosure and that provides reduced average write time as compared to other devices using the same memory technology (the other devices not using the methods of the present disclosure). As another example, the manufacturer may offer a device that can be configured by the user to use one or more of the methods of the present disclosure to improve average write time. Alternatively, the manufacturer may offer a device in which a portion of the storage elements operates without using one or more of the methods of the present disclosure and another portion of the storage elements uses one or more of the methods of the present disclosure. For example, the device may be a multiple-partition device in which one partition provides faster write operation, such as the first partition 1910 of FIG. 19, while other partitions may provide larger exported capacity, such as the second partition 1912 of FIG. 19. Alternatively, the user may be given the option to configure a partition to either use or not use one or more of the methods of the present disclosure, and optionally also to configure the partition size. Alternatively, the user may be given the option to select, for each write command, whether or not the device should use one or more of the methods of the present disclosure (and may also specify whether to use the methods in each read operation if the memory is not configured to track which pages store mapped data).

In implementations where use of a one-to-many mapping improves average write time and uses extra storage elements as compared to storing unmapped data, in some circumstances memory write throughput may not improve as compared to data storage using unmapped data. Although the average write time is reduced, the amount of data written per write operation may be smaller and the overall write throughput (e.g., in terms of megabytes (MB)/second (sec)) might not be improved. To illustrate, using K=1 and N=2 and with an A ratio of 0.3, a write time improvement of 1.54 may be achieved. If the native memory has the capability of writing a 1 kilobyte (KB) page in 100 microseconds (a throughput of 10 MB/sec) then the K=1, N=2 implementation will have an improved average write time of 65 microseconds while writing 0.5 KB of useful data per command, resulting in a throughput of about 7.7 MB/sec. However, various use cases of non-volatile memory provide improved performance when write time is improved and when a full memory page can be consumed during each write.

A first example of such a use case is when a monitored performance measure of a memory is the number of random-address write operations of relatively large chunks of data (e.g., 4 KB chunks) that the memory can accept per second. This is a common measure for the responsiveness of solid state drive (SSD) devices and embedded memories in smartphones. If the page size of the memory is 8 KB then an input burst of data from the host can be stored into a fast cache partition that uses one or more of the methods of the present disclosure, such as with a K=1 and N=2 scheme that consumes a full page for each input data chunk of 4 KB. In such an implementation, the host sees a fast average write time and correspondingly measures a high number of input/output operations per second (IOPS).

A second example is when memory management firmware (e.g., a flash management module) managing the internals of a storage device handles its internal control tables. Such tables might be updated frequently, creating a performance burden on the drive. Such tables typically contain entries that are smaller than a page. If a table containing 512-byte entries is stored in a memory that uses 2 KB pages, one or more of the methods of the present disclosure may be used with memory blocks that contain the tables, such as a K=1 and N=4 scheme that consumes a full page for each table entry but achieves a fast write time per entry.

In both examples, the host experiences improved average write performance of the memory, even if an overall write throughput is not improved. Other examples of use cases in which commercial advantage results from increased write performance provided by a one-to-many mapping while storing a reduced amount of data per write operation will be apparent to those of skill in the art.

Figure 20:
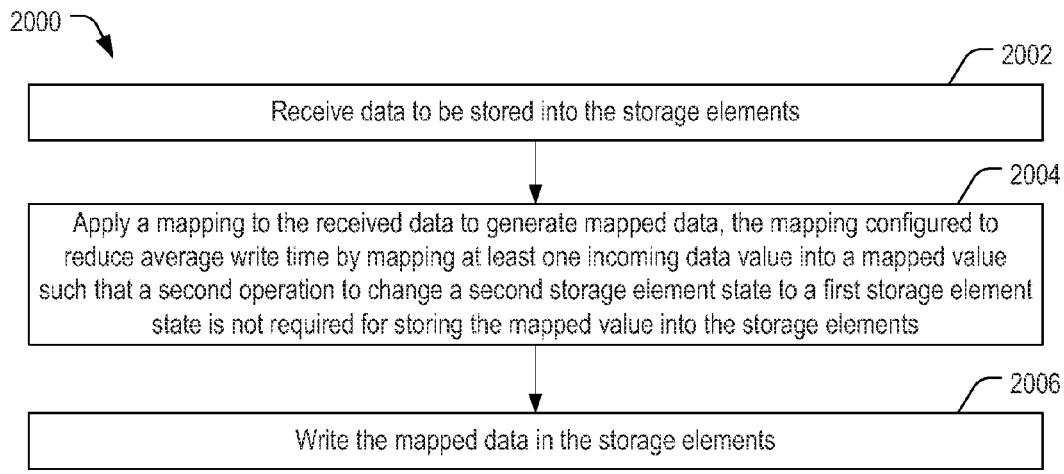
FIG. 20 is a diagram of a particular embodiment of a method of writing data that includes a mapping configured to reduce average write time to a non-volatile memory.

FIG. 20 illustrates a particular embodiment of a method 2000 of writing data that includes a mapping configured to reduce an average write time. The method 2000 may be performed in a memory device configured to write data to storage elements by performing at least one of a first operation (e.g., a "set" operation) on one or more first storage elements that are in a first state and a second operation (e.g., a "reset" operation) on one or more second storage elements that are in a second state. The first operation changes the first state to the second state and the second operation changes the second state to the first state. For example, the memory device may include a resistive random access memory (ReRAM). In a particular embodiment, the method 2000 may be performed by the data storage device 102 of FIG. 1, the data storage device 1702 of FIG. 17, the data storage device 1802 of FIG. 18, or the data storage device 1902 of FIG. 19.

Data to be stored into the storage elements is received, at 2002. For example, the data may be the data 160 received at the mapping circuitry 150 of FIG. 1.

A mapping is applied to the received data to generate mapped data, at 2004. The mapping is configured to reduce average write time by mapping at least one incoming data value into a mapped value such that the second operation is not required for storing the mapped value into the storage elements. Applying the mapping may include, in response to a first mapped value of the data value requiring a transition from the second state to the first state and a second mapped value of the data value requiring no transitions from the second state to the first state, selecting the second mapped value. For example, applying the mapping may be performed by the mapping circuitry 150 of FIG. 1 and may include applying the first selection criterion. The mapped data is written in the storage elements, at 2006.

The mapping may be a one-to-many mapping, such as a mapping where N>K. For example, applying the mapping of the received data to the mapped data may include matching multiple mapped data values to a particular received data value and, in response to all of the multiple mapped data values that are matched to the particular data value requiring a transition from the second state to the first state, selecting one of the multiple mapped data values with a largest number of bits matching the first state of the storage elements as compared to the others of the multiple mapped data values.

In some implementations, the mapping of the received data to the mapped data depends on the states of the storage elements prior to the writing of the mapped data, such as described with respect to FIGS. 11-12. In other implementations, the mapping of the received data to the mapped data does not depend on the states of the storage elements prior to the writing of the mapped data, such as described with respect to FIGS. 13-16.

Figure 21:
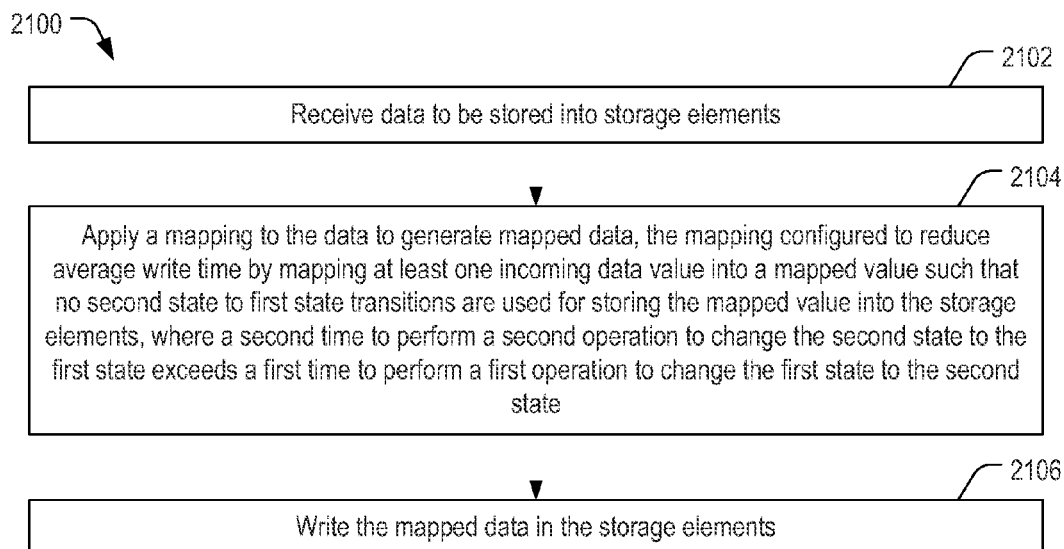
FIG. 21 is a diagram of a particular embodiment of a method of writing data that includes a mapping configured to reduce average write time to a non-volatile memory.

FIG. 21 illustrates a particular embodiment of a method 2100 of writing data that includes a mapping configured to reduce an average write time. The method 2100 may be performed in a memory device configured to write data to storage elements by performing at least one of a first operation on one or more first storage elements that are in a first state and a second operation on one or more second storage elements that are in a second state. The first operation (e.g., a set operation) changes the first state to the second state, and the second operation (e.g., a reset operation) changes the second state to the first state. A second time to perform the second operation exceeds a first time to perform the first operation (e.g., a "time-asymmetric" memory). For example, the memory device may include a resistive random access memory (ReRAM). In a particular embodiment, the method 2100 may be performed by the data storage device 102 of FIG. 1, the data storage device 1702 of FIG. 17, the data storage device 1802 of FIG. 18, or the data storage device 1902 of FIG. 19.

Data to be stored into the storage elements is received, at 2102. For example, the data may be the data 160 received at the mapping circuitry 150 of FIG. 1.

A mapping is applied to the data to generate mapped data, at 2104. The mapping is configured to reduce average write time by mapping at least one incoming data value into a mapped value such that no second state to first state transitions are used for storing the mapped value into the storage elements. Applying the mapping may include, in response to a first mapped value of the data value requiring a transition from the second state to the first state and a second mapped value of the data value involving no transitions from the second state to the first state, selecting the second mapped value. For example, the mapping may be applied by the mapping circuitry 150 of FIG. 1 and may include applying the first selection criterion. The mapped data is written in the storage elements, at 2106.

The mapping may be a one-to-many mapping, such as a mapping where N>K. For example, applying the mapping may include matching multiple mapped data values to a particular received data value and, in response to all of the multiple mapped data values that are matched to the particular received data value involving a transition from the second state to the first state, selecting one of the multiple mapped data values with a largest number of bits matching the first state as compared to the others of the multiple mapped data values.

In some implementations, the mapping of the received data to the mapped data depends on the states of the storage elements prior to the writing of the mapped data, such as described with respect to FIGS. 11-12. In other implementations, the mapping of the received data to the mapped data does not depend on the states of the storage elements prior to the writing of the mapped data, such as described with respect to FIGS. 13-16.

For example, the mapping of the received data to the mapped data may depend on a cyclic count of write operations to the storage elements, such as described with respect to FIGS. 13-16. Applying the mapping may include determining, based on the cyclic count, whether transitions from the second state to the first state are to be performed in a write operation, such as by comparing the cycle counter "j" to the cycle length at 1308 of FIG. 13. A value of the mapped data may be selected according to the determination. For example, a mapped data value may be selected to perform a one-pass write, such as selecting the '00' state 1408 of FIG. 14 that matches a "0" received data value when the cycle counter matches the cycle length. As another example, a mapped data value may be selected to perform a two-pass write, such as selecting the '11' state 1402 of FIG. 14 that matches the "0" received data value when the cycle counter is less than the cycle length.

A cycle length of the cyclic count may be the same for successive cycles of write operations. The storage elements into which the mapped data is written may be part of a memory page. The memory page may include multiple groups of storage elements. During a write operation, the mapping of received data to mapped data may be applied to each of the multiple groups of storage elements, and the cyclic count may be shared by the multiple groups of storage elements. For example, the group 106 of FIG. 1 may include 1024 storage elements, and the mapping of FIG. 14 may be used to map each bit of 512 received data bits into a two-bit mapped value that is to be written into a corresponding sub-group of the group 106. To illustrate, the group 106 may include 512 sub-groups of two storage elements that form a single memory page. Cycle counts for each sub-group are synchronized so that all sub-groups of the group 106 start and end their cycle together. As a result, mapped data may be stored to the group 106 according to the mapping of FIG. 14 using a cycle length of 2.

Figure 22:
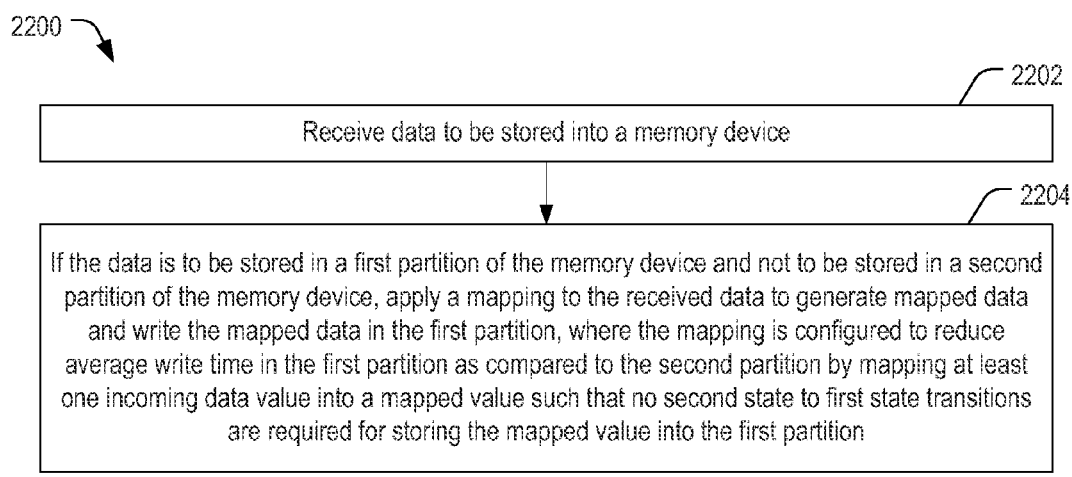
FIG. 22 is a diagram of a particular embodiment of a method of writing data that includes a mapping configured to reduce average write time to a non-volatile memory.

FIG. 22 illustrates a particular embodiment of a method 2200 of writing data that includes a mapping configured to reduce an average write time. The method 2200 may be performed in a memory device configured to write data to storage elements by performing at least one of a first operation on one or more first storage elements that are in a first state and a second operation on one or more second storage elements that are in a second state. The first operation changes the first state to the second state, and the second operation changes the second state to the first state. For example, the memory device may include a resistive random access memory (ReRAM). In a particular embodiment, the method 2200 may be performed by the data storage device 102 of FIG. 1, the data storage device 1702 of FIG. 17, the data storage device 1802 of FIG. 18, or the data storage device 1902 of FIG. 19.

Data to be stored into the memory device is received, at 2202. If the data is to be stored in a first partition of the memory device and not to be stored in a second partition of the memory device, a mapping is applied to the received data to generate mapped data and the mapped data is written in the first partition, at 2204. For example, the mapping may be applied by the mapping circuitry 1950 of FIG. 19 to data to be written to the first partition 1910 and not to data to be written to the second partition 1912. The mapping is configured to reduce average write time in the first partition as compared to the second partition by mapping at least one incoming data value into a mapped value such that no second state to first state transitions are used for storing the mapped value into the first partition. The first partition of the memory device may include a resistive random access memory (ReRAM).

Applying the mapping may include, in response to a first mapped value of the received data requiring a second state to first state transition and a second mapped value of the received data involving no second state to first state transitions, selecting the second mapped value. For example, the mapping may be applied by the mapping circuitry 150 of FIG. 1 and may include applying the first selection criterion.

The mapping may be a one-to-many mapping, such as a mapping where N>K. For example, applying the mapping may include matching multiple mapped data values to a particular received data value and, in response to all of the multiple mapped data values that are matched to the particular data value requiring a second state to first state transition, selecting one of the multiple mapped data values with a largest number of bits matching the first state as compared to the others of the multiple mapped data values.

In some implementations, the mapping of the received data to the mapped data depends on the states of the storage elements prior to the writing of the mapped data, such as described with respect to FIGS. 11-12. In other implementations, the mapping of the received data to the mapped data does not depend on the states of the storage elements prior to the writing of the mapped data, such as described with respect to FIGS. 13-16.

The reliability of a write operation (or alternatively, the probability of failure of a write operation) may be primarily dependent on the number of storage elements that change state when executing the write operation. Each change of state of a storage element introduces another opportunity for failure.

Writing random data to a memory may result in a 50% probability of a storage element changing state (e.g., via a set operation or a reset operation). Therefore, if the failure probability of each sub-operation (e.g., a set operation or a reset operation) is P, where P is a non-negative number that is not greater than 1, where P=0 indicates 0% failure probability and P=1 indicates 100% failure probability, then the probability of any storage element to be in error after a write operation (assuming the storage element was not in error before the write operation) is P/2. If a coding scheme is applied where the probability A of a storage element changing its state in a write operation is less than 0.5, then the probability of a storage element to fail in a single write operation is A*P (i.e., the product resulting from multiplying A and P together). Because A*P is less than P/2, the failure probability of a storage element is reduced as a result of the coding scheme, and the average reliability of the memory write operation is improved.

If the page size of data written to the memory is S storage elements, the probability of writing a page with zero errors is $(1-A*P)^S$.

Table 6 illustrates probabilities for writing a page of size 1 kilobyte (KB) (into 8,192 storage elements) with zero errors for different values of A and P.

TABLE 6

| | P | | |
| A | $1 \times 10^{-4}$ | $1 \times 10^{-5}$ | $1 \times 10^{-6}$ |
|---|---|---|---|
| 50% | 66.4% | 96.0% | 99.6% |
| 40% | 72.1% | 96.8% | 99.7% |
| 30% | 78.2% | 97.6% | 99.8% |
| 25% | 81.5% | 98.0% | 99.8% |
| 12.5% | 90.3% | 99.0% | 99.9% |

Table 7 illustrates probabilities for writing a page of size 2 KB (into 16,384 storage elements) with zero errors for different values of A and P.

TABLE 7

| | P | | |
|---|---|---|---|
| A | $1 \times 10^{-4}$ | $1 \times 10^{-5}$ | $1 \times 10^{-6}$ |
| 50% | 44.1% | 92.1% | 99.2% |
| 40% | 51.9% | 93.7% | 99.3% |
| 30% | 61.2% | 95.2% | 99.5% |
| 25% | 66.4% | 96.0% | 99.6% |
| 12.5% | 81.5% | 98.0% | 99.8% |

The A=50% row of Table 6 and Table 7 corresponds to random data without encoding. The other rows illustrate probabilities of performing a zero-error write operation for various values of storage element change probability A. The reliability improvement resulting from reductions in A can be substantial, especially with lower intrinsic storage element reliability illustrated by higher values of P (i.e., higher values of P, such as $P=1\times10^{-4}$, or a 1-in-10,000 probability of error, as compared to a lower value of P such as $P=1\times10^{-6}$, or a 1-in-1,000,000 probability of error).

Decision rules may be applied for mapping K data bits to be stored into N storage elements of a memory device. In a particular embodiment, the decision rules depend on the previous state of the N storage elements and depend on the value of the data bits to be stored, such as described with respect to FIGS. 2-10.

The average probability for a storage element changing its state in a single write operation for fully random data when using the example coding scheme illustrated in the transition diagrams of FIGS. 2-10 may be determined. The randomness of the data implies that each of the four possible values of the two data bits (e.g., the values 220-226 of FIGS. 2-10) is equally likely and that there is no correlation between data values in successive write operations.

The transition diagrams of FIGS. 2-10 are summarized in Table 8.

TABLE 8

| Previous State | Previous Data | New Data: 00 | 01 | 10 | 11 |
|---|---|---|---|---|---|
| 111 | 00 | 111 | 110 | 101 | 011 |
| 110 | 01 | 000 | 110 | 010 | 100 |
| 101 | 10 | 000 | 001 | 101 | 100 |
| 100 | 11 | 000 | 110 | 101 | 100 |
| 011 | 11 | 000 | 001 | 010 | 011 |
| 010 | 10 | 000 | 110 | 010 | 011 |
| 001 | 01 | 000 | 001 | 101 | 011 |
| 000 | 00 | 000 | 110 | 101 | 011 |

Where P(S) denotes the probability of a storage element to be in state S under steady state conditions, the following equations are implied by Table 8.

$$P(111)=\tfrac{1}{4}*P(111)\text{(note that this equation implies that } P(111)=0).$$

$$P(110)=\tfrac{1}{4}*\{P(111)+P(110)+P(100)+P(010)+P(000)\}$$

$$P(101)=\tfrac{1}{4}*\{P(111)+P(101)+P(100)+P(001)+P(000)\}$$

$$P(100)=\tfrac{1}{4}*\{P(110)+P(101)+P(100)\}$$

$$P(011)=\tfrac{1}{4}*\{P(111)+P(011)+P(010)+P(001)+P(000)\}$$

$$P(010)=\tfrac{1}{4}*\{P(110)+P(011)+P(010)\}$$

$$P(001)=\tfrac{1}{4}*\{P(101)+P(011)+P(001)\}$$

$$P(000)=\tfrac{1}{4}*\{P(110)+P(101)+P(100)+P(011)+P(010)+P(001)+P(000)\}$$

In addition, the probabilities also sum to one:

$$P(111)+P(110)+P(101)+P(100)+P(011)+P(010)+P(001)+P(000)=1$$

Solving the above equations provides the following probabilities of each of the eight possible states for the three-cell storage group of Table 8 (in a steady state condition that is independent of an initial state of the storage group).

$P(111)=0$
$P(110)=0.15$
$P(101)=0.15$
$P(100)=0.1$
$P(011)=0.15$
$P(010)=0.1$
$P(001)=0.1$
$P(000)=0.25$

If the group of three storage elements includes a left storage element, a center storage element, and a right storage element, P_left represents the probability of having a state change in the left storage element of the group of storage elements and can be calculated as:

$$P\_left=P(111)*\tfrac{1}{4}+P(110)*\tfrac{1}{2}+P(101)*\tfrac{1}{2}+P(100)*\tfrac{1}{4}+P(011)*0+P(010)*\tfrac{1}{4}+P(001)*\tfrac{1}{4}+P(000)*\tfrac{1}{2}=0.35=35\%.$$

The probability P_center of having a state change in the center storage element is given by:

$$P\_center=P(111)*\tfrac{1}{4}+P(110)*1/2+P(101)*0+P(100)*\tfrac{1}{4}+P(011)*1/2+P(010)*\tfrac{1}{4}+P(001)*\tfrac{1}{4}+P(000)*\tfrac{1}{2}=0.35=35\%.$$

The probability P_right of having a state change in the right storage element is given by:

$$P\_right=P(111)*\tfrac{1}{4}+P(110)*0+P(101)*1/2+P(100)*1/4+P(011)*1/2+P(010)*\tfrac{1}{4}+P(001)*\tfrac{1}{4}+P(000)*\tfrac{1}{2}=0.35=35\%.$$

The overall average probability of having a change in a storage element in a write operation is given as P_change:

$$P\_change=\tfrac{1}{3}*(P\_left+P\_center+P\_right)=0.35=35\%.$$

Therefore, in the coding scheme of Table 8, for a sub-operation intrinsic failure rate of P, the bit failure rate in a write operation is 0.35 P, representing an improvement over the P/2 failure rate associated with storing unencoded random data.

The encoding scheme of Table 8 is a non-optimal encoding scheme for reliability for the case of K=2 and N=3 and other encoding schemes for K=2, N=3 can provide higher reliability. For every N and K, there is "unused redundancy" scheme that improves reliability as compared to the unencoded random data case by not using N−K of the storage elements (so that these storage elements do not have state changes) and using the remaining K storage elements for direct (one-to-one) representation of the K data bits. This unused redundancy scheme improves the storage element change probability by a factor of K/N. The {K=2, N=3} example of this unused redundancy scheme provides an average storage element change probability A of 50%*2/3=33%, as compared to A=35% in the above example.

In addition to average storage element change probability, another factor that affects reliability is the endurance of the memory. The probability of state changes of a storage element determines not only the failure probability of the storage element per write operation but also the number of write operations the storage element can endure before becoming worn-out and functioning incorrectly. The larger the number of set and reset sub-operations a storage element experiences, the more the storage element becomes "worn out".

The unused redundancy scheme introduced above results in K of the storage elements remaining at 50% change probability while the other N−K storage elements go through no state changes. Even though the average over all storage elements is 50%*K/N, the changes are not uniformly distributed across all storage elements. As a result, the K storage elements that experience the state changes wear faster than the N−K storage elements that experience no state changes and reach their end-of-life at the same rate as if no encoding was performed. Even though the unused redundancy scheme improves the average failure rate, the unused redundancy scheme does not improve the endurance of the memory. An "optimal" encoding scheme can be defined as providing a minimum theoretically possible average reliability in which storage element state changes are uniformly (or close to uniformly) distributed across all N storage elements, thus providing both failure probability improvement and endurance improvement.

The coding scheme defined by the transitions table illustrated in Table 9 provides enhanced reliability as compared to the coding scheme of Table 8.

TABLE 9

| Previous State | Previous Data | New Data: | | | |
|---|---|---|---|---|---|
| | | 00 | 01 | 10 | 11 |
| 111 | 00 | 111 | 110 | 101 | 011 |
| 110 | 01 | 111 | 110 | 010 | 100 |
| 101 | 10 | 111 | 001 | 101 | 100 |
| 100 | 11 | 000 | 110 | 101 | 100 |
| 011 | 11 | 111 | 001 | 010 | 011 |
| 010 | 10 | 000 | 110 | 010 | 011 |
| 001 | 01 | 000 | 001 | 101 | 011 |
| 000 | 00 | 000 | 001 | 010 | 100 |

The encoding scheme of Table 9 implies the following equations:

$$P(111)=¼*\{P(111)+P(110)+P(101)+P(011)\}$$

$$P(110)=¼*\{P(111)+P(110)+P(100)+P(010)\}$$

$$P(101)=¼*\{P(111)+P(101)+P(100)+P(001)\}$$

$$P(100)=¼*\{P(110)+P(101)+P(100)+P(000)\}$$

$$P(011)=¼*\{P(111)+P(011)+P(010)+P(001)\}$$

$$P(010)=¼*\{P(110)+P(011)+P(010)+P(000)\}$$

$$P(001)=¼*\{P(101)+P(011)+P(001)+P(000)\}$$

$$P(000)=¼*\{P(100)+P(010)+P(001)+P(000)\}$$

In addition, the sum of the probabilities is one:

$$P(111)+P(110)+P(101)+P(100)+P(011)+P(010)+P(001)+P(000)=1$$

Solving the above equations results in all states having equal probability:
P(111)=0.125
P(110)=0.125
P(101)=0.125
P(100)=0.125
P(011)=0.125
P(010)=0.125
P(001)=0.125
P(000)=0.125

The probability P_left of having a change in the left storage element of the group of storage elements is:

$$P\_left=P(111)*¼+P(110)*¼+P(101)*¼+P(100)*¼+\\P(011)*¼+P(010)*¼+P(001)*¼+\\P(000)*¼=0.25=25\%$$

The probability P_center of having a change in the center storage element of the group of storage elements is:

$$P\_center=P(111)*¼+P(110)*¼+P(101)*¼+\\P(100)*¼+P(011)*¼+P(010)*¼+P(001)*¼+\\P(000)*¼=0.25=25\%$$

The probability P_right of having a change in the right storage element of the group of storage elements is:

$$P\_right=P(111)*¼+P(110)*¼+P(101)*¼+\\P(100)*¼+P(011)*¼+P(010)*¼+P(001)*¼+\\P(000)*¼=0.25=25\%$$

The overall average probability P_change of having a change in a bit in a write operation is:

$$P\_change=⅓*(P\_left+P\_center+P\_right)=0.25=25\%$$

In the coding scheme of Table 9, for a sub-operation intrinsic failure probability of P, the bit failure probability in a write operation is 0.25 P. A bit failure probability of 0.25 P provides improvement over the 0.35 P probability provided by the coding scheme of Table 8 and is one-half the 0.5 P bit failure probability of storing unencoded random data.

A lower bound on the probability of bit changes for a general {K, N} coding scheme can be computed. A transitions table of a {K, N} scheme has $2^K$ columns and $2^N$ rows. In each row there are at least $(2^K-1)$ bit changes, as only one entry in a row can stay without change and each of the other entries in the row must have at least one bit change. Therefore, the sum of the number of bit changes across the entire transitions table is at least $(2^K-1)*2N$. Averaging over $2^N*2K$ table entries and over N storage elements results in a probability of $(2^K-1)/(2K*N)$ for a storage element changing its state during a write operation.

The coding scheme of Table 9 may be classified as an "optimal" reliability scheme for K=2 and N=3. The average change probability of 25% equals the theoretical lower bound of $(2^K-1)/(2K*N)$ of 0.25 for K=2 and N=3. The coding scheme of Table 9 is identified by the following characteristics:

1. Each transition from any state to any different state changes only one bit (and therefore causes only one storage element change).

2. There is full symmetry between the states, in the sense that each state appears the same number of times in the transition table.

3. Each data value is represented by two states that are complements of each other (for example, "001" and "110" both correspond to data bits "01").

This type of optimal coding scheme having these characteristics may not be extended to other schemes with N=K+1 when K>2. The above argument for deriving the lower bound assumes each transition in the table has at most one bit change. This assumption can only be satisfied if $2^K-1<=N$, which for N=K+1 is only true for K=1 and K=2. For higher values of K, there may be no coding scheme of the form N=K+1 that reaches this lower bound.

For N=K+1 and K>2 a tighter lower bound may be derived that takes into account that one entry in a row will have zero bit changes, N entries of a row will have a single bit change and the rest will have at least two bit changes. The resulting lower bound is $(2^K-N-2)/(2K*N)$.

Similarly, for N=K+1 and K>4 a still tighter lower bound may be derived that is based on also taking into account that a row must contain entries with three bit changes, the resulting lower bound being $(3*2^{K+1}N^2-3*N-6)/(2^{K+1}*N)$.

Table 10 includes examples for various values of K and N of lower bounds on bit change probability.

TABLE 10

| Coding Scheme | | Lower Bound on Bit Change |
|---|---|---|
| K | N | Probability |
| 2 | 3 | 25.000% |
| 3 | 4 | 31.250% |
| 4 | 5 | 31.250% |
| 5 | 6 | 34.375% |
| 6 | 7 | 34.375% |

For coding schemes with K=1 and arbitrary N, the lower bound on the change probability is $1/(2*N)$ and the bound can be achieved for every N. Table 11 shows the resulting achievable storage element change probabilities for several values of N.

TABLE 11

| Coding Scheme | | Bit Change |
|---|---|---|
| K | N | Probability |
| 1 | 2 | 25.0% |
| 1 | 3 | 16.7% |
| 1 | 4 | 12.5% |
| 1 | 5 | 10.0% |
| 1 | 6 | 8.3% |
| 1 | 7 | 7.1% |
| 1 | 8 | 6.3% |
| 1 | 9 | 5.6% |

Table 11 illustrates improved reliability in the form of lower bit change probability than the reliability illustrated in Table 10 for the same value of N. However, because the coding schemes of Table 11 are for smaller values of K than the coding schemes of Table 10, the improved reliability of Table 11 is accompanied by increased redundancy. For example, for a change probability of 25%, a {K=1, N=2} coding scheme may be used (Table 11), or a {K=2, N=3} coding scheme may be used (Table 10). The {K=1, N=2} coding scheme has 50% redundancy, and the {K=2, N=3} coding scheme has 33% redundancy.

Table 12 is a transitions table illustrating a particular coding scheme for K=1 and N=2.

TABLE 12

| Previous State | Previous Data | New Data | |
|---|---|---|---|
| | | 0 | 1 |
| 11 | 0 | 11 | 10 |
| 10 | 1 | 00 | 10 |
| 01 | 1 | 11 | 01 |
| 00 | 0 | 00 | 01 |

In the coding scheme of Table 12, the change probability for each bit of the two-bit state is 25% and the overall average change probability is 25%. The coding scheme of Table 12 may therefore be considered an optimal uniformly distributed scheme. In particular, the coding scheme of Table 12 is "optimal" because the average change probability equals the theoretical lower bound (25% for K=1, N=2) and is "uniformly distributed" because, when storing each two-bit state into a pair of storage elements, the average number of state changes of one of the storage elements over multiple write operations matches the average number of state changes of the other one of the storage elements over the multiple write operations. Thus, each storage element experiences substantially equal wear.

Table 13 is a transitions table illustrating a particular coding scheme for K=1 and N=4.

TABLE 13

| Previous State | Previous Data | New Data | |
|---|---|---|---|
| | | 0 | 1 |
| 1111 | 0 | 1111 | 1110 |
| 1110 | 1 | 1010 | 1110 |
| 1101 | 0 | 1101 | 1111 |
| 1100 | 1 | 1101 | 1100 |
| 1011 | 0 | 1011 | 1001 |
| 1010 | 1 | 0010 | 1010 |
| 1001 | 0 | 1001 | 0001 |
| 1000 | 1 | 1100 | 1000 |
| 0111 | 0 | 0111 | 0011 |
| 0110 | 1 | 0100 | 0110 |
| 0101 | 0 | 0101 | 0111 |
| 0100 | 1 | 0101 | 0100 |
| 0011 | 0 | 0011 | 1011 |
| 0010 | 1 | 0110 | 0110 |
| 0001 | 0 | 0001 | 0000 |
| 0000 | 1 | 1000 | 0000 |

The change probability of the coding scheme of Table 13 is 12.5% for each of the bits of the four-bit states and therefore the overall average change probability is 12.5%. The coding scheme of Table 13 may be considered an optimal uniformly distributed scheme.

Figure 23:
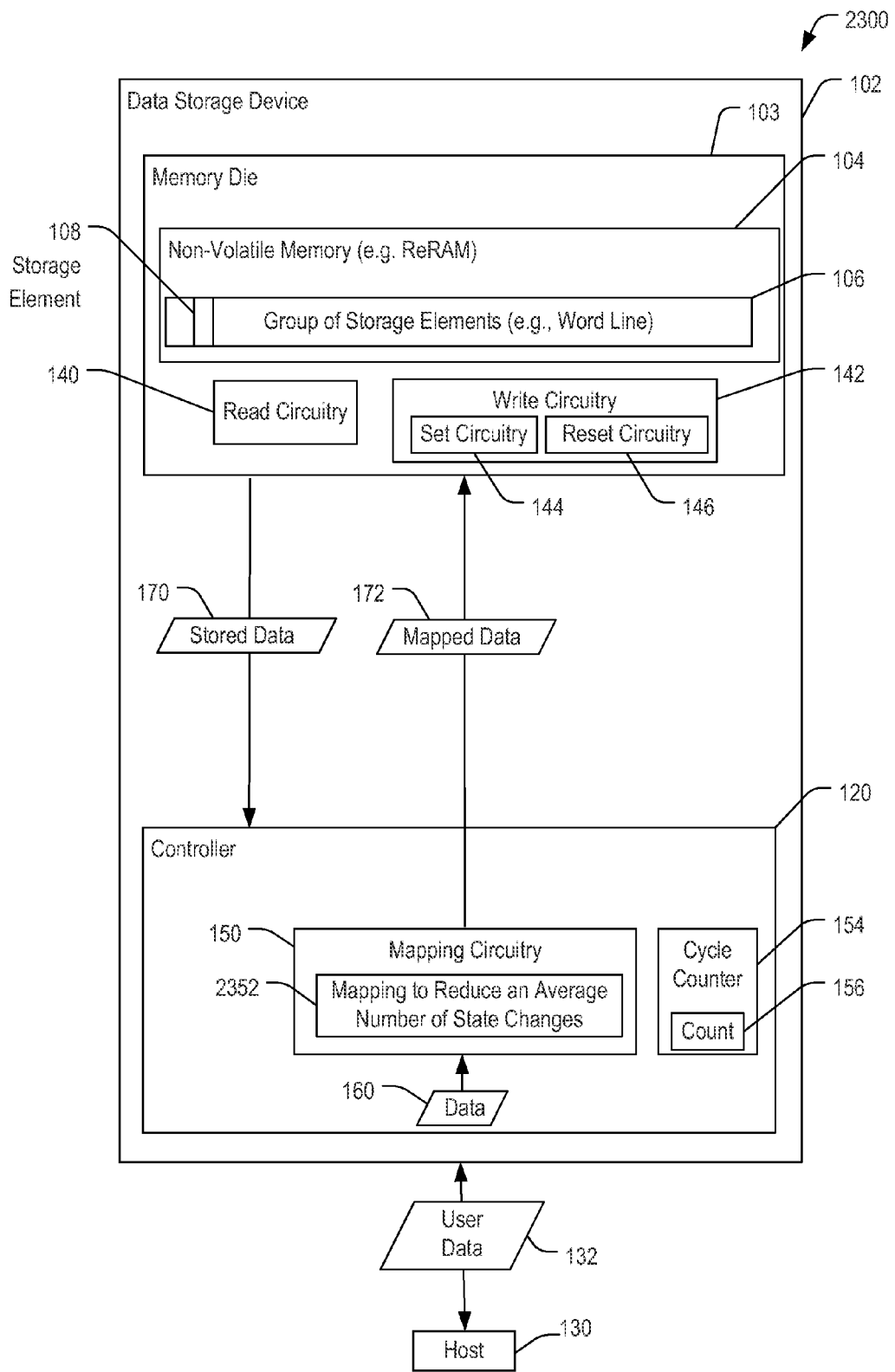
FIG. 23 is a block diagram of a particular illustrative embodiment of a system including a data storage device configured to apply a mapping to increase an average reliability of a non-volatile memory.

FIG. 23 illustrates an embodiment of a system 2300 that includes the data storage device 102 of FIG. 1 coupled to the host device 130, with the mapping circuitry 150 configured to increase an average reliability of the memory device including the non-volatile memory 104.

For example, the mapping circuitry 150 may include a mapping 2352 that is configured to reduce an average number of state changes of storage elements in the non-volatile memory 104 per write operation. The mapping 2352 may therefore increase an average reliability of the non-volatile memory 104 by reducing the average number of state changes. The "average reliability" of the non-volatile memory 104 is an average across multiple groups of storage elements in the non-volatile memory 104 and/or across multiple such memories. The "average number of state changes" of a storage element in a group of storage elements, such as the group 108, is an average count of state changes per write operation for that storage element for multiple write operations performed on the group. For example, the mapping 2352 may be a one-to-many mapping corresponding to the coding schemes of Table 9, Table 12, or Table 13, as illustrative, non-limiting examples.

The coding schemes described with respect to Table 9, Table 12, and Table 13 may correspond to a first embodiment that may be implemented by reading a state of storage elements before writing a new state to the storage elements (e.g., in a read-before-write (RBW) stage). The storage elements may be read prior to writing new data because a determination of the next state of the storage elements depends upon both the new data bits and the previous state.

In some implementations, a RBW stage may be avoided, such as to increase write speed. In such implementations, the coding schemes of Table 9, Table 12, and Table 13 cannot be used if there is no knowledge of the previous state of the storage elements without reading the storage elements because the coding schemes of Table 9, Table 12, and Table 13 do not allow determination of the next state according to the transitions table without knowing the previous state.

In a second embodiment, dependency of a coding scheme on the previous state of storage elements to determine a next state of the storage elements may be eliminated by allocating write operations into fixed-length cycles composed of multiple stages. Such coding schemes may include transition rules that are different for different stages. The next state of a group of storage elements may therefore be decided based on the stage number in the cycle and the new data bits and is not based on the previous state of the storage elements.

TABLE 14

| Previous State | Previous Data | New Data-Stage 0 | | New Data-Stage 1 | | New Data-Stage 2 | | New Data-Stage 3 | |
|---|---|---|---|---|---|---|---|---|---|
| | | 0 | 1 | 0 | 1 | 0 | 1 | 0 | 1 |
| 11 | | | | | | | | | |
| 10 | 1 | 00 | 01 | | | | | 00 | 10 |
| 01 | 1 | | | 00 | 01 | 00 | 10 | | |
| 00 | 0 | 00 | 01 | 00 | 01 | 00 | 10 | 00 | 10 |

In the encoding scheme of Table 14, transitions are equally probable even though not all states are equally probable (e.g., state "11" is excluded). The storage element change probability of Table 14 is 37.5%, and the changes are uniformly distributed across the storage elements.

Table 15 illustrates a coding scheme having a cycle length of 8 and a change probability of 31.25% that is uniformly distributed.

TABLE 15

| Prior State | Prior Data | New Data-Stage 0 | | New Data-Stage 1 | | New Data-Stage 2 | | New Data-Stage 3 | | New Data-Stage 4 | | New Data-Stage 5 | | New Data-Stage 6 | | New Data-Stage 7 | |
|---|---|---|---|---|---|---|---|---|---|---|---|---|---|---|---|---|---|
| | | 0 | 1 | 0 | 1 | 0 | 1 | 0 | 1 | 0 | 1 | 0 | 1 | 0 | 1 | 0 | 1 |
| 11 | | | | | | | | | | | | | | | | | | |
| 10 | 1 | 00 | 01 | | | | | | | | | 00 | 10 | 00 | 10 | 00 | 10 |
| 01 | 1 | | | 00 | 01 | 00 | 01 | 00 | 01 | 00 | 10 | | | | | | |
| 00 | 0 | 00 | 01 | 00 | 01 | 00 | 01 | 00 | 01 | 00 | 10 | 00 | 10 | 00 | 10 | 00 | 10 |

Figures 24, 25:
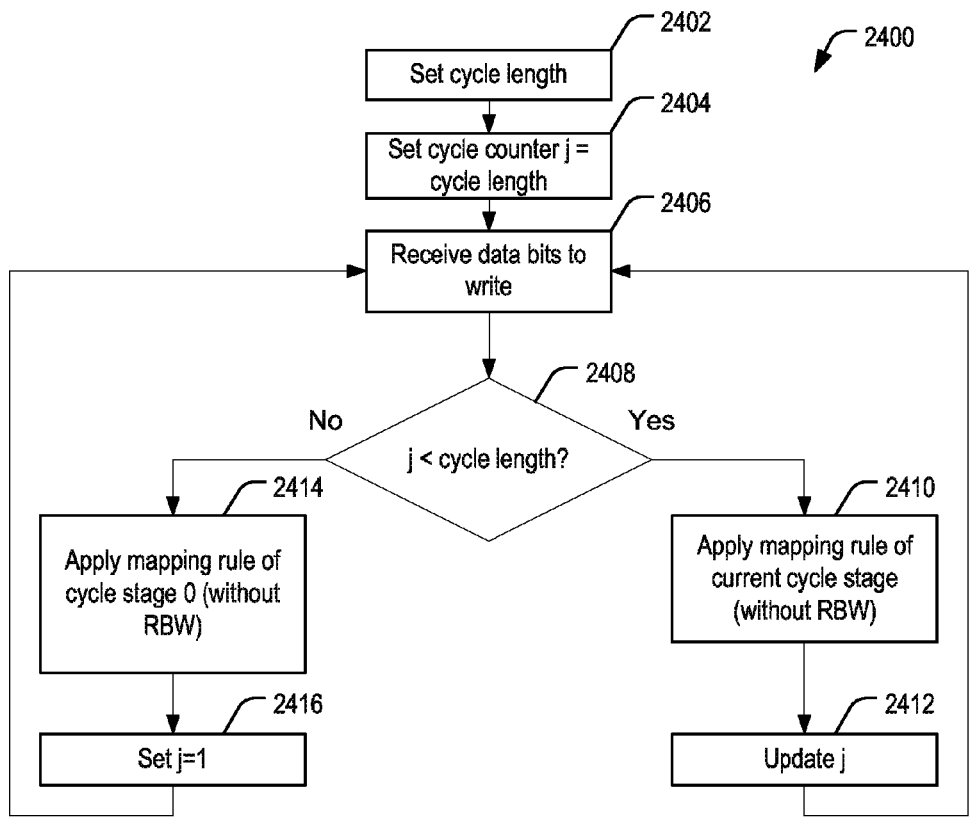
FIG. 24 is a flow chart of a particular embodiment of a method of writing data that may be performed by the data storage device of FIG. 23.
FIG. 25 is a table illustrating a particular embodiment of a mapping that may be applied by the data storage device of FIG. 23.

FIG. 24 is a flowchart of an illustrative example of a method 2400 of writing data to a memory, such as the non-volatile memory 104, according to the second embodiment (where the next state of storage elements is not based on the previous state of the storage elements). A cycle length may be set, at 2402. The cycle length may correspond to a number of stages in a cycle of write operations, and a mapping may include different mapping rules corresponding to different stages of the cycle. The mapping may be configured to reduce an average number of state changes of the storage elements per write operation. A cycle counter "j" may be set to an initial value, such as equal to the cycle length, that indicates a current stage in the cycle of write operations, at 2404.

Data bits to write are received, at 2406, and a determination is made whether the cycle count "j" is less than the cycle length, at 2408. When the cycle count "j" is less than the cycle length, a mapping rule corresponding to the current stage of the cycle is applied (without performing a read before write operation), at 2410, and j is updated (e.g., j=j+1), at 2412. Otherwise, in response to determining that the cycle count "j" is not less than the cycle length, the mapping rule of the first stage of the cycle (e.g., stage 0) is applied (without performing a read before write operation), at 2414, and j is set to 1, at 2416.

Table 14 is a transitions table for an encoding scheme for K=1 and N=2. The encoding scheme of Table 14 uses a cycle of length 4 and uses mapping rules that are dependent on the stage number in the cycle but that are not dependent on previous data bits values.

A coding scheme such as illustrated in Table 14 and Table 15 may be generalized to any cycle length that is a power of two. If the cycle length is $L=2^M$ ($M>=1$), the change probability is $(L+2)/(4*L)$. The change probability (Pchange) results for various values of cycle length L are shown in Table 16.

TABLE 16

| L | Pchange |
|---|---|
| 2 | 50.00% |
| 4 | 37.50% |
| 8 | 31.25% |
| 16 | 28.13% |
| 32 | 26.56% |
| 64 | 25.78% |
| 128 | 25.39% |
| 256 | 25.20% |
| 512 | 25.10% |
| 1024 | 25.05% |

Table 16 indicates that, for a large number of stages, the change probability tends to 25%, which is the theoretical lower bound for {K=1, N=2} coding schemes. One advantage of a coding scheme such as in Table 14 or Table 15 is that the mapping rules for deciding the next state can be implemented with reduced complexity as compared to an arbitrary coding scheme. For example, considering the stage number as a counter with M bits (including leading zeroes), the mapping rules can be implemented as:

a) In every stage in which the most significant bit (MSB) of the stage number is "0", select state "00" for data "0" and select state "01" for data "1".

b) In every stage in which the MSB of the stage number is "1", select state "00" for data "0" and select state "10" for data "1".

FIG. 25 illustrates a transitions table 2500 for a coding scheme where K=1 and N=4. In the coding scheme of FIG. 25, the cycle length is four. The mapping rules are dependent on the stage number in the cycle and are not dependent on the previous state. The mapping rules may be implemented as:

a) In the first stage, select state "1111" for data "0" and select state "1110" for data "1".

b) In the second stage, select state "1100" for data "0" and select state "1110" for data "1".

c) In the third stage, select state "1100" for data "0" and select state "1000" for data "1".

d) In the fourth stage, select state "0000" for data "0" and select state "1000" for data "1".

The following observations may be made regarding a group of four storage elements that store data according to the 4-bit states of the transitions table 2500:

a) The probability of making a change in the left storage element of the group of storage elements is =¼*(50%+0%+0%+50%)=25%.

b) The probability of making a change in the middle-left storage element of the group of storage elements is =¼*(100%+0%+50%+50%)=50%.

c) The probability of making a change in the middle-right storage element of the group of storage elements is =¼*(100%+50%+50%+0%)=50%.

d) The probability of making a change in the right storage element of the group of storage elements is =¼*(50%+50%+0%+0%)=25%.

The overall probability of making a change in a storage element at a write operation is ¼*(25%+50%+50%+25%)=37.5%, above the lower bound of 12.5% for K=1 and N=4.

Note that the storage element changes are not uniformly distributed, as two of the storage elements in a group have a change probability of 50%. Although some of the cycle stages of the coding scheme of FIG. 25 use only set but not reset sub-operations and provide a resulting increase in write speed, the coding scheme of FIG. 25 is not optimal in terms of reliability.

FIG. 26 illustrates a transitions table 2600 for a coding scheme with a cycle length of 8 and a change probability of 18.75% with changes uniformly distributed across the storage elements.

Figure 27:
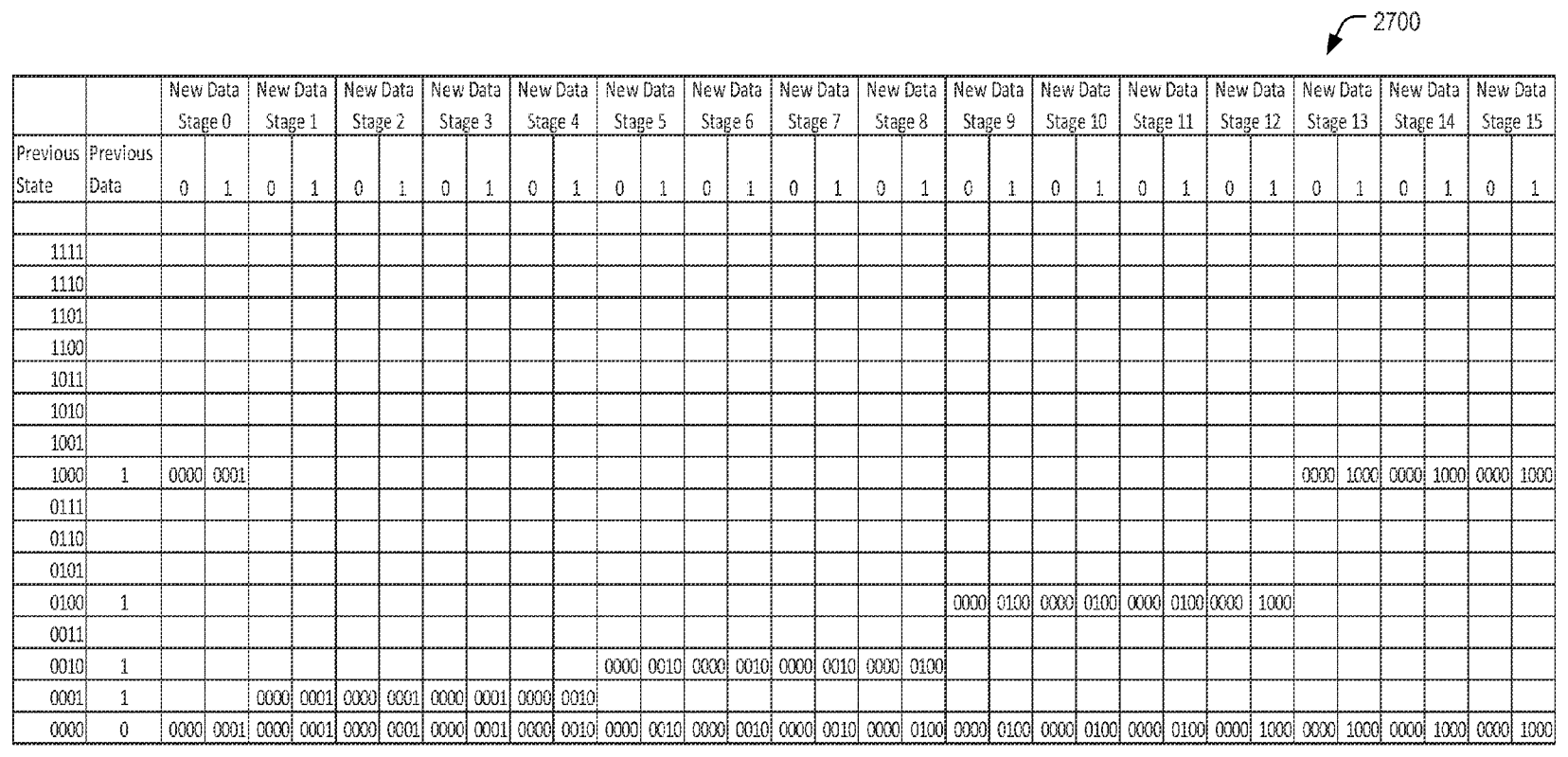

FIG. 27 illustrates a transitions table 2700 for a coding scheme with a cycle length of 16. The resulting change probability is 15.625% and the distribution of changes across the storage elements is uniform.

Coding schemes such as illustrated in FIGS. 25-27 may be generalized to any cycle length that is a power of two. If the cycle length is $L=2^M (M\geq 2)$ then the change probability is $(L+4)/(8*L)$. Table 17 illustrates change probabilities (Pchange) for various values of cycle length L.

TABLE 17

| L | Pchange |
|---|---|
| 4 | 25.000% |
| 8 | 18.750% |
| 16 | 15.625% |
| 32 | 14.063% |
| 64 | 13.281% |
| 128 | 12.891% |
| 256 | 12.695% |
| 512 | 12.598% |
| 1024 | 12.549% |

As shown in Table 17, as the number of stages increases, the change probability tends to 12.5%, which is the theoretical lower bound for {K=1, N=4}. One advantage of such a coding scheme is that the rules for deciding the next state may be implemented with reduced complexity as compared to an arbitrary coding scheme. Representing the stage number as a counter with M bits including leading zeroes, the mapping rules may be expressed as:

a) In every stage in which the two most significant bits (MSBs) of the stage number are "00", select state "0000" for data "0" and select state "0001" for data "1".

b) In every stage in which the MSBs of the stage number are "01", select state "0000" for data "0" and select state "0010" for data "1".

c) In every stage in which the MSBs of the stage number are "10", select state "0000" for data "0" and select state "0100" for data "1".

d) In every stage in which the MSBs of the stage number are "11", select state "0000" for data "0" and select state "1000" for data "1".

The above scheme can be further generalized for any case of K=1 and arbitrary N and L (when L is a power of two). The change probability is then given by $(N+L)/(2*N*L)$.

Although coding schemes to improve reliability have been described with respect to an implementation using one-bit-per-storage element (SLC) memory devices, such coding schemes may be adjusted to be implemented using multi-bit-per-storage element (MLC) memory devices.

A group of N MLC storage elements each storing B bits per storage element can function as a group of N*B SLC storage elements. Methods described herein for mapping data to be stored into a group of N*B SLC storage elements may alternatively be applied to a group of N MLC storage elements (storing B bits per storage element) to reduce an average number of state changes of the storage elements per write operation.

In an MLC implementation, the change probability of a storage element is not necessarily equal to the change probability of a bit (as is the case with SLC). Minimizing the change probability of a MLC storage element includes minimizing the probability that any bit of the MLC storage element changes its value. Therefore, the assignment of bits to storage elements may be selected to achieve reduced probability that any bit stored in a MLC storage element changes its state per write operation.

A mapping to improve reliability, either based on the prior state and the new data, such as described with respect to Tables 8-13, or based on the prior state and the cycle count, such as described with respect to Tables 14-17 and FIGS. 25-27, may be used with memory devices that write large pages at a time. For example, a page may have a size of 1 kilobyte (Kbyte) and a {K=1, N=4} mapping may be implemented using 2048 groups per page. From a host device perspective, the number of data bits stored in a page is 256 bytes because each of the 2048 groups contributes a single data bit. In this case, there might be a difference between the logical address of bits within the page and the physical address of the bits. For example, if the memory supports reading of individual bytes from a memory buffer and if a host device requests to read the last data byte in the page (logical byte 255 from the host point of view), the bytes that are to be physically read are the last four bytes in the physical page (e.g., physical bytes 1020 to 1023). The reading circuitry (e.g., read circuitry 140 of FIG. 23) may perform logical-to-physical conversions (according to the N and K values) to access the correct data. As an alternative, a memory device may be designed to implement a policy of storage elements allocation in which the first K storage elements of all groups are located sequentially starting from the beginning of the page, and the additional (N−K) storage elements are allocated for each group at the end of the page. With this policy, the translation of logical bit address to physical bit address is straight-forward, and the reading circuitry matches the subgroups of (N−K) storage elements to their corresponding K-storage element subgroups at write time and at read time.

Methods of the present disclosure that apply a mapping that reduces the average number of state changes of storage elements per write operation can be implemented in a memory device, such as in the mapping circuitry 1750 of FIG. 17, where the controller 1720 may operate independently of the presence or absence of the mapping. Methods of the present disclosure that apply a mapping that reduces the average number of state changes of storage elements per write operation can be implemented in a controller of the memory device, such as in the mapping circuitry 150 of FIG. 23, in which case the non-volatile memory 104 may operate independently of the presence or absence of the mapping. Methods of the present disclosure that apply a mapping that reduces the average number of state changes of storage elements per write operation can be implemented via cooperation of a controller and the memory device, such as in the mapping circuitry 1850 and 1851 of FIG. 18. When implementing a scheme that includes RBW, latency may be reduced by implementing the mapping in the memory, such as illustrated with respect to FIG. 17, as compared to transferring read data to the controller and performing the mapping at the controller.

Implementations where a mapping is based on the prior state of storage elements and the new data, such as described with respect to Tables 8-13, may avoid storing metadata such as cycle count. Implementations where a mapping is based on the new data and the cycle count, such as described with respect to Tables 14-17 and FIGS. 25-27, may track a cycle count that indicates a stage number of a cycle of write operations. There are several possibilities regarding the stage number in the cycle, including:

A. No stage number is used and the mapping is based on the prior state and the new data.

B. The mapping is based on the stage number in a cycle, and the stage number is retrieved from the memory together with the previous data bits without incurring a time penalty. For example, if a particular memory that is used requires RBW, a cycle count may be stored in the same page as the data bits and read as part of the RBW, incurring no additional time penalty to retrieve or to store the cycle count.

C. The mapping is based on the stage number in a cycle, and the stage number is not retrieved from the memory without incurring a time penalty. This is the case if no RBW is otherwise performed. Several options may be available in such implementations:

1. The stage number is read from the memory for each write command, incurring additional latency to read the stage number. In this case, only a few bits containing the stage number may be read rather than reading an entire page of data. In some memory types, reading a small amount of data is performed faster than reading a full page so the additional latency may be comparatively small.

2. The stage number is maintained by the controller (e.g., using the cycle counter 154 of FIG. 23). The controller may maintain a table of current stage number for pages that are written using mapped data and may notify the memory device which stage number applies for each write command. As an example, the mapping circuitry 1850 of FIG. 18 may maintain stage numbers and may send the stage number and data to the mapping circuitry 1851 so that the mapping circuitry 1851 can select a next state based on the stage number. The stage number may be transferred to the memory as an additional parameter to a write command, as a prefix before a write command, the prefix identifying the stage number, or by using different operation codes (opcodes) for write commands at different stages of the cycle, as illustrative examples. As an alternative implementation, the controller may perform the mapping of the data values to states (and from states to data values during read operations) and may send the mapped data, such as the mapped data 172 of FIG. 23, to the memory using standard write commands. In this case, the memory may not be "aware" of the use of mapped data and may perform standard read and write commands.

Some implementations of the disclosed systems and methods may introduce reduced device capacity while providing improved reliability. A memory device manufacturer may provide a device that is fully pre-configured to use one or more of the methods of the present disclosure and that provides improved reliability as compared to other devices using the same memory technology (the other devices not using the methods of the present disclosure). As another example, the manufacturer may provide a device that can be configured by the user to use one or more of the methods of the present disclosure to improve reliability. Alternatively, the manufacturer may provide a device in which a portion of the storage elements operates without using one or more of the methods of the present disclosure and another portion of the storage elements uses one or more of the methods of the present disclosure. For example, the device may be a multiple-partition device in which one partition provides improved reliability, such as the first partition 1910 of FIG. 19, while other partitions may provide larger exported capacity, such as the second partition 1912 of FIG. 19. Alternatively, the user may be given the option to configure a partition to either use or not use one or more of the methods of the present disclosure, and optionally also to configure the partition size. Alternatively, the user may be given the option to select, for each write command, whether or not the device should use one or more of the methods of the present disclosure (and may also specify whether to use the methods in each read operation if the memory is not configured to track which pages store mapped data). In such case, user software code executing in the host device connected to the storage device notifies the storage device whether a mapping should be performed for any write operation. The notification may performed, for example, by using different opcodes for write with mapping and for write without mapping, by having a Boolean flag parameter in the write commands indicating whether mapping should be performed, or by implementing a global flag in the memory device that is set and reset by the host software and indicates whether mapping should be performed when performing a write operation (without having to indicate this separately for each write command).

Various use cases illustrate examples where reliable write operation is advantageous and a full length of a memory page can be provided for each write operation even though stored data is smaller than a page size.

A first example of such a use case is to provide a high reliability partition for a host device to store critical data that should not be lost. For example, such data may include data associated with the operating system state or critical data of an application running on the host device.

A second example is when memory management firmware (e.g., a flash management module) managing the internals of a storage device handles its internal control tables. Such tables might be updated frequently, creating a reliability risk with data that may be critical for the correct operation of the storage device. Such tables typically contain entries that are smaller than a page. If a table containing 512-byte entries is stored in a memory that uses 2 KB pages, one or more of the methods of the present disclosure may be used with memory blocks that contain the tables. For example, a K=1 and N=4 scheme may be used that consumes a full page for each table entry but achieves improved reliability.

Figure 28:
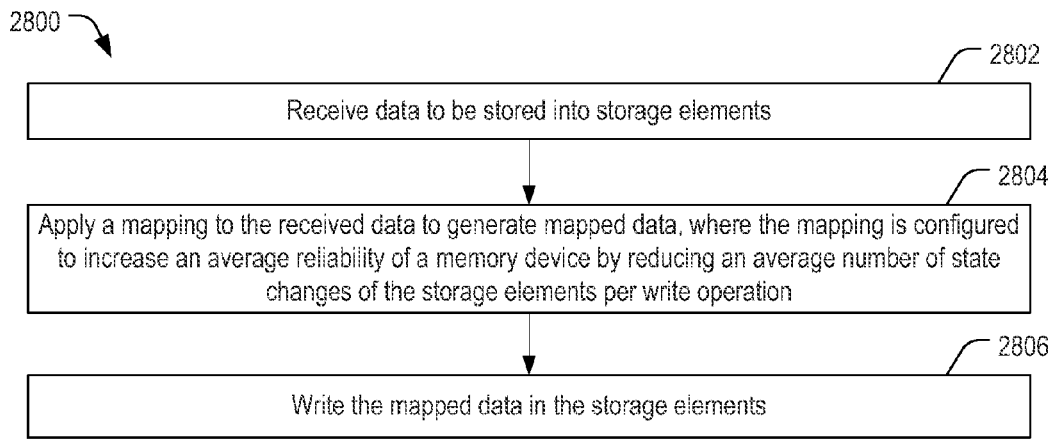
FIG. 28 is a flowchart of a particular embodiment of a method of writing data that includes a mapping configured to increase an average reliability of a memory device.

FIG. 28 illustrates a particular embodiment of a method 2800 that may be performed in a memory device configured to write data to storage elements, such as in the data storage device 102 of FIG. 23. For example, the memory device may include a resistive random access memory (ReRAM). The memory device is configured to write a first value of the data to one or more first storage elements that are in a first state by causing a first state transition of the one or more first storage elements from the first state to a second state, such as by performing a "set" operation in the non-volatile memory 104 of FIG. 23. The memory device is further configured to write a second value of the data to one or more second storage elements that are in the second state by causing a second state transition of the one or more second storage elements from the second state to the first state, such as by performing a "reset" operation in the non-volatile memory 104 of FIG. 23.

The method 2800 includes receiving data to be stored into the storage elements, at 2802. For example, the data may be the data 160 received at the mapping circuitry 150 of FIG. 23.

A mapping is applied to the received data to generate mapped data, at 2804. For example, the mapping 2352 may be applied by the mapping circuitry 150 of FIG. 23. The mapped data is stored into the storage elements, at 2806.

The mapping is configured to increase an average reliability of the memory device by reducing an average number of state changes of the storage elements per write operation. The average reliability of the memory device is determined over multiple groups of storage elements in a device and/or over multiple devices. The average number of state changes of the storage elements per write operation is determined over multiple write operations of a same group of storage elements. The mapping may be a one-to-many mapping and may depend on the states of the storage elements prior to the writing of the mapped data, such as described with respect to Tables 9-13.

The mapping may be further configured to increase the average reliability by generating mapped values that result in a uniform average number of state changes per write operation among the storage elements. As used herein, "uniform average number of state changes" includes mappings where the average number of state changes per write operation for each storage element equals the average number of state changes per write operation for each other storage element. In some implementations, "uniform average number of state changes" also includes "almost-uniform" mappings where a difference in each storage element's average number of state changes per write operation as compared to each other storage element's average number of state changes per write operation is not greater than a threshold percentage, such as 10%. For example, if the threshold percentage is 10%, a mapping where a first storage element of a group has a highest average number of state changes per write operation "X" of the group and a second storage element has a lowest average number of state changes per write operation "Y" of the group would be an almost-uniform mapping if Y is greater or equal to 0.9*X.

Figure 29:
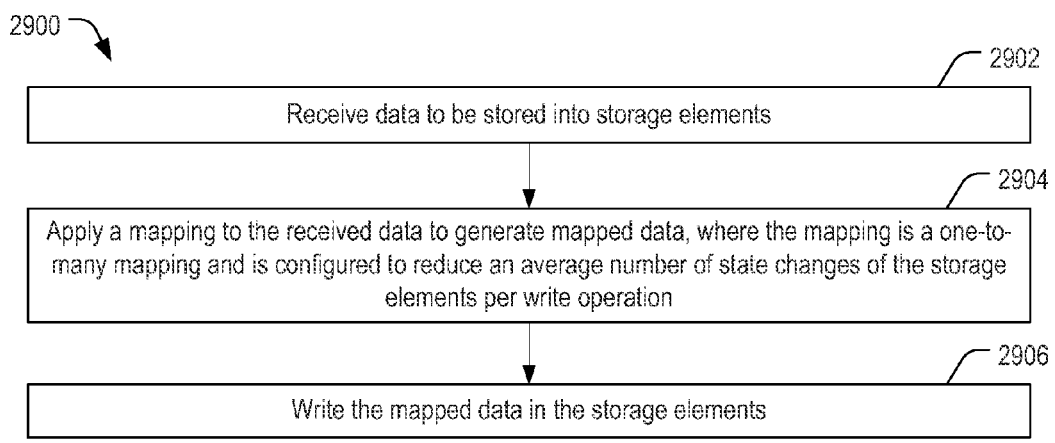
FIG. 29 is a flowchart of a particular embodiment of a method of writing data that includes a one-to-many mapping configured to reduce an average number of state changes of storage elements per write operation.

FIG. 29 illustrates a particular embodiment of a method 2900 that may be performed in a memory device configured to write data to storage elements, such as in the data storage device 102 of FIG. 23. For example, the memory device may include a resistive random access memory (ReRAM). The memory device is configured to write a first value of the data to one or more first storage elements that are in a first state by causing a first state transition of the one or more first storage elements from the first state to a second state. For example, a "set" operation may be performed in the non-volatile memory 104 of FIG. 23. The memory device is further configured to write a second value of the data to one or more second storage elements that are in the second state by causing a second state transition of the one or more second storage elements from the second state to the first state, such as by performing a "reset" operation in the non-volatile memory 104 of FIG. 23.

The method 2900 includes receiving data to be stored into the storage elements, at 2902. For example, the data may be the data 160 received at the mapping circuitry 150 of FIG. 23.

A mapping is applied to the received data to generate mapped data, at 2904. The mapping is a one-to-many mapping and is configured to reduce an average number of state changes of the storage elements per write operation. States of the storage elements prior to the writing of the mapped data may be determined and the mapping of the received data to the mapped data may depend on the determined states. For example, the mapping 2352 may correspond to one or more mappings described with respect to Tables 9-13 and may be applied by the mapping circuitry 150 of FIG. 23. The mapped data is stored into the storage elements, at 2906.

The mapping may be further configured to generate a uniform average number of state changes per write operation among the storage elements. In some embodiments, a "uniform average number of state changes" includes a "near-uniform" average number of state changes where a difference between a highest and lowest average number of state changes per write operation among a group of storage elements is within a threshold percentage, such as 10%, as an illustrative, non-limiting example.

By reducing an average number of state changes of the storage elements per write operation, a probability of error due to failure of a storage element to change state is reduced. As a result, a reliability of the memory device is improved.

Figure 30:
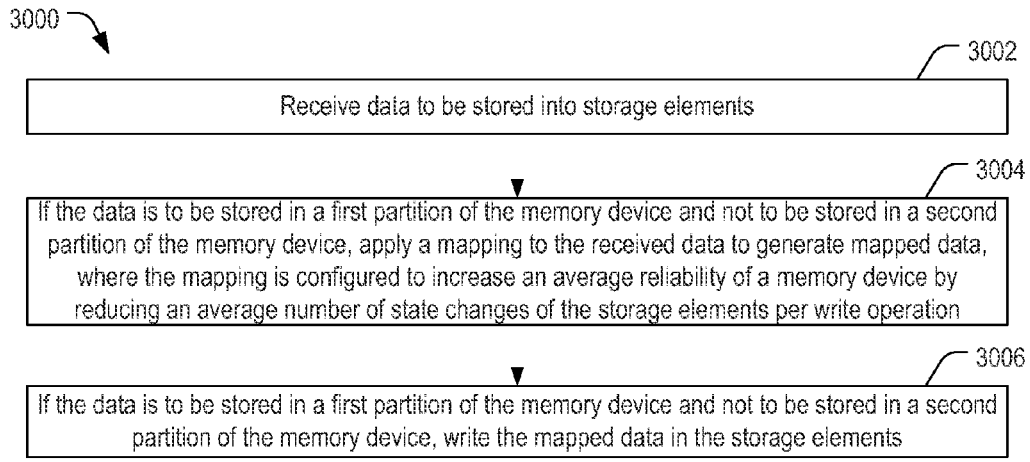
FIG. 30 is a flowchart of a particular embodiment of a method of writing data that includes a mapping configured to increase an average reliability of a first partition of a memory device as compared to a second partition of the memory device by reducing an average number of state changes of the storage elements per write operation.

FIG. 30 illustrates a particular embodiment of a method 3000 that may be performed in a memory device configured to write data to storage elements, such as in the data storage device 102 of FIG. 23. The memory device is configured to write a first value of the data to one or more first storage elements that are in a first state by causing a first state transition of the one or more first storage elements from the first state to a second state. For example, the first state transition may be a "set" operation in the non-volatile memory 104 of FIG. 23. The memory device is further configured to write a second value of the data to one or more second storage elements that are in the second state by causing a second state transition of the one or more second storage elements from the second state to the first state, such as by performing a "reset" operation in the non-volatile memory 104 of FIG. 23.

The method 3000 includes receiving data to be stored into the storage elements, at 3002. For example, the data may be the data 160 received at the mapping circuitry 150 of FIG. 23.

If the data is to be stored into a first partition of the memory device and not to be stored into a second partition of the memory device, a mapping is applied to the received data to generate mapped data, at 3004, and the mapped data is written into the first partition, at 3006. For example, the first partition may include a resistive random access memory (ReRAM) and may correspond to the first partition 1910 of FIG. 19.

The mapping is configured to increase an average reliability of the first partition as compared to the second partition by reducing an average number of state changes of the storage elements per write operation. The mapping may be a one-to-many mapping and may depend on previous states of the storage elements (i.e., the states of the storage elements prior to the writing of the mapped data) such as described with respect to Tables 9-13.

By increasing average reliability of the first partition as compared to the second partition, the first partition may be used for increased reliability and may store data having reduced probability of errors. The second partition may store data with reduced redundancy as compared to the first partition and may provide a higher storage density than the first partition.

Figure 31:
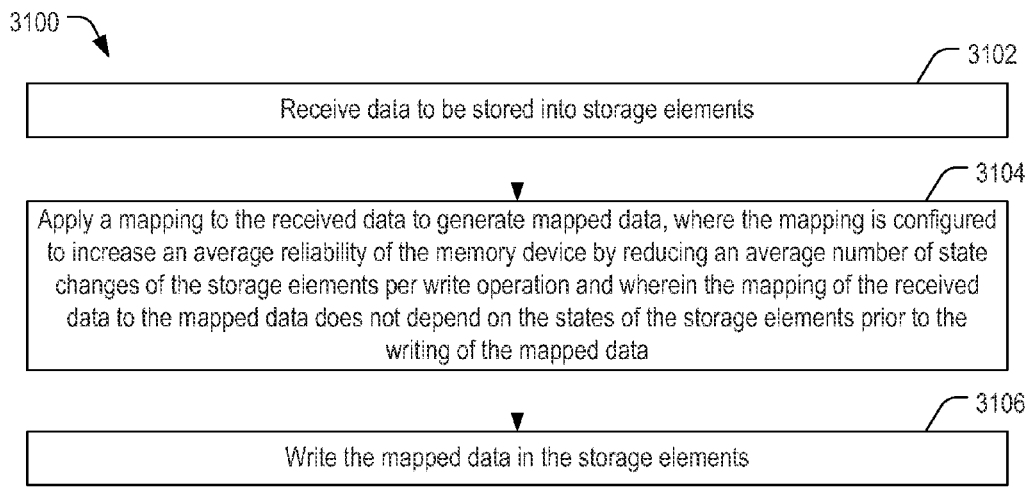
FIG. 31 is a flowchart of another particular embodiment of a method of writing data that includes a mapping configured to increase an average reliability of a memory device.

FIG. 31 illustrates a particular embodiment of a method 3100 that may be performed in a memory device configured to write data to storage elements, such as the data storage device 102 of FIG. 23. For example, the memory device may include a resistive random access memory (ReRAM), such as the non-volatile memory 104 of FIG. 23. The memory device is configured to write a first value of the data to one or more first storage elements that are in a first state by causing a first state transition of the one or more first storage elements from the first state to a second state. For example, the memory device may perform a "set" operation. The memory device is further configured to write a second value of the data to one or more second storage elements that are in the second state by causing a second state transition of the one or more second storage elements from the second state to the first state, such as by performing a "reset" operation.

The method 3100 includes receiving data to be stored into the storage elements, at 3102. For example, the data may be the data 160 received at the mapping circuitry 150 of FIG. 23.

A mapping is applied to the received data to generate mapped data, at 3104. For example, the mapping 2352 may be applied by the mapping circuitry 150 of FIG. 23. The mapped data is stored into the storage elements, at 3106.

The mapping is configured to increase an average reliability of the memory device by reducing an average number of state changes of the storage elements per write operation. The mapping of the received data to the mapped data does not depend on prior states of the storage elements (i.e., the states of the storage elements prior to the writing of the mapped data). For example, the mapping may correspond to a mapping such as described with respect to tables 14-17 and FIGS. 24-27.

The mapping may be further configured to increase the average reliability by generating mapped values that result in a uniform average number of state changes per write operation among the storage elements. In some embodiments, a "uniform average number of state changes" includes a "near-uniform" average number of state changes where a difference between a highest and lowest average number of state changes per write operation among a group of storage elements is within a threshold percentage, such as 10%, as an illustrative, non-limiting example.

For example, the mapping may be a one-to-many mapping and may depend on a cycle count of write operations to the storage elements. Applying the mapping may include selecting a value of the mapped data based on the cycle count. A cycle length of the cycle count may be the same for successive cycles of write operations and the cycle count may be shared by each group of the multiple groups of storage elements. For example, the storage elements into which the mapped data is written may be part of a memory page that includes multiple groups of storage elements. During a write operation, the mapping of received data to mapped data may be applied to each of the multiple groups of storage elements.

By reducing an average number of state changes of the storage elements per write operation, a probability of error due to failure of a storage element to change state is reduced. As a result, a reliability of the memory device is improved. Because the mapping does not depend on prior states of the storage elements, write performance may be improved by avoiding latency associated with performing a read-before-write operation.

Figure 32:
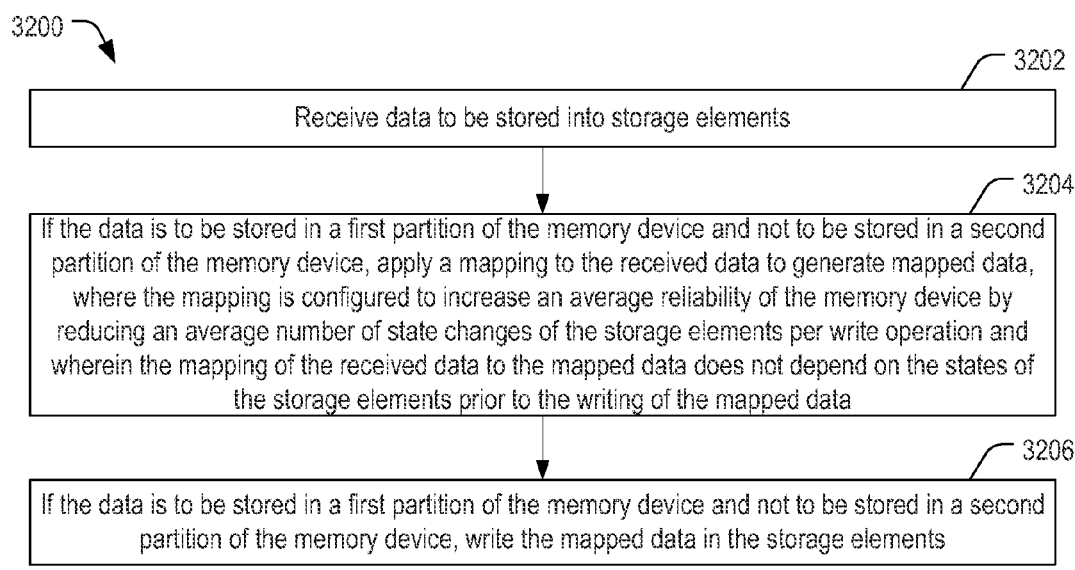
FIG. 32 is a flowchart of another particular embodiment of a method of writing data that includes a mapping configured to increase an average reliability of a first partition of a memory device as compared to a second partition of the memory device by reducing an average number of state changes of the storage elements per write operation.

FIG. 32 illustrates a particular embodiment of a method 3200 that may be performed in a memory device configured to write data to storage elements, such as the data storage device 102 of FIG. 23. The memory device is configured to write a first value of the data to one or more first storage elements that are in a first state by causing a first state transition of the one or more first storage elements from the first state to a second state. For example, the memory device may perform a "set" operation. The memory device is further configured to write a second value of the data to one or more second storage elements that are in the second state by causing a second state transition of the one or more second storage elements from the second state to the first state, such as by performing a "reset" operation. For example, the memory device may include a resistive random access memory (ReRAM), such as the non-volatile memory 104 of FIG. 23.

The method 3200 includes receiving data to be stored into the storage elements, at 3202. For example, the data may be the data 160 received at the mapping circuitry 150 of FIG. 23.

If the data is to be stored into a first partition of the memory device and not to be stored into a second partition of the memory device, a mapping is applied to the received data to generate mapped data, at 3204, and the mapped data is written into the first partition, at 3206. For example, the first partition may correspond to the first partition 1910 of FIG. 19.

The mapping is configured to increase an average reliability of the first partition as compared to the second partition by reducing an average number of state changes of the storage elements per write operation. The mapping of the received data to the mapped data does not depend on the states of the storage elements prior to the writing of the mapped data. For example, the mapping may be a one-to-many mapping and may correspond to a mapping such as described with respect to tables 14-17 and FIGS. 24-27.

By increasing average reliability of the first partition as compared to the second partition, the first partition may be used for increased reliability and may store data having reduced probability of errors. Because the mapping does not depend on prior states of the storage elements, write performance to the first partition may be improved by avoiding latency associated with performing a read-before-write operation. The second partition may store data with reduced redundancy as compared to the first partition and may provide a higher storage density than the first partition.

Although various components depicted herein are illustrated as block components and described in general terms, such components may include one or more microprocessors, state machines, or other circuits configured to enable the mapping circuitry of FIGS. 1, 17-19, and 23 to map received data values to mapped values. For example, the mapping circuitry may represent physical components, such as hardware controllers, state machines, logic circuits, or other structures, to enable the mapping circuitry to map received data values to mapped values.

The mapping circuitry may be implemented using a microprocessor or microcontroller programmed to receive data values, identify a next state of storage elements in accordance with the first selection criterion, and generate mapped values corresponding to the identified next state. In a particular embodiment, the mapping circuitry includes a processor executing instructions that are stored at the non-volatile memory 104. Alternatively, or in addition, executable instructions that are executed by the processor may be stored at a separate memory location that is not part of the non-volatile memory 104, such as at a read-only memory (ROM).

In a particular embodiment, the data storage device 102 of FIG. 1 or FIG. 23 may be implemented in a portable device configured to be selectively coupled to one or more external devices. However, in other embodiments, the data storage device 102 may be attached or embedded within one or more host devices, such as within a housing of a host communication device. For example, the data storage device 102 may be within a packaged apparatus such as a wireless telephone, a personal digital assistant (PDA), a gaming device or console, a portable navigation device, or other device that uses internal non-volatile memory.

The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments.

The above-disclosed subject matter is to be considered illustrative, and not restrictive, and the appended claims are intended to cover all such modifications, enhancements, and other embodiments, which fall within the scope of the present disclosure. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method comprising:
in a memory device including a controller and configured to write data to storage elements at a memory die, performing:
receiving data to be stored into the storage elements;
applying a mapping to the received data to generate mapped data, wherein the mapping comprises a one-to-many mapping performed at mapping circuitry that includes a first portion at the controller and a second portion at the memory die, and wherein the mapping is configured to increase an average reliability of the memory device by reducing an average number of state changes of the storage elements per write operation; and
writing the mapped data into the storage elements.

2. The method of claim 1, wherein the mapping increases the average reliability by generating mapped values that result in a uniform average number of state changes per write operation among the storage elements.

3. The method of claim 1, wherein:
the memory device is configured to write a first value of the mapped data to one or more first storage elements that are in a first state by causing a first state transition of the one or more first storage elements from the first state to a second state,
the memory device is further configured to write a second value of the mapped data to one or more second storage elements that are in the second state by causing a second state transition of the one or more second storage elements from the second state to the first state, and
the mapped data is written into the one or more first storage elements and the one or more second storage elements.

4. The method of claim 1, wherein the mapping depends on states of the storage elements prior to the writing, and wherein the memory device includes a resistive memory.

5. A method comprising:
in a memory device including a controller and configured to write data to storage elements at a memory die, performing:
receiving data to be stored into the storage elements;
applying a mapping to the received data to generate mapped data; and
writing the mapped data into the storage elements,
wherein the mapping comprises a one-to-many mapping performed at mapping circuitry, the mapping circuitry having a first portion at the controller and a second portion at the memory die and configured to reduce an average number of state changes of the storage elements per write operation.

6. The method of claim 5, wherein
the memory device is configured to write a first value of the mapped data to one or more first storage elements that are in a first state by causing a first state transition of the one or more first storage elements from the first state to a second state,
the memory device is further configured to write a second value of the mapped data to one or more second storage elements that are in the second state by causing a second state transition of the one or more second storage elements from the second state to the first state, and
the mapped data is written into the one or more first storage elements and the one or more second storage elements.

7. The method of claim 5, wherein the mapping generates a uniform average number of state changes per write operation among the storage elements.

8. The method of claim 5, wherein the mapping depends on states of the storage elements prior to the writing, and wherein the memory device includes a resistive memory.

9. A method comprising:
in a memory device including a controller and configured to write data to storage elements at a die, performing:
receiving data to be stored into the memory device; and
if the received data is to be stored into a first partition of the memory device and not into a second partition of the memory device:

applying a mapping to the received data to generate mapped data, wherein the mapping comprises a one-to-many mapping performed at mapping circuitry having a first portion at the controller and a second portion at the die; and writing the mapped data into the first partition, wherein the mapping is configured to increase an average reliability of the first partition as compared to the second partition by reducing an average number of state changes of the storage elements per write operation.

10. The method of claim 9, wherein:

the memory device is configured to write a first value of the mapped data to one or more first storage elements that are in a first state by causing a first state transition of the one or more first storage elements from the first state to a second state, the memory device is further configured to write a second value of the mapped data to one or more second storage elements that are in the second state by causing a second state transition of the one or more second storage elements from the second state to the first state, and the average number of state changes of the one or more first storage elements and the one or more second storage elements is reduced per write operation.

11. The method of claim 9, wherein the mapping depends on states of the storage elements prior to the writing, and wherein the first partition includes a resistive memory.

12. The method of claim 9, further comprising, if the received data is to be stored into the second partition, writing the received data into the second partition without applying the mapping.

13. A data storage device comprising:

a controller;

a memory device coupled to the controller and configured to write data to storage elements at a die; and mapping circuitry having a first portion at the controller and a second portion at the die and configured, in response to receiving data to be stored into the storage elements, to apply a mapping to the received data to generate mapped data to be stored into the storage elements, wherein the mapping comprises a one-to-many mapping, and wherein the mapping is configured to increase an average reliability of the memory device by reducing an average number of state changes of the storage elements per write operation.

14. The data storage device of claim 13, wherein:

the memory device is configured to write a first value of the mapped data to one or more first storage elements that are in a first state by causing a first state transition of the one or more first storage elements from the first state to a second state, the memory device is further configured to write a second value of the mapped data to one or more second storage elements that are in the second state by causing a second state transition of the one or more second storage elements from the second state to the first state, and the storage elements include the one or more first storage elements and the one or more second storage elements.

15. The data storage device of claim 13, wherein the mapping is dependent on states of the storage elements prior to the writing.

16. The data storage device of claim 13, wherein the memory device includes a resistive memory.

17. The data storage device of claim 13, wherein the die comprises a memory die.

18. A data storage device comprising:

a controller;

a memory device coupled to the controller and configured to write data to storage elements at a memory die; and mapping circuitry having a first portion at the controller and a second portion at the memory die and configured, in response to receiving data to be stored into the storage elements, to apply a mapping to the received data to generate mapped data to be stored into the storage elements, wherein the mapping comprises a one-to-many mapping and is configured to reduce an average number of state changes of the storage elements per write operation.

19. The data storage device of claim 18, wherein:

the memory device is configured to write a first value of the mapped data to one or more first storage elements that are in a first state by causing a first state transition of the one or more first storage elements from the first state to a second state, the memory device is further configured to write a second value of the mapped data to one or more second storage elements that are in the second state by causing a second state transition of the one or more second storage elements from the second state to the first state, the storage elements include the one or more first storage elements and the one or more second storage elements, and the mapping is further configured to generate a uniform average number of state changes per write operation among the storage elements.

20. The data storage device of claim 18, wherein the mapping is dependent on states of the storage elements prior to the writing, and wherein the memory device includes a resistive memory.

21. A data storage device comprising:

a controller;

a memory device coupled to the controller and including a first partition and a second partition, the memory device configured to write data to storage elements at a die; and mapping circuitry having a first portion at the controller and a second portion at the die and configured to receive data to be stored into the memory device and, if the received data is to be stored into the first partition and not into the second partition, to apply a mapping to the received data to generate mapped data to be written into the first partition, wherein the mapping comprises a one-to-many mapping, wherein the mapping is configured to increase an average reliability of the first partition as compared to the second partition by reducing an average number of state changes of the storage elements per write operation.

22. The data storage device of claim 21, wherein the mapping is dependent on states of the storage elements prior to the writing.

23. The data storage device of claim 21, wherein:

the memory device is configured to write a first value of the data to one or more first storage elements that are in a first state by causing a first state transition of the one or more first storage elements from the first state to a second state, the memory device is further configured to write a second value of the data to one or more second storage elements that are in the second state by causing a second state transition of the one or more second storage elements from the second state to the first state, and the storage elements include the one or more first storage elements and the one or more second storage elements.

24. The data storage device of claim 21, wherein the first partition includes a resistive memory.

25. The data storage device of claim 21, wherein the die comprises a memory die.

* * * * *